US006404482B1

(12) United States Patent
Shiraishi

(10) Patent No.: US 6,404,482 B1
(45) Date of Patent: Jun. 11, 2002

(54) PROJECTION EXPOSURE METHOD AND APPARATUS

(75) Inventor: Naomasa Shiraishi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/276,471

(22) Filed: Mar. 25, 1999

Related U.S. Application Data

(60) Division of application No. 08/334,109, filed on Nov. 4, 1994, now abandoned, which is a continuation-in-part of application No. 08/128,685, filed on Sep. 30, 1993, now abandoned.

(30) Foreign Application Priority Data

| Oct. 1, 1992 | (JP) | 4-263521 |
| Oct. 9, 1992 | (JP) | 4-271723 |
| Nov. 25, 1992 | (JP) | 4-314610 |
| Jan. 21, 1993 | (JP) | 5-007980 |
| Nov. 8, 1993 | (JP) | 5-277944 |

(51) Int. Cl.$^7$ ............... G03B 27/42; G03B 27/52; G03B 27/54
(52) U.S. Cl. ............... 355/53; 355/67; 355/55
(58) Field of Search ............... 355/52, 53, 67, 355/68–71, 77; 356/399–401; 359/619; 250/548

(56) References Cited

U.S. PATENT DOCUMENTS

| 4,558,949 A | 12/1985 | Uehara et al. ............... 356/152 |
| 4,869,999 A | 9/1989 | Fukuda et al. ............... 430/311 |
| 4,890,309 A | 12/1989 | Smith et al. ............... 378/35 |
| 4,904,569 A | 2/1990 | Fukuda et al. ............... 430/311 |
| 4,947,413 A * | 8/1990 | Jewell et al. ............... 378/34 |
| 4,992,825 A | 2/1991 | Fukuda et al. ............... 355/53 |
| 5,016,149 A | 5/1991 | Tanaka et al. ............... 362/259 |
| 5,048,926 A | 9/1991 | Tanimoto ............... 359/487 |
| 5,048,967 A * | 9/1991 | Suzuki et al. ............... 356/401 |
| 5,100,237 A | 3/1992 | Wittekoek et al. ............... 356/401 |
| 5,144,362 A | 9/1992 | Kamon et al. ............... 355/53 |
| 5,253,110 A * | 10/1993 | Ichihara et al. ............... 359/619 |
| 5,255,050 A | 10/1993 | Kitagawa ............... 355/53 |
| 5,316,896 A | 5/1994 | Fukuda et al. ............... 430/322 |
| 5,343,270 A | 8/1994 | Sakakibara et al. ............... 355/53 |
| 5,363,170 A * | 11/1994 | Muraki ............... 355/70 |
| 5,365,371 A | 11/1994 | Kamon ............... 359/483 |
| 5,436,761 A | 7/1995 | Kamon ............... 359/487 |
| 5,552,856 A | 9/1996 | Shiraishi et al. ............... 355/53 |
| 5,621,498 A | 4/1997 | Inoue et al. ............... 355/67 |
| 5,627,626 A * | 5/1997 | Inoue et al. ............... 355/67 |
| 5,707,501 A | 1/1998 | Inoue et al. ............... 204/298.11 |

FOREIGN PATENT DOCUMENTS

| JP | 61-91662 | 5/1986 |
| JP | 4-101148 | 4/1992 |
| JP | 4-225358 | 8/1992 |

OTHER PUBLICATIONS

Extended Abstracts 29a–ZC–8, 9 (The Spring Meeting, 1991); The Japan Society of Applied Physics and Related Societies.

* cited by examiner

Primary Examiner—Russell Adams
Assistant Examiner—Hung Henry Nguyen
(74) Attorney, Agent, or Firm—Miles & Stockbridge P.C.

(57) ABSTRACT

In projection exposure of isolated pattern such as a contact hole, in order to increase the depth of focus a coherence reducing member is disposed on a Fourier transform plane in an image-forming optical path between a mask and a sensitized base, so that coherence is reduced between image-forming beams respectively passing through a plurality of different, concentric regions around the optical axis of the projection optical system on the Fourier transform plane. The coherence reducing member may be a polarization state control member for making a difference in polarization state, a member for making a difference in optical path length, or space filters with different shapes.

56 Claims, 58 Drawing Sheets

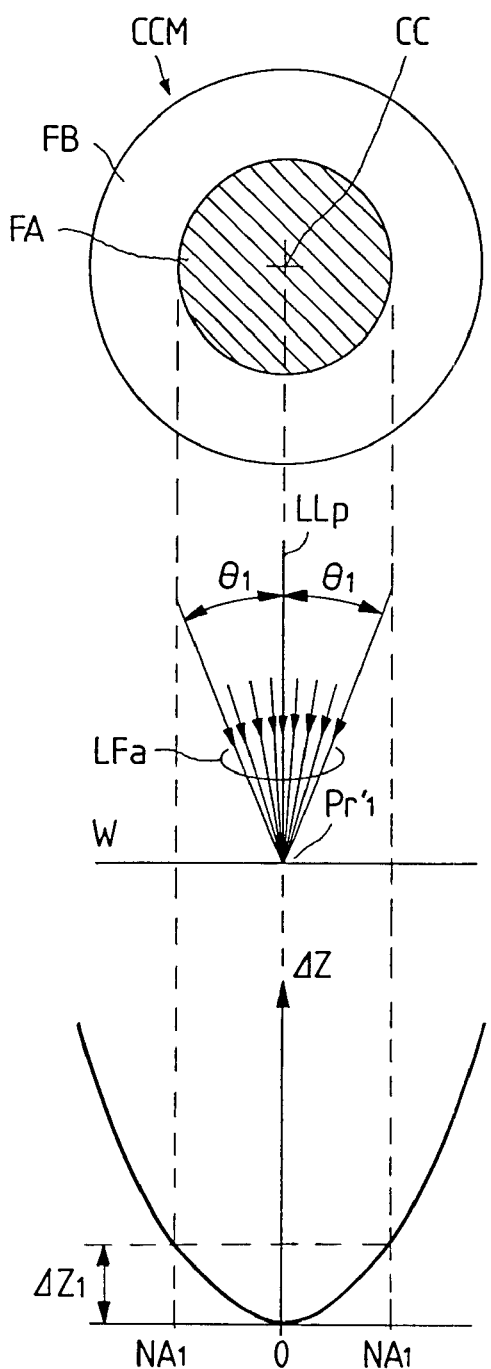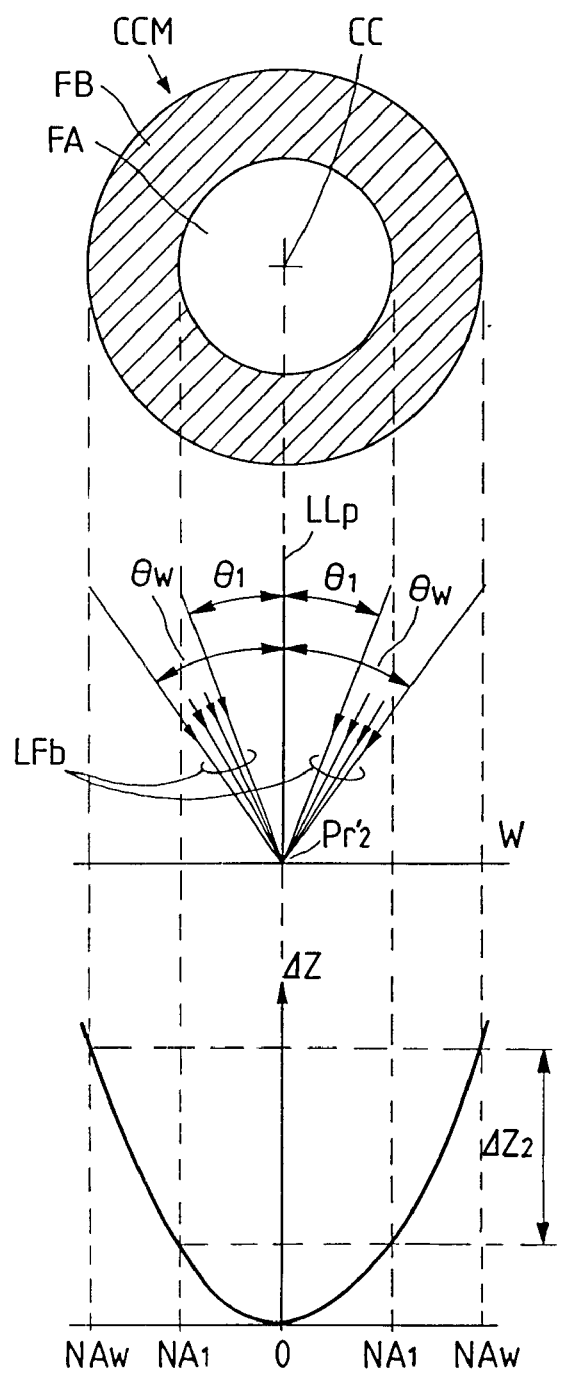

FIG. 6

| | POLARIZATION BEFORE PCM | PCM SECTIONAL VIEW | PCM PLAN VIEW | POLARIZATION AFTER PCM |
|---|---|---|---|---|
| EMBODIMENT 1-1 | RANDOM | 101, FA, AX, FB, r1, r2 | 101, FA, FB, CC | FA, FB |
| EMBODIMENT 1-2 | RANDOM | 102, FA, AX, FB, FC | 102, FA, FB, CC | FA, FB |
| EMBODIMENT 1-3 | ↕ | FA1, AX, 103, FB1 | 103, FA1(λ/2), FB1, CC, r1 | FA1, FB1 |
| EMBODIMENT 1-4 | ↕ | 104, AX, FA2, FB2 | 104, FA2(λ/4), CC, r1, FB2(λ/4) | FA2, FB2 |
| EMBODIMENT 1-5 | ↻ | FA1, AX, 105, FB1 | 105, FA1(λ/2), FB1, CC, r1 | FA1, FB1 |
| EMBODIMENT 1-6 | ↻ | 106, AX, FA2, FB2 | 106, FA2(λ/4), CC, r1, FB2(λ/4) | FA2, FB2 |

FIG. 18
PRIOR ART
(FLEX)
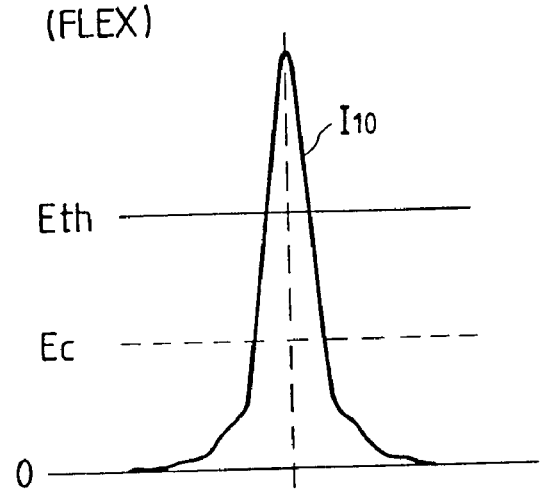
BEST FOCUS
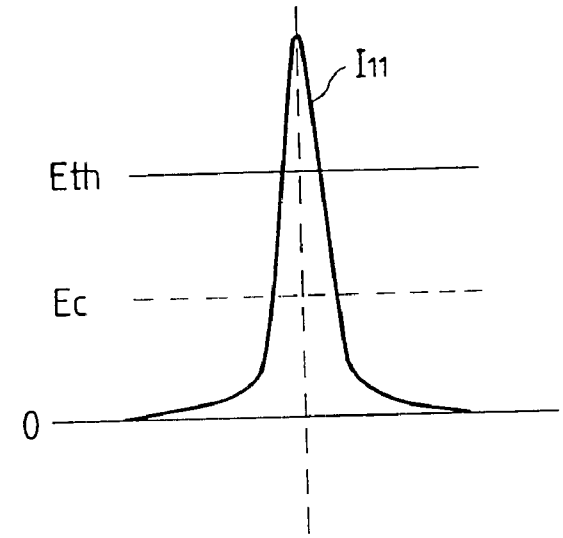
1 μm DEFOCUS
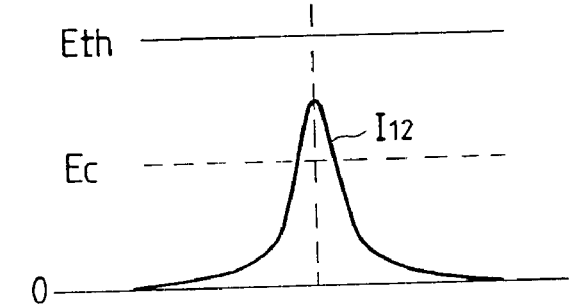
2 μm DEFOCUS (SUPER-FLEX(2))

(FLEX)

(SUPER-FLEX(1))

(SUPER-FLEX(2))

SUPER-FLEX(1)

SUPER-FLEX(2)

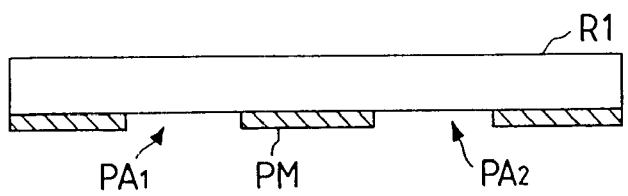
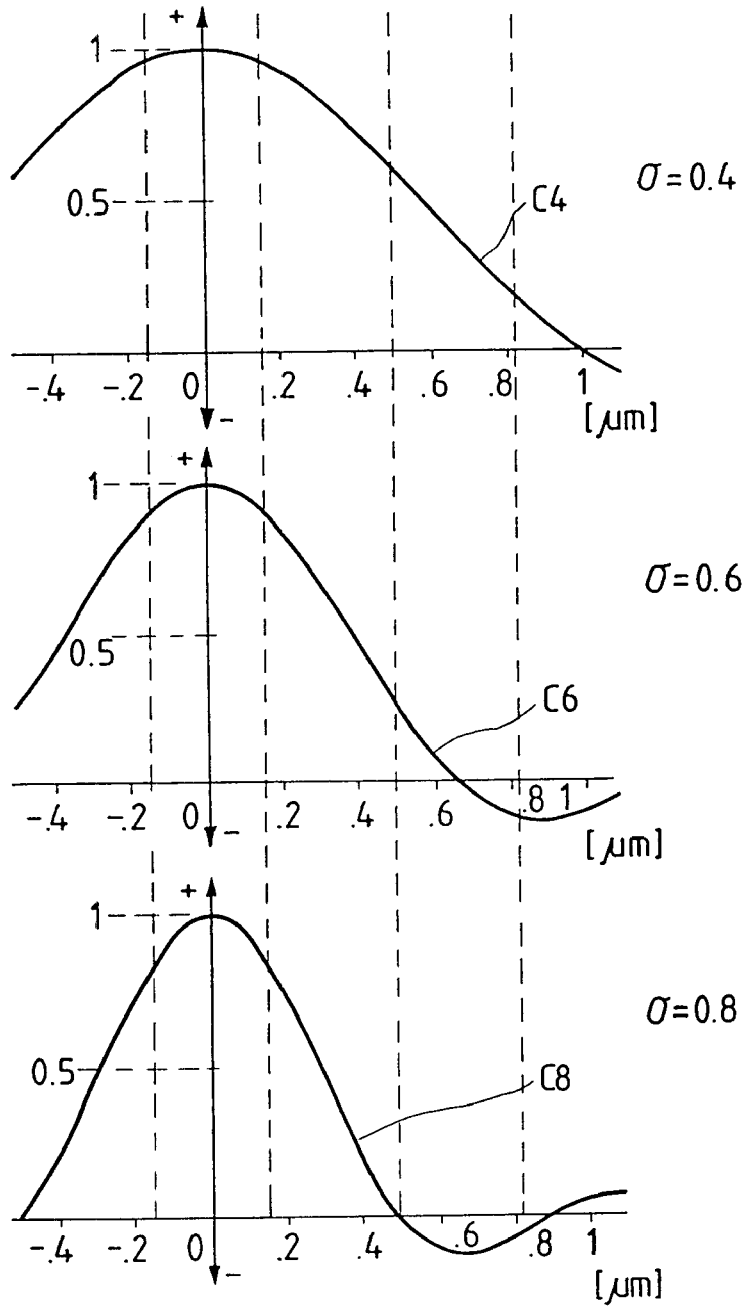

σ = 0.4

σ = 0.6

σ = 0.8

SFINCS + ANNULAR

SFINCS + SHRINC

SFINCS, σ=0.8
BEST FOCUS

SFINCS, σ=0.8
1 μm DEFOCUS

SFINCS, σ=0.8
2 μm DEFOCUS

SFINCS, ANNULAR
BEST FOCUS

SFINCS, ANNULAR
1 μm DEFOCUS

SFINCS, ANNULAR
2 μm DEFOCUS

SFINCS+SHRINC
BEST FOCUS

SFINCS+SHRINC
1 μm DEFOCUS

SFINCS+SHRINC
2 μm DEFOCUS

SFINCS, σ=0.8
BEST FOCUS

SFINCS, σ=0.8
1 μm DEFOCUS

SFINCS, σ=0.8
2 μm DEFOCUS

σ = 0.6
BEST FOCUS

σ = 0.6
1 μm DEFOCUS

σ = 0.6
2 μm DEFOCUS

BEST FOCUS

1 μm DEFOCUS

2 μm DEFOCUS

SUPER-FLEX(1)
BEST FOCUS

SUPER-FLEX(1)
1μm DEFOCUS

SUPER-FLEX(1)
2μm DEFOCUS

SUPER-FLEX(2)
BEST FOCUS

SUPER-FLEX(2)
1 μm DEFOCUS

SUPER-FLEX(2)
2 μm DEFOCUS (FLEX)

(FLEX)

SUPER-FLEX(1)

SUPER-FLEX(1)

SUPER-FLEX(2)

SUPER-FLEX(2)

PROJECTION EXPOSURE METHOD AND APPARATUS

CROSS-REFERENCE TO RELATED APPLICATIONS:

This application is a division of application Ser. No. 08/334,109 filed Nov. 4, 1994, now ABN which is a continuation-in-part of application Ser. No. 08/128,685 filed Sep. 30, 1993 (abandoned).

BACKGROUND OF THE INVENTION

1. Field of the Invention

The present invention relates to projection exposure method and apparatus used in forming fine patterns for semiconductor integrated circuits, liquid crystal displays, or the like.

2. Related Background Art

A projection exposure apparatus as called as a stepper is provided with a projection optical system. This projection optical system is incorporated into the exposure apparatus after it is produced in the steps of high-level optical design, strict selection of glass materials, superfine machining of glass materials, and precise assembly and adjustment.

Current steppers actually used in fabrication of semiconductors are so arranged that illumination light of i-line (wavelength 365 nm) from a mercury lamp illuminates a photomask as called as a reticle and that a projection optical system focuses light passing through a circuit pattern on the reticle to form an image thereof on a photosensitive substrate such as a wafer. On the other hand, excimer steppers employing the excimer laser (KrF laser of wavelength 248 nm) are used for evaluation or for research. If a projection optical system for excimer stepper is composed only of refracting lenses, the glass materials usable therefor are limited to quartz or fluorite.

Generally, the resolving power and the depth of focus (D.O.F.) of the projection optical system are important factors to faithfully transfer a fine reticle pattern onto a photosensitive substrate upon exposure with the projection optical system. Some of presently. available projection optical systems for i-line have a numerical aperture (N.A.) of about 0.6. If the wavelength of used illumination light is kept constant, the resolving power increases as the numerical aperture of projection optical system increases. The depth of focus (D.O.F.), however, decreases as the numerical aperture increases. The depth of focus is defined by D.O.F.=±λ/(N.A.)$^2$ where λ is the wavelength of illumination light.

FIG. 1 schematically shows optical paths of image formation in a conventional projection optical system. The projection optical system is composed of a front-group lens system GA and a rear-group lens system GB. The projection optical system of this type is generally both-side telecentric on the reticle R side and on the wafer W side or single-side telecentric only on the wafer side.

There are rays L1, L2, L3, La, La', La". advancing in various directions from a point A on the pattern surface of reticle (i.e., the object plane of projection optical system), among which the ray L1 is traveling at an angle at which it cannot enter the front-group lens system GA. Also, among the rays entering the front lens system GA, the rays L2, L3 cannot pass through a pupil ep (circular region about the optical axis AX) located on the Fourier transform plane FTP in the projection optical system. The other rays La, La', La" pass through the pupil ep and then enter the rear-group lens system GB to converge at a point A' on the surface of wafer.

Accordingly, a point image is formed at the point A' by only the rays passing through the pupil ep in the projection optical system out of the rays leaving the point A on the reticle.

Out of the rays traveling from the point A to the point A', the ray La passing through the center point CC of pupil is called as a principal ray. If the projection optical system is teledentric on the both sides, the principal ray La travels in parallel with the optical axis AX in the both spaces on the object plane side and on the image plane side.

The above is also the case with rays leaving another point B or C on the reticle, and a point image is thus formed at point B' or C' only by rays passing through the pupil. Similarly, a ray Lb, Lc travels in parallel with the optical axis AX from the point B, C to enter the lens system GA, becoming a principal ray passing through the center point CC of pupil.

As described, the pupil is in relation of Fourier transform or inverse transform with the pattern surface of reticle or with the surface of wafer so that among the rays from the pattern on the reticle the rays contributing to image formation all superimposedly pass through the pupil.

Discussing the numerical aperture of projection optical system, there are a numerical aperture NAw on the wafer side (on the image plane side) and a numerical aperture NAr on the reticle side (on the object side). The numerical aperture NAw on the wafer side corresponds to an angle $\theta_w$ which the ray La' or La" passing through the outermost portion of pupil among the image-forming rays toward the point A' makes with the principal ray La on the wafer. The numerical aperture NAw is expressed as NAw=sin θw. Also, the numerical aperture NAr on the reticle side corresponds to an angle θr which the ray La' or La" makes with the principal ray La on the reticle side. The numerical aperture NAr is expressed as NAr=sin θr. Further, there is a relation of NAr=M·NAw where M is an imaging magnification of projection optical system.

Incidentally, the resolving power can be enhanced by increasing the numerical aperture NAw or NAr. In other words, the resolving power can be increased by making the diameter of pupil larger and further making the effective diameter of lens system GA, GB larger. Nevertheless, the depth of focus (D.O.F.) decreases in proportion to an inverse of square of numerical aperture. Then, even if the projection optical system could be produced with high numerical aperture, the depth of focus would be insufficient, which would be a hindrance in practical use.

When the illumination light is the i-line of wavelength 365 nm and the numerical aperture NAw is 0.6, D.O.F. is about 1 μm (∓0.5 μm) across. As a result, the resolution is poor in a portion where the surface unevenness or curvature exceeds the D.O.F. in a shot area (a square of about 20 mm to 30 mm) on the wafer. As for the system of stepper, the focusing and leveling must be carried out with considerably high precision for each shot area on the wafer, which increases loads on the mechanical system, the electric system and the software (that is, requiring efforts to improve the measurement resolution, the servo control precision, the setting time, and so on).

Applicant proposed a novel projection exposure technology which can provide both a high resolving power and a deep depth of focus, solving such various problems in the projection optical system, as described in Japanese Laid-open Patent Application No. 4-101148 (corresponding to a United States Patent Application, U.S. Ser. No. 847,030 filed on Apr. 15, 1992) or in Japanese Laid-open Patent Application No. 4-225358 (corresponding to a United States Patent Application, U.S. Ser. No. 791,138 filed on Nov. 13, 1991) for example. This exposure technology increases an apparent resolving power and an apparent depth of focus by controlling illumination in a special shape on the reticle without changing the projection optical system, which is called as SHRINC (Super High Resolution by Illumination Control) method.

In the SHRINC method the reticle is illuminated by two or four illumination beams symmetrically inclined with respect to the pitch direction of line-sand-space pattern on the reticle. The zeroth-order-diffracted-light component and one of ±first-order-diffracted-light components, which are emergent from the line-and-space pattern, are let to pass through the pupil ep of projection optical system symmetrically with each other with respect to the center point CC therein. Interference (double beam interference) effect occurs between the zeroth-order-diffracted light and one of the first-order-diffracted light to produce a projection image (i.e., interference fringes) of the line-and-space pattern. Such image formation utilizing the double beam interference can suppress occurrence of wavefront aberration in a defocus state, more than in ordinary perpendicular illumination in conventional systems, increasing the apparent depth of focus.

The SHRINC method can enjoy the desired effect with a periodic pattern formed on the reticle, but has no such effect can be expected for an isolated pattern such as a contact hole. Generally, in case of, an isolated fine pattern, most of diffracted light therefrom is due to the Fraunhofer's diffraction, so that the diffracted light is not clearly split into the zeroth-order-diffracted light and higher-order-diffracted light in the pupil ep of projection optical system.

Then there is an exposure method for increasing the apparent depth of focus for isolated pattern such as contact hole, proposed for example in U.S. Pat. No. 4,869,999, in which exposure is effected at a plurality of steps for each shot area on the wafer and the wafer is moved by a constant amount along the optical axis between steps. This exposure method is called as FLEX (Focus Latitude Enhancement Exposure) method, which is fully effective to increase the depth of focus for isolated pattern such as contact hole. However, sharpness of resist image obtained after development is inevitably lowered, because the FLEX method requires multiple exposure of contact hole image in a slightly defocused state. This problem of sharpness decrease (profile degradation) can be compensated for by using a resist with high gamma value, a multi layer resist, or a Contrast Enhancement Layer (CEL).

There is an attempt known to increase the depth of focus in projection of contact hole pattern without moving the wafer along the optical axis in exposure process as in the FLEX method, for example the Super-FLEX method as presented in Extended Abstracts 29a-ZC-8, 9 (The Spring Meeting, 1991); The Japan Society of Applied Physics and Related Societies. In the Super-FLEX method, a transparent phase plate is provided in the pupil of projection optical system so that the phase plate gradually changes the complex amplitude transmittance of imaging light from the optical axis toward the periphery thereof. Such arrangement can permit the image focused by the projection optical system to keep sharpness within a certain range along the optical axis about the best focus plane (which is a plane conjugate with the reticle), increasing the depth of focus.

Among the various conventional techniques as described above, the FLEX method and the Super-FLEX method can obtain a sufficient increase in depth of focus for isolated contact hole pattern. It is, however, found that with a plurality of contact hole patterns closely juxtaposed at a certain distance either one of the above methods causes undesirable film reduction in photoresist between the holes and that they cannot be virtually used for close contact hole patterns.

Further, the FLEX method can increase the depth of focus for isolated contact hole pattern on one hand, while it has such a problem:that the exposure dose latitude or margin has to be decreased to maintain the sharpness of synthetic optical image obtained by multiple exposure on the other hand. The FLEX method also has other problems such as difficult application to exposure apparatus of scanning exposure method or a great drop in processing capability.

SUMMARY OF THE INVENTION

It is a main object of the present invention to. provide projection exposure method and apparatus which can increase the depth of focus in projection exposure of isolated pattern such as the contact hole.

It is another object of the present invention to provide projection exposure method and apparatus which can increase the depth of focus without any trouble for a plurality of isolated patterns disposed relatively close to each other.

The present invention is applied to a projection exposure apparatus provided with illumination means for illuminating a mask, on which a fine pattern is formed, with exposure illumination light and a projection optical system for receiving emergent light from the pattern on the mask and focusprojecting an image of pattern onto a sensitized substrate. The present invention is characterized in that there is coherence reducing means located on or in the vicinity of a Fourier transform plane (as will be referred to as pupil plane) in an imaging optical path between the mask and the sensitized substrate. The coherence reducing means functions to reduce the coherence between imaging light distributed in a circular region around the optical axis of projection optical system on or in the vicinity of the Fourier transform plane and imaging light distributed in a region outside the circular region.

In the present invention the coherence reducing means makes a part of imaging light which is distributed in a circular or annular region in the pupil plane in projection optical system, incoherent with imaging light which is distributed in the other region than the circular or annular region. As a result, after an imaging beam passes and is diffracted especially through a contact hole pattern in the reticle pattern, it is spatially split into two beams incoherent with each other in the pupil plane then to reach an exposed object such as a wafer. Since the two beams are incoherent with each other also on the wafer, an intensity-synthetic image in respect of quantity of light is obtained from images of contact hole produced by the respective beams.

If there is no phase shift plate provided on the pupil plane of projection optical system, all rays have the same path length from an arbitrary point on reticle to a corresponding image point on wafer in the best focus state irrespective of the ray path in the projection optical system (according to the Fermat's principle). Accordingly, the amplitude synthesis on wafer is synthesis of beams having no phase difference, so that the intensity of contact hole pattern is enhanced everywhere.

When the wafer is defocused, the above path length differs depending upon the ray path in the projection optical system. Then the above amplitude synthesis results in addition of beams having path difference (phase difference), which causes partial canceling effect to lower the center intensity of contact hole pattern. The thus caused path difference can be approximately expressed by ½ ($\Delta F \cdot \sin^2\theta$), where $\theta$ is an incident angle of an arbitrary ray incident into an image point on the wafer and the reference (=0) is a path length of the ray incident normally to the wafer (principal ray). Here $\Delta F$ represents a defocus amount. Since the maximum of $\sin \theta$ is the wafer-side numerical aperture NAw of projection optical system, if among diffracted light from the fine hole pattern all light passing through the pupil ep is amplitude-synthesized on the wafer at in ordinary procedure, the maximum path difference is ½ ($\Delta F \cdot NAw^2$). Assuming that the permissible range of depth of focus is a path difference of $\lambda/4$, the following relation holds.

$$\tfrac{1}{2}(\Delta F \cdot NAw^2) = \lambda/4$$

Arranging this equation, $\Delta F = \lambda/(2NAw_2)$, which coincides with the range of generally called depth of focus. For example, assuming that the exposure illumination light is the i-line (wavelength 0.365 $\mu$m) currently used and that the numerical aperture is NAw=0.50, the depth of focus $\pm\Delta F/2$ is $\pm 0.73$ $\mu$m. Therefore, the depth of focus leaves little margin to the process step of about 1 $\mu$m on the wafer.

On the other hand, the coherence reducing means CCM is provided on the pupil plane (FTP) of projection optical system, as shown in FIG. 2, in the present invention. An imaging beam. (with principal ray of LLp) diffracted by an isolated pattern Pr formed on the pattern plane of reticle R enters a front-group lens system GA in projection optical system PL and then reaches the Fourier transform plane FTP. On the Fourier transform plane FTP, a part of the beam passes through a circular transmissive portion FA in the central portion in pupil plane ep and the other part of the beam passes through an annular transmissive portion FB while being controlled (changed) into an incoherent state with each other. No interference is thus caused between a beam LFa passing through the circular transmissive portion FA in the coherence reducing means CCM and a beam LFb passing through the peripheral transmissive portion FB. As a result, the beam LFa from the circular transmissive portion FA interferes with itself independent of the beam LFb from the peripheral portion FB, and vice versa, forming an image (intensity distribution) Pr' of hole pattern. Namely, the image Pr' of isolated pattern such as contact hole is obtained in the present invention by simply intensity-adding the image produced on the wafer by the self interference only of the beam LFa and the image produced by the self interference only of the beam LFb.

It is here presumed that the illumination light ILB to the reticle has a constant numerical aperture of $\sin \Phi/2$ as in conventional procedure. As for the reticle-side numerical aperture NAr of projection optical system PL, the condition of NAr>$\sin \Phi/2$ is set.

The principle of image formation in the present invention will be further described referring to FIGS. 3A and 3B.

FIGS. 3A and 3B schematically show the structure of coherence reducing means CCM, a state of an imaging beam forming an image Pr' of contact hole, and the path difference $\Delta Z$ in beam in defocus in relation with each other.

As shown in FIG. 3A, the angle of beam LFa ranges from the normal incidence (principal ray LLp) to the incident angle $\theta_1$ in amplitude synthesis within the beam LFa passing through the central portion. Then, if the defocus amount is $\Delta F$, the maximum $\Delta Z_1$ of path difference is $\Delta Z_1 = \tfrac{1}{2}(\Delta F \cdot \sin^2\theta_1)$. In each drawing the lowermost graph is depicted with the horizontal axis as sine of incident angle and $\sin \theta_1 = NA_1$. On the other hand, as shown in FIG. 3B, the incident angle range of beam LFb ranges from the incident angle $\theta_1$ to the numerical aperture NAw ($\sin \theta w$) in amplitude synthesis within the beam LFb passing through the peripheral portion. Then, if the defocus amount is $\Delta F$, the maximum path length difference $\Delta Z_2$ is obtained as follows:

$$\Delta Z_2 = \tfrac{1}{2}(\Delta F)(NAw^2 - \sin^2\theta_1).$$

Since the first beam LFa does not interfere with the second beam LFb, deterioration of the image $Pr_1'$ by the interference only of beam LFa or the image $Pr_2'$ by the interference only of beam LFb is caused only by path length difference $\Delta Z_1$, $\Delta Z_2$ in each beam.

For example, if $\sin \theta_1$ is set as $\sin^2\theta_1 = \tfrac{1}{2} (NAw^2)$, that is, if the radius of first transmissive portion FA is set to satisfy the relation of $\sin \theta_1 = NAw/\sqrt{2}$, the maximum path difference $\Delta Z_1$ in the first beam LFa and the maximum path difference $\Delta Z_2$ in the second beam LFb are as follows.

$$\Delta Z_1 = \tfrac{1}{2}(\Delta F \cdot \sin^2\theta_1) = \tfrac{1}{4}(\Delta F \cdot NAw^2)$$

$$\Delta Z_2 = \tfrac{1}{2}(\Delta F)(NAw^2 - \sin^2\theta_1) = \tfrac{1}{4}(\Delta F \cdot NAw^2)$$

Thus, the two incoherent beams LFa, LFb have nearly the same maximum path difference of $\tfrac{1}{4}$ ($\Delta F \cdot NAw^2$) with defocus of $\Delta F$, which is a half of that in conventional procedure. In other words, the maximum path difference is the same even for defocus amount ($2\Delta F$), which is a double, of that in conventional procedure, as that for defocus amount $\Delta F$ in conventional projection procedure. Consequently, the depth of focus is nearly doubled in image formation of isolated pattern Pr. Such a method for converting an imaging beam into a plurality of beams incoherent with each other in the pupil plane ep of projection optical system PL will be hereinafter called as SFINCS (Spatial Filter for Incoherent Stream) method.

In a preferable embodiment of the present invention, the above coherence reducing means CCM is constituted by polarization control means. PCM for making polarization different between a plurality of imaging beams. The PCM spatially splits an imaging beam passing through a contact hole pattern on reticle while being diffracted, into a plurality of beams incoherent with each other in the pupil plane, which reach the wafer.

In another preferable embodiment of the present invention, the above coherence reducing means CCM is constituted by a path length difference control member for making the path length different from each other between a plurality of imaging beams.

In still another embodiment, the coherence reducing means CCM is constituted by a plurality of space filters alternately arranged in pupil. The plurality of space filters comprise a first space filter for permitting an imaging beam distributed in a region around the optical axis in the pupil of projection optical system to pass therethrough and a second space filter for permitting an imaging beam distributed in the region outside the central region to pass therethrough. Then exposure is effected on the wafer through a first exposure step using the first space filter and a second exposure step using the second space filter.

It is a further object of the present invention to provide a projection exposure apparatus which reduces coherence especially between beams respectively passing through a plurality of contact holes disposed close to each other on the reticle, so as to suppress the "proximity effect" which could cause connection of images between the images of plural contact holes.

To achieve this object, the present invention provides a projection exposure apparatus provided with the interference reducing means as described above and having a relatively large σ (ratio between numerical aperture of illumination beam and reticle-side numerical aperture of projection optical system), for example a σ value of not less than 0.5.

BRIEF DESCRIPTION OF THE DRAWINGS

FIGS. 3A and 3B are drawings respectively to show the relations among a coherence reducing member CCM, imaging beams, and a path difference ΔZ in the beams in defocus;

FIG. 6 is a drawing to show EMBODIMENT 1-1 to EMBODIMENT 1-6 of polarization control member PCM and states of polarization of the beams therein;

FIG. 18 is a drawing to show graphs of light image intensity distribution to show a simulation result of conventional FLEX method for a single hole pattern;

FIG. 49A is a cross section to show a contact hole pattern;

FIG. 49B is a drawing to show graphs illustrating a simulation result of change in coherence function for each a value of illumination light with the contact hole pattern in FIG. 49A;

FIGS. 68A and 68B are plan views to show two types of patterns in which two proximate holes are located at a different distance;

DESCRIPTION OF THE PREFERRED EMBODIMENTS

First Embodiment

Figure 4:
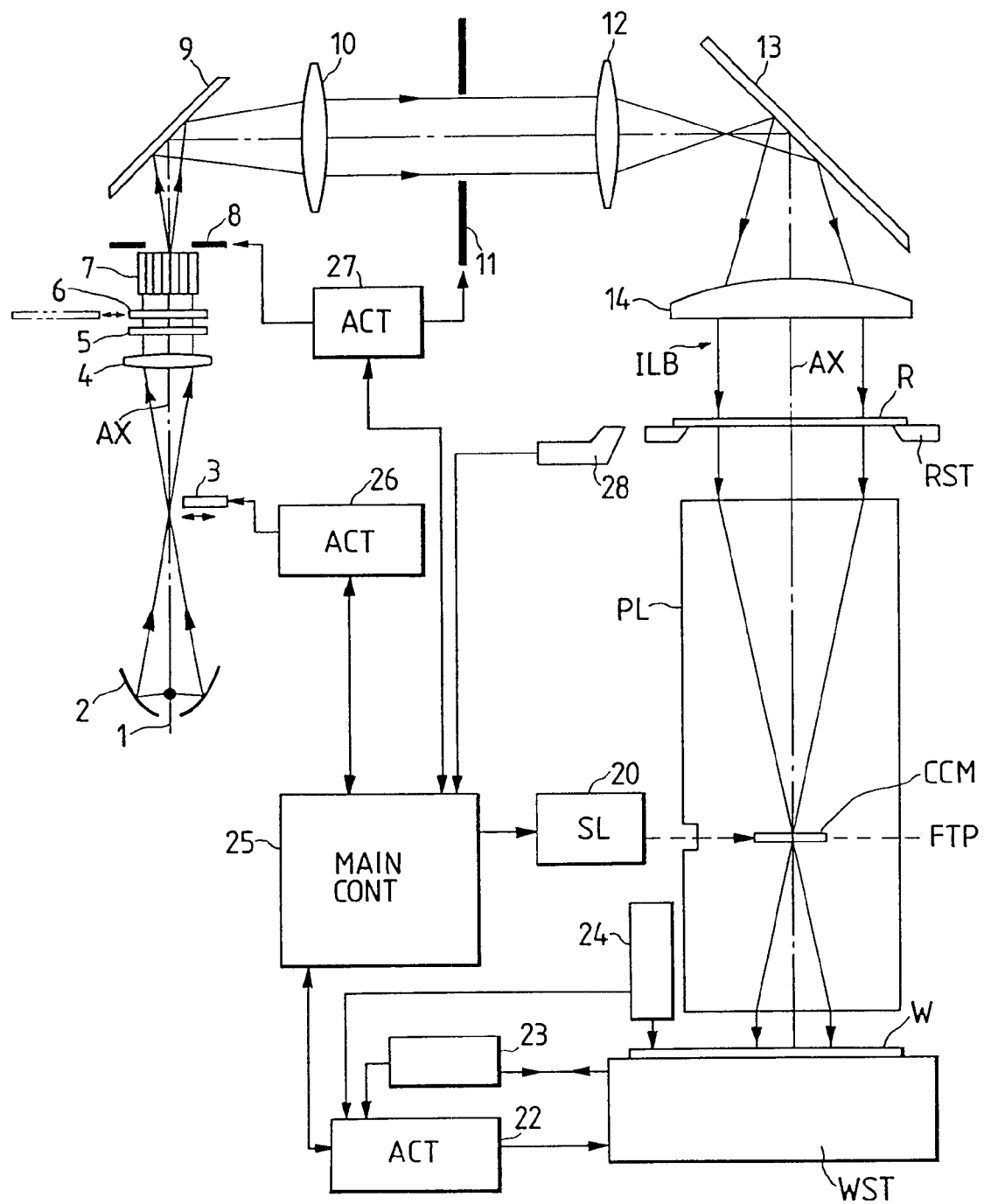
FIG. 4 is a schematic drawing to show the general structure of a projection exposure apparatus as the first embodiment of the present invention.

FIG. 4 shows the general construction of projection exposure apparatus as the first embodiment of the present invention.

High-luminance light emitted from a mercury lamp 1 is converged by an ellipsoid mirror 2 at the second focus thereof then to enter a collimator lens 4. A rotary shutter 3 is inserted into or taken out of the optical path at the second focus position to control transmission or interruption of illumination light. The collimator lens 4 changes the illumination light into a beam of parallel rays. The parallel beam enters an interference filter 5, which extracts a desired spectrum necessary for exposure, for example only i-line. The illumination light outgoing from the interference filter, 5 (i-line) passes through a polarization control element 6 for aligning the direction of polarization and then enters a fly's-eye lens 7 which functions as an optical integrator.

The polarization control element 6 may be a polarizing plate which aligns the illumination light entering the fly's-eye lens 7 in a certain polarization direction, which could be omitted in some cases as described hereinafter.

The illumination light entering the fly's-eye lens 7 (nearly collimated beam) is split into beams by a plurality of lens elements in the fly's-eye lens 7, each forming a secondary light source image on the exit side of each lens element. Accordingly, there are the same number of images of point light source as the number of lens elements distributed on the exit side of fly's-eye lens 7, thus forming a plane light source image. A variable stop 8 is provided on the exit side of fly's-eye lens 7 to adjust the size of plane light source image. The illumination light passing through the stop 8 is reflected by a mirror 9 and then enters a condenser lens system 10. After that, the illumination light illuminates a rectangular aperture in a reticle blind 11 at a uniform illuminance distribution.

FIG. 4 representatively shows only the illumination light from a secondary light source image located on the optical axis AX out of the plural secondary light source images formed on the exit side of fly's-eye lens 7. The condenser lens system 10 makes-the exit side of fly's-eye lens 7 (the plane on which the secondary light source images are formed) be a Fourier transform plane of the rectangular aperture plane in the reticle blind 11. Therefore, after the illumination beams respectively diverge from the plurality of secondary light source images formed by the fly's-eye lens 7 and enter the condenser lens system 10, the beams impinge on the reticle blind 11 in a superimposed manner as beams of parallel rays different in incident angle slightly from each other.

After the illumination light passes through the rectangular aperture in the reticle blind 11, it enters a condenser lens 14 via a lens system 12 and a mirror 13. Light outgoing from the condenser lens 14 reaches a reticle R as illumination light ILB. The rectangular aperture plane of reticle blind 11 is arranged conjugate with a pattern surface on reticle by a composite system of lens system 12 and condenser lens 14, so that an image of rectangular aperture in reticle blind 11 is formed on the pattern surface of reticle including a rectangular pattern-forming region formed in the pattern surface of reticle.

As shown in FIG. 4, the illumination light ILB from the one secondary light source image located on the optical axis AX out of the secondary light source images by the fly's-eye lens 7 becomes a beam of parallel rays not inclined to the optical axis AX on the reticle R, which is because the projection optical system PL is telecentric on the reticle side. Of course, there are numerous secondary light source images (point light sources off the axis) formed offset from the optical axis AX on the exit side of fly's-eye lens. 7. Thus, illumination light from such images becomes beams of parallel rays inclined relative to the optical axis AX on the reticle, which are superimposed in the pattern forming-region.

It is a matter of course that the pattern surface of reticle and the exit plane of fly's-eye lens 7 are in optical relation of Fourier transform through the composite system of condenser lens system 10, lens system 12 and the condenser lens 14. Also, the range of incident angle $\Phi$ of illumination light ILB into the reticle (see FIG. 2) changes depending upon the aperture diameter of stop 8, so that as the substantial area of plane light source is made smaller by decreasing the aperture diameter of stop 8, the incident angle range $\Phi$ also decreases. Thus, the stop 8 adjusts the spatial coherency of illumination light. Used as a factor to represent the degree of spatial coherency is a ratio ($\sigma$ value) between sine of maximum incident angle $\Phi/2$ of illumination light ILB and reticle-side numeric al aperture NAr of projection optical system PL.

The $\sigma$ value is normally defined by the equation of $\sigma=\sin(\Phi/2)/NAr$. Most of steppers currently under operation are used in the range of $\sigma=0.5$ to 0.7.

Formed on the pattern surface of reticle is a reticle pattern composed of a chromium layer and a transparent portion without chromium layer. The shape of the transparent portion includes a plurality of contact hole patterns formed as fine rectangular apertures. The contact hole patterns are designed such that when each contact hole pattern is projected onto the wafer W it forms an image with a size smaller than a square of 0.5 $\mu$m. Therefore, the size of each contact hole pattern on the reticle is determined taking a projection magnification 1/M of projection optical system PL into consideration. Further, it is usual that a distance between mutually adjacent contact hole patterns is considerably larger than the size of a contact hole pattern. Thus, most of contact hole patterns exist as isolated fine patterns on the reticle. Namely, most of two adjacent contact hole patterns are distant from each other so that beams from the contact hole patterns (diffracted beams or scattered beams) are free of strong mutual influence as in diffraction grating. In contrast, there exist reticles with contact hole patterns formed in very close arrangement, as detailed later.

In FIG. 4, the reticle R is held by a reticle stage RST, and an optical image of contact hole patterns on reticle (which is light intensity distribution) is formed on a photoresist layer on the surface of wafer W through the projection optical system PL. It should be noted that the optical path from the reticle to the wafer is illustrated only by principal rays of imaging beams in FIG. 4.

Figure 1:
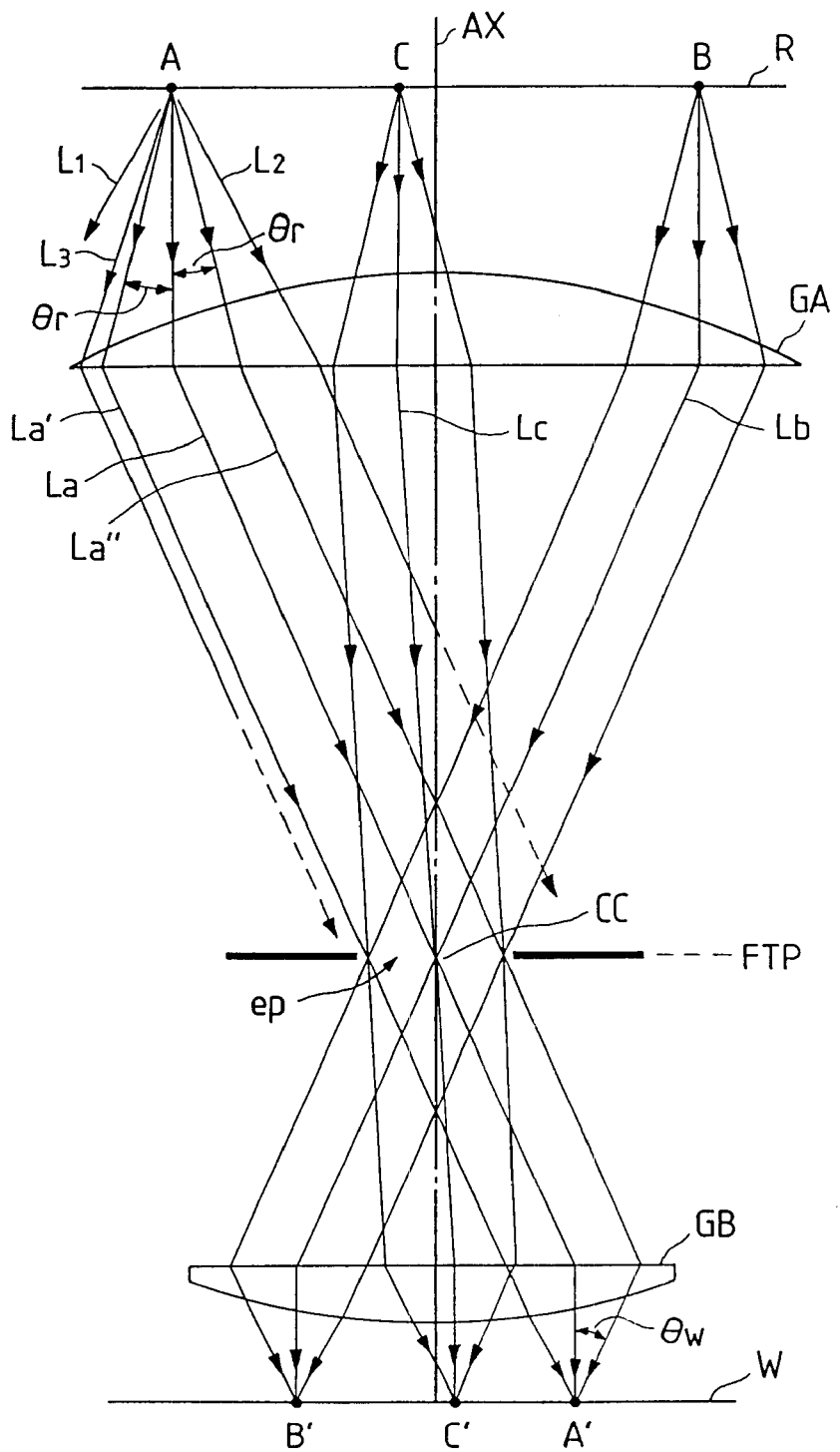
FIG. 1 is a path diagram to show a conventional projection optical system.
Figure 2:
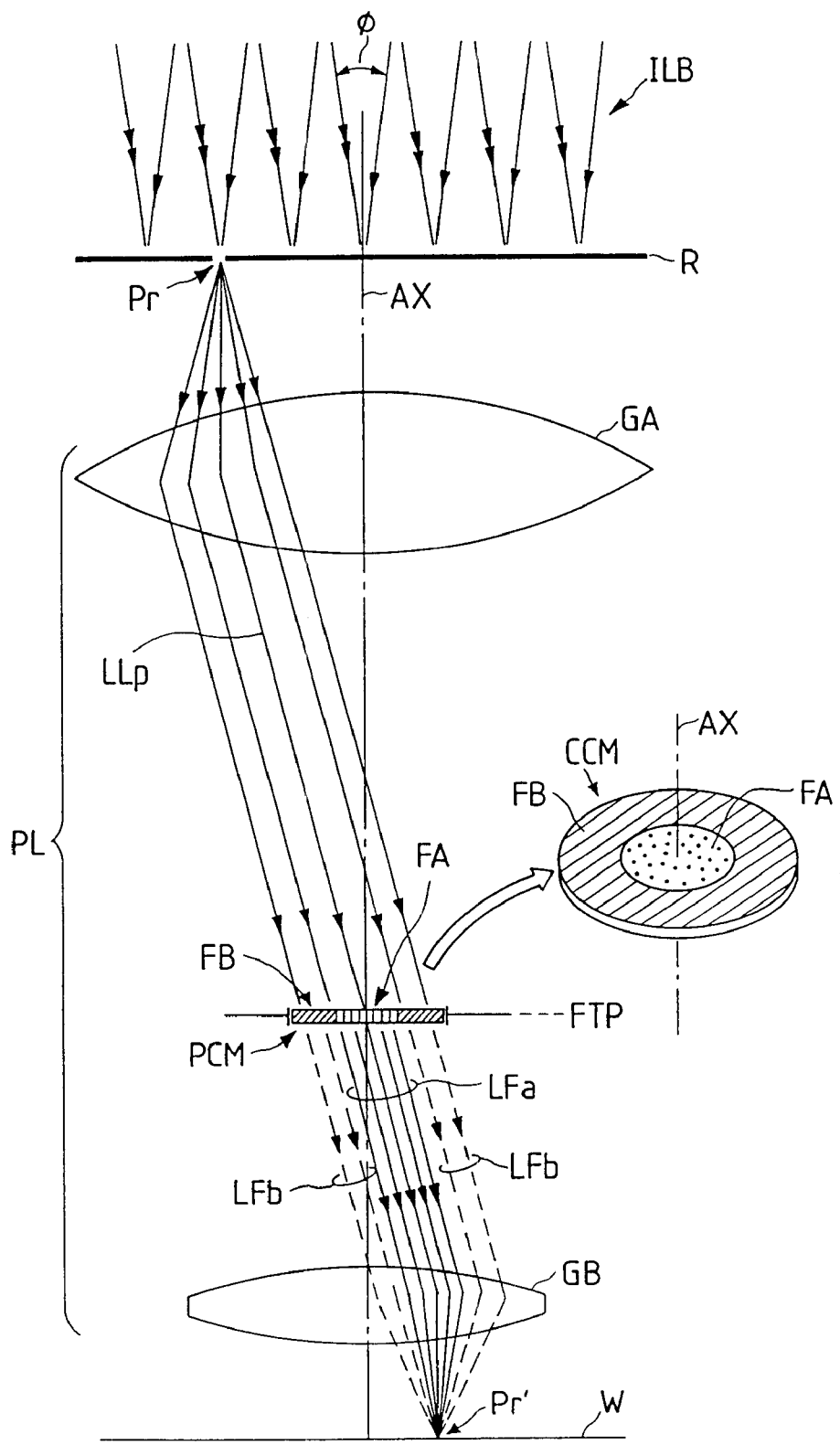
FIG. 2 is a path diagram to show a theoretical structure of projection optical system according to the present invention.

The polarization control member PCM is provided as the coherence reducing member described with FIG. 2 and FIGS. 3A and 3B on the Fourier transform plane FTP in the projection optical system PL. The PCM has a diameter covering the maximum diameter of pupil ep and is arranged to recede from the optical path or to advance into the optical path by means of a slider mechanism 20. If the stepper is exclusively used for exposure of contact hole patterns, the PCM may be arranged to be fixed in the projection optical system PL. However, in case that a plurality of steppers are used in exposure operation in lithography and if the most efficient operational use is considered for each stepper, it is hesitated to assign a specific stepper for exclusive use for exposure of contact hole patterns. It is thus desirable that the PCM is detachably mounted to the pupil ep of projection optical system PL so that the stepper can be used for exposure of reticle patterns other than the contact hole patterns. Depending upon the projection optical system, a circular aperture stop may be provided for changing the effective pupil diameter at the pupil position (Fourier transform plane FTP). In this case, the aperture stop and the PCM are arranged as close t o each other as possible not to interfere mechanically a with each other.

The wafer W is held on a wafer stage WST which two-dimensionally moves in the plane normal to the optical axis AX (which will be referred to as XY movement) and finely moves in the direction parallel to the optical axis AX (as will be referred to as Z movement). The XY movement and Z movement of wafer stage WST are carried out by a stage drive unit 22. The XY movement is controlled according to coordinate values measured by a laser interferometer 23, while the Z movement is controlled based on values detected by a focus sensor for autofocus. The stage drive unit 22 or the slider mechanism 20 is actuated by a command from a main control unit 25.

The main control unit 25 sends a command to a shutter drive unit 26 to control opening and closing of shutter 3 and sends a command to an aperture control unit 27 to control the size of aperture in the stop 8 or the reticle blind 11. The main control unit 25 is arranged to receive a name of reticle read by a bar-code reader 28 provided in a transfer path of reticle to the reticle stage RST. Then, the main control unit 25 generally controls the operation of slider mechanism 20 and the operation of aperture drive unit 27 in accordance with the received reticle name, so that it can automatically adjust each aperture size for stop 8 or for reticle blind 11 and determine whether the PCM is necessary or not according to the reticle.

Figure 5:
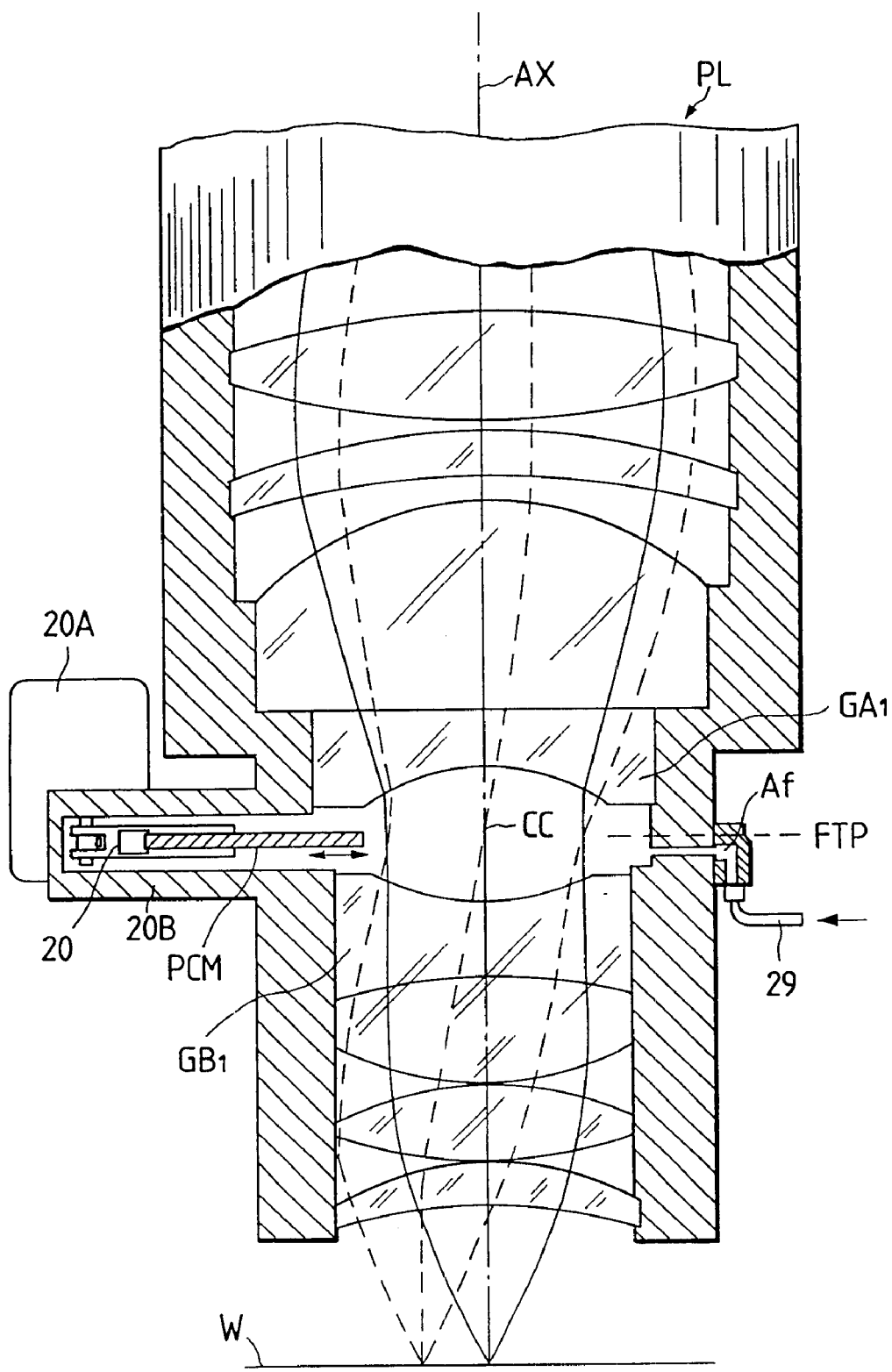
FIG. 5 is a partial cross section to show the construction of a projection optical system in the first embodiment.

Now described referring to FIG. 5 is the, construction of a part of the projection optical system PL.

FIG. 5 shows a partial cross section of projection optical system PL all constituent elements of which are made of refractive glass materials, in which the Fourier transform plane FTP is present in a space between the lowermost lens $GA_1$ in the front-group lens system GA and the uppermost lens $GB_1$ in the rear-group lens system GB. The projection optical system PL includes a plurality of lenses held by a lens barrel and has an opening for attachment or detachment of the polarization control member PCM therethrough. A cover 20B extends from the opening in the lens barrel to prevent the PCM and all or a part of slider mechanism 20 from being exposed directly to air. The cover 20B prevents fine dust floating in air from entering the pupil space in the projection optical system PL.

Connected to the slider mechanism 20 is an actuator 20A such as a rotary motor, a pen cylinder or a solenoid. Further, a passage Af communicating with the pupil space is provided through a portion of lens barrel so that temperature-controlled clean air can be introduced into the pupil space through a pipe 29 to avoid a temperature rise due to absorption of a part of exposure light in the PCM and a temperature rise in the entire pupil space. If the system is arranged to coercively discharge through the slider mechanism 20 and the actuator 20A the clean air coercively supplied into the pupil space, dust produced in the slider mechanism 20 or the neighboring parts can be prevented from entering the pupil space.

Figure 7:
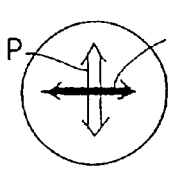
FIG. 7 is a drawing to show EMBODIMENT 1-7 to EMBODIMENT 1-12 of polarization control member PCM and states of polarization of the beams therein.

FIG. 6 and FIG. 7 show various embodiments of polarization control member PCM as EMBODIMENT 1-1 to EMBODIMENT 1-12in the form of table.

As described above with FIGS. 3A and 3B, the radius $r_1$ of circular transmissive portion FA which gives a first polarization state, is set as follows in relation with the maximum effective radius $r_2$ of pupil ep.

$$2r_1^2 = r_2^2$$

The radius $r_1$ is preferably several % larger than the above value in fact. As seen from this equation, an area $\pi r_1^2$ of circular transmissive portion FA is about a half of an area $\pi r_2^2$ of effective pupil aperture.

The polarization control element 6 is obviated in EMBODIMENT 1-1 and in EMBODIMENT 1-2 in FIG. 6. The mercury lamp 1 emits light in a random polarization state. The light in a random polarization state means light inwhich light components in various polarization states are synthesized and the polarization states change with time. Accordingly, the beams passing through the contact hole patterns on reticle and then reaching the PCM are also in a random polarization state.

In EMBODIMENT 1-1 PCM 101 is composed of a circular transmissive portion FA with radius $r_1$, which is formed of a polarizing plate transmitting only linearly polarized light in a specific polarization direction, and a annular, peripheral transmissive portion FB, which is formed of a polarizing plate transmitting only linearly polarized light in the direction perpendicular to the said specific polarization direction. Then, a beam passing through the PCM 101 is polarized for example such that in the central transmissive portion FA the polarization is in plane of vibration of electric field from upper right to upper left (plane of polarization) while in the peripheral transmissive portion FB the polarization is in the plane of polarization from upper left to lower right. Therefore, the beams each are linearly polarized in the respective directions of polarization perpendicular to, each other as beams (LFa, LFb). incoherent with each other.

In EMBODIMENT 1-2 PCM 102 is constructed by providing a quarter-wave plate FC over the entire exit plane of the PCM 101 as described in EMBODIMENT 1-1. The quarter-wave plate FC works to convert the linearly polarized light passing through the transmissive. portion FA and the linearly polarized light passing through the transmissive portion FB into beams of circularly polarized light rotating opposite to each other. The quarter-wave plate FC is made of a birefringent material such as a quartz crystal. The beam passing through the PCM 102 includes for example right-handed circularly polarized light in the central transmissive portion FA and left-handed circularly polarized light in the peripheral transmissive portion FB as being in mutually incoherent polarization states.

Since the PCM 101, 102 in EMBODIMENT 1-1 or 1-2 is formed of a polarizing plate, a half of light quantity which is to be originally transmitted by the projection optical system PL is absorbed. This could cause a drop in exposure power or cause accumulation of thermal energy in the projection optical system, influencing the stability of optical system or glass materials therefor.

EMBODIMENTS 1-3 to 1-6 solved these problems:, which will be described below. In these embodiments, the polarization property of illumination light ILB changed using the polarization control element 6, as shown in FIGS. 8A to 8C.

Figure 8A:
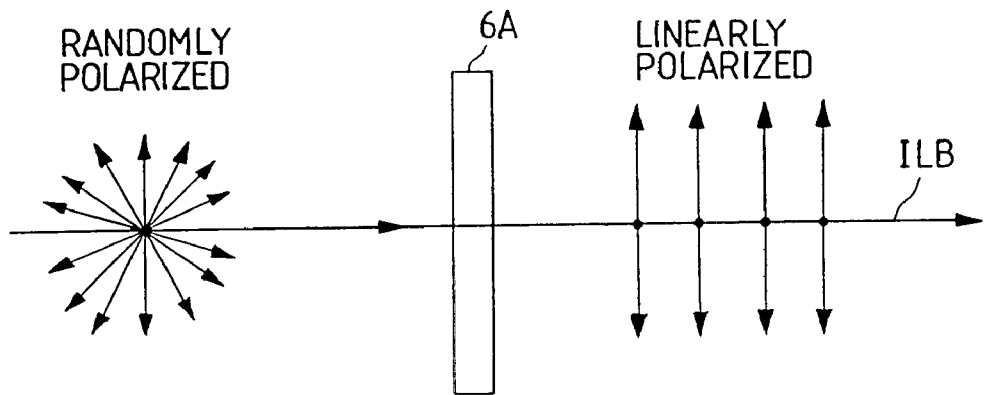
FIGS. 8A, 8B and 8C are drawings respectively to show conversion of polarization of illumination light effected by a polarization control element.

FIG. 8A shows an example using a polarizing plate 6A as the polarization control element 6, with which the randomly polarized light from the mercury lamp is converted into linearly polarized light.

Figure 8B:
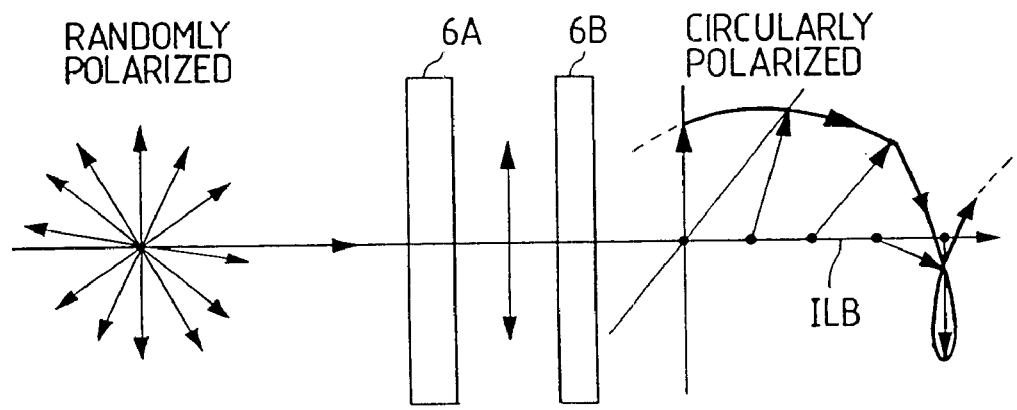

FIG. 8B shows an example using a combination of polarizing plate 6A as the polarization control element 6 and a quarter-wave plate 6B. The polarizing plate 6A converts the randomly polarized light into linearly polarized light, and the quarter-wave plate 6B converts the linearly polarized light into right-handed or left-handed circularly polarized light.

Figure 8C:
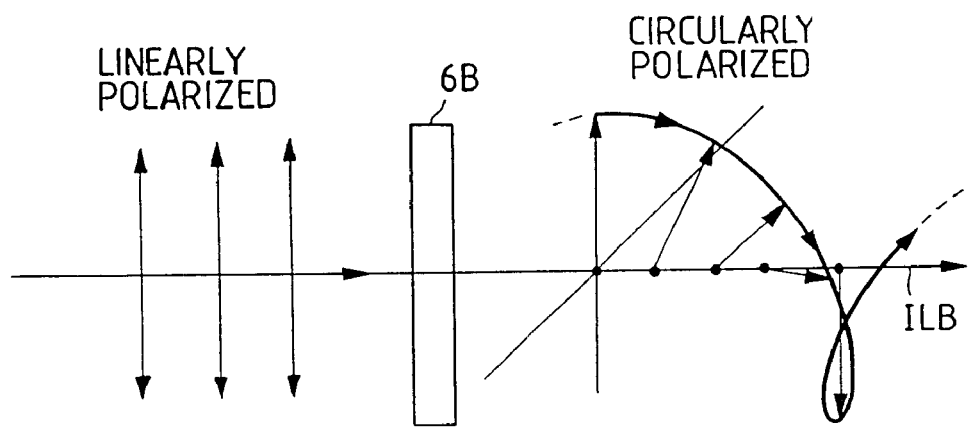

FIG. 8C shows an example using only a quarter-wave plate 6B as the polarization control element 6. If the light source emitting linearly polarized light, such as a laser, is used, illumination light ILB reaching the reticle is circularly polarized light.

Thus aligning the polarization of illumination light ILB, an imaging beam is also uniquely arranged as linearly polarized light or circularly polarized light when it reaches the PCM in the projection optical system PL after transmission and diffraction through a contact hole pattern. EMBODIMENT 1-3 and EMBODIMENT 1-4 in FIG. 6 show suitable constructions of PCM for illumination light ILB aligned as linearly polarized light.

In EMBODIMENT 1-3, PCM 103 has a circular a transmissive portion FA, with radius $r_1$ constructed of a half-wave plate and a peripheral, annular transmissive portion $FA_2$ constructed of an ordinary transparent plate (for example quartz) having the same optical thickness as that of $FA_1$. Linearly polarized light has the plane of vibration of electric field in the vertical direction in FIG. 6 immediately before incidence into the PCM 103. The linearly polarized light is converted into linearly polarized light vibrating in the horizontal direction by the transmissive portion $FA_1$ immediately after passage through the PCM 103. The original linearly polarized light is not changed in polarization in the peripheral transmissive portion $FA_2$ at all. An imaging beam thus has two polarization states, one in the central portion and the other in the peripheral portion incoherent with each other.

In EMBODIMENT 1-4 PCM 104 has a circular transmissive portion FA with radius $r_1$ and a peripheral annular transmissive portion $FB_2$, which are quarter-wave plates having the same thickness. Optimizing directions of axes of the quarter-wave plates as the transmissive portions $FA_2$, $FB_2$ with respect to the polarization state of incident beam, after passing through the transmissive portion $FA_2$ the linearly polarized light is changed into right-handed circularly polarized light while after passing through the transmissive portion $FB_2$ the linearly polarized light is changed into left-handed circularly polarized light, obtaining beams (LFa, LFb) different in polarization with each other.

In EMBODIMENT 1-3 and EMBODIMENT 1-4, if the PCM and the polarization control element 6 are arranged to be rotated relative to each other in the respective planes thereof, the direction of axis of half-wave plate or quarter-wave plate can be adjusted in the optimum condition with respect to the direction of polarization of illumination light ILB.

In EMBODIMENT 1-3 the direction of linear polarization can be also changed in such an arrangement that the half-wave plate $FA_1$ is replaced by an optical rotatory material such as quartz crystal.

Next shown in EMBODIMENT 1-5 and EMBODIMENT 1-6 are constructions of PCM suitable for circularly polarized illumination light ILB. When the incident beam is circularly polarized, the direction of axis of half-wave plate or quarter-wave plate need not be rotated in accordance with polarization property of illumination light, which is convenient.

In EMBODIMENT 1-5 PCM 105 is basically the same as PCM 103 as described above. Then the direction of rotation of circularly polarized light is inverted after passing through the half-wave plate $FA_1$, while the direction of rotation of circularly polarized light is not changed after passing through the transmissive portion $FB_2$ for example of quartz plate. In EMBODIMENT 1-3 or EMBODIMENT 1-5, the annular transmissive portion $FB_1$ may be constructed of a half-wave plate. In EMBODIMENT 1-6 PCM 106 may be exactly the same as the PCM 104 as described above. Emergent beams from the transmissive portions $FA_2$, $FB_2$ are linearly polarized perpendicular to each other.

By the use of the polarization control element 6 and PCM 103–106, as described above, absorption of exposure energy may be avoided and thermal accumulation may be suppressed in the projection optical system PL, which is very convenient. There remains, however, another problem of loss in quantity of light caused by aligning the polarization state of illumination light ILB in the illumination optical system. FIG. 7 shows examples of illumination system reducing the loss in quantity of light of illumination light as EMBODIMENT 1-7 and EMBODIMENT 1-8, which will be described referring to FIGS. 9A and 9B. In EMBODIMENT 1-7 or 1-8, a system of FIG. 9A or FIG. 9B is provided instead of the polarization control element 6 in FIG. 4.

Figure 9A:
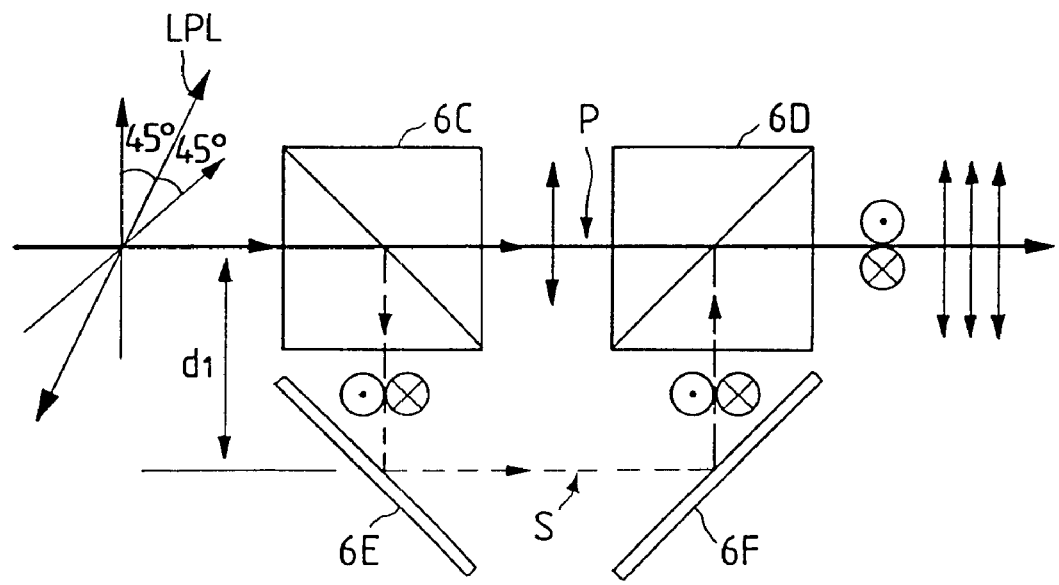
FIGS. 9A and 9B are path diagrams respectively to show the optical structure of a modification of polarization control element.
Figure 9B:
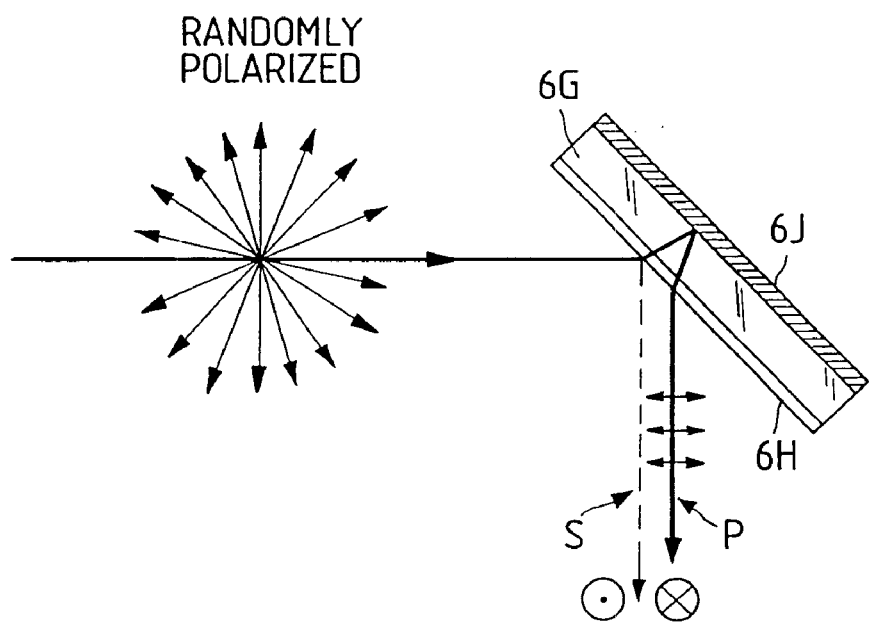

In FIG. 9A, there are two polarization beam splitters 6C, 6D disposed in the optical path of incident beam. A P-polarization (vertical polarization) component advances straight through the both beam splitters 6C, 6D. In contrast, an S-polarization (polarization in the direction normal to the plane of FIG. 9A) is separated by the beam splitter 6C, is reflected by mirrors 6E, 6F, and then is synthesized by the beam splitter 6D to advance with the same optic axis as the P-polarization component. The optical path including the mirrors 6E, 6F provides a path difference $2 \times d_1$ between the P-polarization component and the S-polarization component. Therefore, if a temporal coherence length $\Delta Lc$ of incident beam is shorter, than $2d_1$, the synthesized P- and S-polarization components become incoherent with each other in respect of time in addition to being complementary in respect of direction of polarization.

In EMBODIMENT 1-7 PCM 107 is employed together with illumination light having these two polarization components. The PCM 107 is the same as the PCM 103 in EMBODIMENT 1-3. As shown in FIG. 7, among the P-polarization component (polarized in the direction of blank arrow) and the S-polarization component (polarized in the direction of solid arrow), a part of incident beam into the circular transmissive portion $FA_1$ (half-wave plate) in PCM 107 is rotated by 90° of polarization direction. As a result, there are four types of resultant beams incoherent with each other after passing through the PCM 107. The four resultant beams are either different from each other in direction of polarization or incoherent with each other in respect of time, thus never interfering with each other.

Since the optical system shown in FIG. 9A can provide a large path difference between the two polarization components to be synthesized, it is suitable for a light source having a relatively long, temporal coherent length, for example for a narrowed laser light source.

Even when linearly polarized light is employed as laser light source, illumination light can be converted into two temporally incoherent beams using the optical system in FIG. 9A, which can reduce speckle or interference fringes (illuminance unvenness) which could be problems in use of laser light source. In that case, a preferable polarization direction of linearly polarized light is polarization direction LPL intermediate between the P-polarization direction and the S-polarization direction (which is the direction at 45° to the both) with respect to the polarization beam splitter 6C in FIG. 9A.

Meanwhile, the temporal coherence length is short for a beam from a light source having a relatively wide spectral width, such as a mercury lamp. A simple optical member shown in FIG. 9B may replace the polarization control element 6, if such a light source is employed.

The optical member shown in FIG. 9B is constituted of a transparent plane-parallel plate 6G such as quartz with a polarization reflective film 6H on the outside surface and a total reflection film 6J on the inside surface, which is arranged to reflect a collimated beam from mercury lamp at a predetermined angle. In a randomly polarized incident beam from mercury lamp, an S-polarization component (polarized in the direction normal to the plane of FIG. 9B) is reflected by the film 6H on the outside surface while a P-polarization component passes through the film 6H and the plane-parallel plate 6G and then is reflected by the film 6J on the inside surface. Therefore, the S-polarized component and the P-polarized component have a path difference equal to approximately a double of optical thickness of plane-parallel plate 6G.

For example in case of i-line from mercury lamp, the center wavelength $\lambda$ is 365 nm and the wavelength width $\Delta\lambda$ is about 5 nm, and then coherence length $\Delta Lc$ is about 26 $\mu m$ from the generally used equation of coherence length, $\Delta Lc = \lambda^2/\Delta\lambda$. Accordingly, even a very thin (for example 1 mm in thickness) plane-parallel plate can provide a path difference enough to dissolve the temporal coherence.

In EMBODIMENT 1-8, a quarter-wave plate (not shown) is provided on the exit side of the optical system in FIG. 9A or 9B to change two linearly polarized beams from light source into circularly polarized beams rotating opposite to each other. After passing through the PCM 108, there are four types of beams incoherent with each other, because a left-hand polarization component (blank arrows) passing through the transmissive portion $FA_1$ is temporally incoherent with a left-hand polarization component (solid arrows) passing through the transmissive portion $FB_1$.

EMBODIMENT 1-9 and EMBODIMENT 1-10 are next described.

In EMBODIMENT 1-9, PCM 109 has a triple structure of a central, circular transmissive portion $FA_1$, an immediately-adjacent, peripheral, annular transmissive portion. $FB_2$ and a further peripheral, annular transmissive portion $FB_3$. The circular transmissive portion $FA_1$ and the outer most annular transmissive portion $FB_3$ are polarizing plates which transmit a beam in the same polarization state, and the intermediate annular transmissive portion $FB_2$ is a polarizing plate which transmits a beam in a polarization state perpendicular thereto. An emergent beam from PCM 109 is polarized in directions as shown. A beam through the circular transmissive portion $FA_1$ is in a polarization state different in polarization direction from that through the intermediate annular transmissive portion $FB_2$, which increases the depth of focus according to the principle as described hereinbefore. Further, a beam through the circular transmissive portion $FA_1$ is in the same polarization state as one through the outermost annular transmissive portion $FB_3$ and the range of incident angle into the wafer is wide ranging from $\sin \theta = 0$ (normal incidence) to NAw. However, the circular transmissive portion $FA_1$ and the annular transmissive portion $FB_3$ constitute a kind of triple focus filter which can provide a phase difference between the two beams, thus providing a great depth of focus.

In EMBODIMENT 1-10, PCM 110 is constructed by further giving the circular transmissive portion $FA_1$ in PCM 109 in EMBODIMENT 1-9 a phase plate (phase film) $FC_2$ for shifting the path length difference by a half wave relative to the beam through the outermost annular transmissive portion $FB_3$. This arrangement constitutes a double focus filter for producing beams through the transmissive portions $FA_1$, $FB_3$ having inverted phases (amplitudes) relative to each other, increasing the depth of focus. The intermediate annular transmissive portion $FB_2$ produces a beam in a narrow range of incident angle into wafer, thus contributing to increasing the depth of focus of course.

With transmissive portions $FA_1$, $FB_2$, $FB_3$ having nearly equal areas,, the path length difference $\Delta Z$ shown in FIGS. 3A and 3B can be equally divided by beams through the transmissive portions $FA_1$, $FB_2$, $FB_3$, which maximizes the effect.

A further increase in depth of focus can be achieved by arrangement in EMBODIMENT 1-11 or 1-12.

Figure 10A:
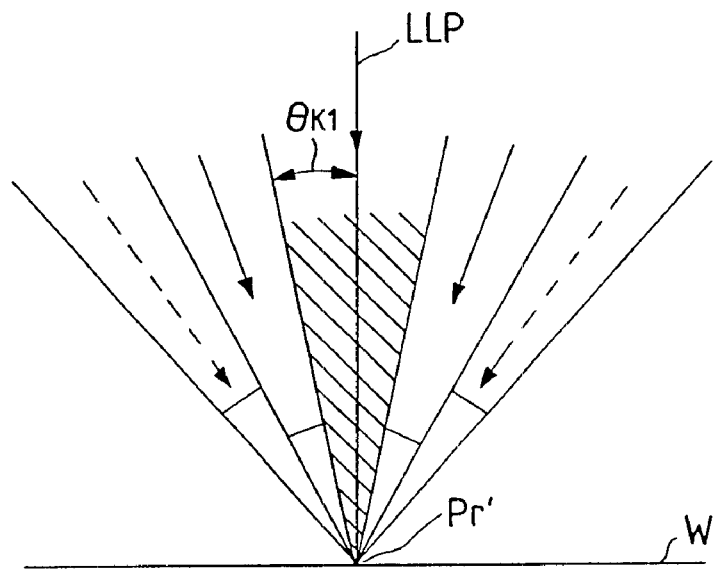
FIG. 10A is a drawing to show incidence ranges of two types of beams into a wafer in EMBODIMENT 1-11.

In EMBODIMENT 1-11, PCMM 111 has a circular shield portion $FD_1$ at the center of double annular transmissive portions FA, FB. An imaging beam into wafer is limited to two type of beams (beams through the transmissive portions FA, FB) in the range of incident angle thereof into wafer ranging from $\sin \theta_{K1}$ to NAw, as shown in FIG. 10A, where $K_1$ is a radius of the shield portion $FD_1$. With inclusion of the shield portion $FD_1$, the imaging beam existing in the incident angle range NAw is divided into three. Thus, an angular range of a beam (path length difference $\Delta Z$ due to defocus) is also divided into three. This reduces the path difference which has negative effect in defocus. Therefore, a further increase can be achieved in depth of focus.

Figure 10B:
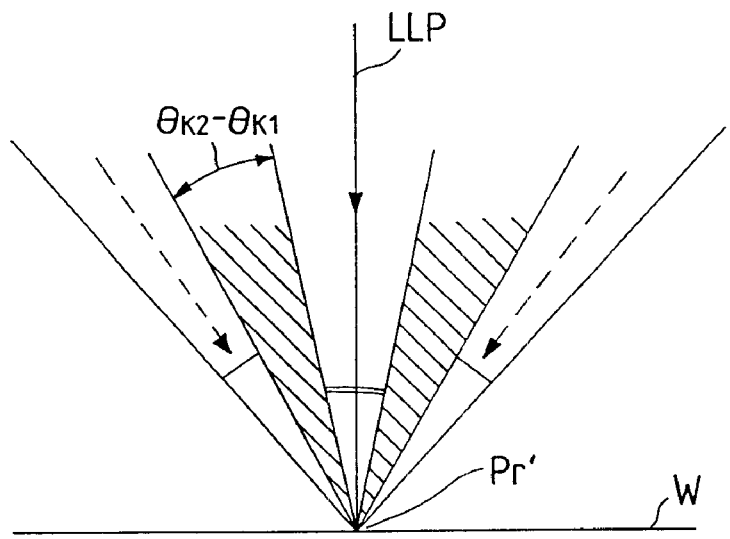
FIG. 10B is a drawing to show incidence ranges of two types of beams into a wafer in EMBODIMENT 1-12.

In EMBODIMENT 1-12, PCM 112 has an annular shield portion $FD_2$ between two transmissive portions FA, FB. The shield portion $FD_2$ has a width of $K_2-K_1$ and cuts off a part of imaging beam in the incident angle range $\theta_{K2}-\theta_{K1}$, as shown in FIG. 10B. This arrangement can also enjoy the same effect as in EMBODIMENT 1-11.

In each PCM 109–112 shown in EMBODIMENT 1-9 to 1-12, the central circular transmissive portion or the annular transmissive portion(s) may be constituted of a quarter-wave plate, a half-wave plate or an optical rotatory material. Also, the shield portion $FD_1$, $FD_2$ in PCM 111, 112 may be for example a shield film obtained by depositing a metal film or the like on a polarizing, plate or a wave plate, or a metal plate provided distant from the PCM.

Further, since the shield portion $FD_1$, $FD_2$ needs cut off only the beam of exposure wavelength, it may be for example an optical sharp cut filter such as a dielectric thin film. In such an arrangement, for example in case of an alignment system (TTL alignment system) in which a He—Ne laser is employed as a light source to illuminate an alignment mark on wafer and reflected light by the mark is detected through the projection optical system PL, the shield portion located on the pupil plane will not negatively affect the reflected light from the mark. Alternatively, the shield portion may be arranged to have a transparent area at the position where the laser beam for illuminating the wafer mark illumination or the reflected light from the mark passes. The effect of the present invention will not be affected greatly, if the area of transparent region is small.

Figure 11A:
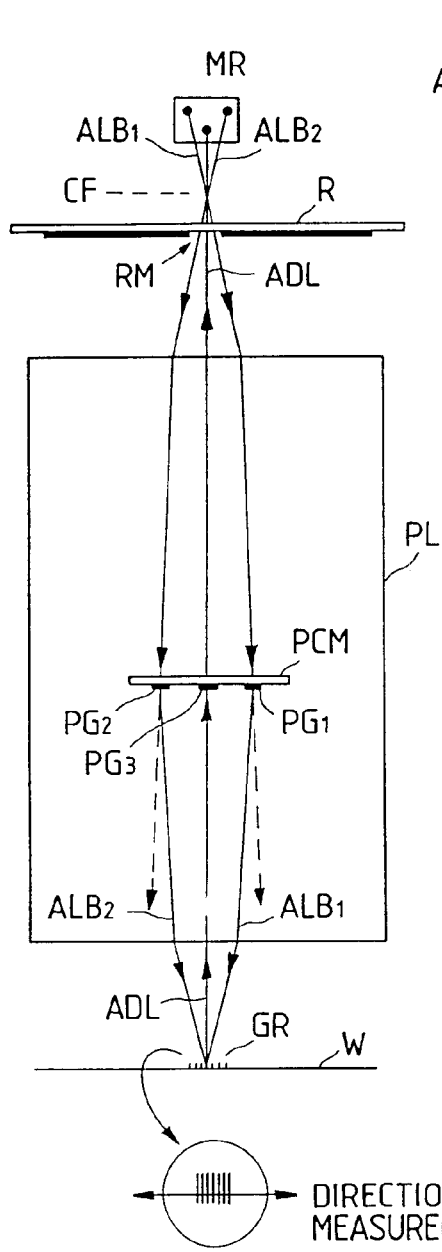
FIGS. 11A and 11B are a schematic elevational view and a schematic side view respectively to show a TTL alignment system in projection exposure apparatus to which the second embodiment is applied.
Figure 11B:
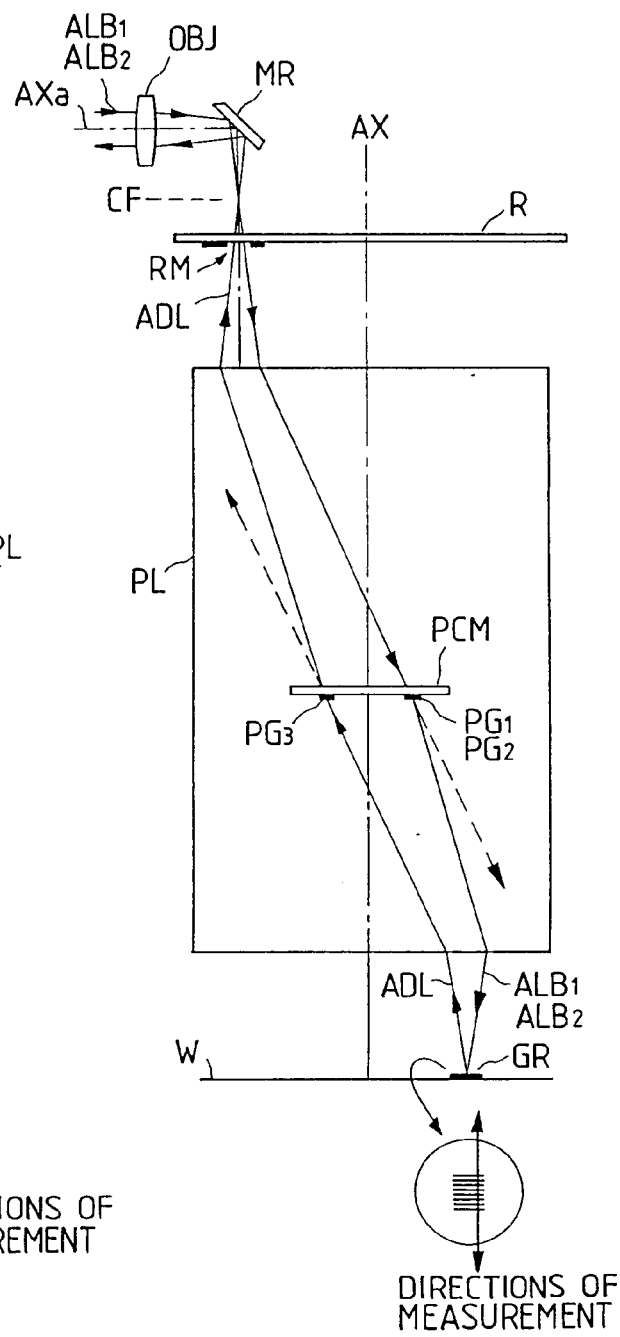

FIGS. 11A and 11B show a TTL alignment system in a projection exposure apparatus to which the present embodiment is applied, in,which a grating mark GR is formed on wafer W and a positional deviation is detected in the grating pitch direction of mark GR. FIG. 11A is a drawing to show an alignment system as seen along a direction perpendicular to the pitch direction parallel to the horizontal direction on the plane of drawing, and FIG. 11B is a drawing to show the alignment system as seen along a direction rotated 90° from FIG. 11A.

Two coherent laser beams (He—Ne) $ALB_1$, $ALB_2$ pass through an objective lens OBJ in the alignment optical system disposed above the reticle R and then are reflected by a mirror MR to intersect with each other at a plane CF. Then the beams enter a projection optical system PL through a window RM at the periphery of reticle. First, as shown in FIG. 11A, the two beams $ALB_1$, $ALB_2$ respectively enter flexible compensating elements $PG_1$, $PG_2$ formed on PCM located at the pupil, which change traveling directions of two beams $ALB_1$, $ALB_2$ by an amount corresponding to an axial chromatic aberration of projection optical system PL. Then the two beams $ALB_1$, $ALB_2$ illuminate the grating mark GR on wafer at angles inclined symmetric with each other with respect to the pitch direction. If the pitch Pg of grating mark GR, the wavelength $\lambda a$ of the beams $ALB_1$, $ALB_2$, and the incident angle $\theta a$ of the beams $ALB_1$, $ALB_2$ satisfy the relation of $\sin \theta a = \lambda a/Pg$, a +first order diffraction beam emergent from the grating mark GR upon illumination by beam $ALB_1$ and a −first-order diffraction beam emergent from the mark GR upon illumination by beam $ALB_2$ are coupled with each other as an interference beam ADL with the same optic axis to advance backward in an optical path intermediate between the two beams $ALB_1$ and $ALB_2$. A flexible compensating element $PG_3$ formed on PCM changes the traveling direction of the interference beam ADL, and then the beam returns to the alignment optical system through the window RM in reticle.

As also shown in FIG. 11B, the two beams $ALB_1$, $ALB_2$ reaching the mark GR on wafer are also inclined relative to the direction (non-measurement direction) perpendicular to the pitch direction, so that the interference beam ADL appears also inclined. Further, the plane CF can be actually made coincident with the position of window RM. Namely, the axial chromatic aberration for the two beams $ALB_1$, $ALB_2$ can be completely compensated for. Further, if the two beams $ALB_1$, $ALB_2$ enter the window RM as shifted from the telecentric state with respect to the non-measurement direction as shown in FIG. 11B, the chromatic aberration of magnification can be compensated for The optic axis AXa of objective lens OBJ is set perpendicular to the reticle.

There are two methods for measuring the positional deviation of mark GR. In one method the positional deviation of mark GR in the pitch direction is detected with reference to interference fringes formed on the mark GR upon cross of the two beams $ALB_1$, $ALB_2$. For that purpose, a photoelectric sensor for photoelectrically detecting the returning interference beam ADL is provided in the alignment optical system to measure the level of output signals therefrom. The other method is a heterodyning technique, in which the two beams $ALB_1$, $ALB_2$ are given a slight frequency difference (for example about 20 to 100 kHz) to move the interference fringes formed on the mark GR at a speed according to the frequency difference. In this case, the positional deviation of mark GR can be measured by obtaining a phase difference between a reference alternating current signal produced with the frequency difference between the two beams $ALB_1$, $ALB_2$ and the output signal from the photoelectric sensor (which will be alternating current signals in case of the heterodyning technique, because the interference beam ADL changes its amplitude at a beat frequency)

When the flexible compensating elements $PG_1$, $PG_2$, $PG_3$ for compensating for the chromatic aberration are disposed on the pupil plane of projection optical system PL, as described above, they could positionally interfere with the shape of the shield portion $FD_1$, $FD_2$ (or shield plate) shown in EMBODIMENT 1-11 or 1-12, depending upon the arrangement thereof. However, since the beams $ALB_1$, $AUB_2$ or the interference beam ADL have a very small spot diameter in the alignment method of this type, the compensating elements $PG_1$, $PG_2$, $PG_3$ could be formed in a very small size. Normally, each compensating element $PG_1$, $PG_2$, $PG_3$ is formed as a phase grating by etching or the like on the surface of transparent glass material. Then, in case that the shield portion $FD_1$, $FD_2$ positionally interferes with a compensating element, only the portion at the interfering position in the shield portion may be formed as a transparent portion, as described above.

Although FIGS. 11A and 11B show the compensating elements $PG_1$ to $PG_3$ directly formed on PCM, a normal quartz plate on which the compensating elements $PG_1$ to $PG_3$ are formed, may be fixed at the pupil plane and the PCM may be arranged to be detachably mounted in the very proximity of the quartz plate. There is a method for compensating for the chromatic aberration of alignment beam with provision of compensating lens (convex lens) with small diameter at the central portion in the pupil plane of projection optical system PL, for example as disclosed in U.S. Pat. No. 5,100,237. In this case, the compensating lens may have a dichroic film deposited thereon, which has a low transmittance for exposure wavelength but a very high transmittance for wavelength of alignment beam and which can be readily constructed as being substantially equivalent to the central shield portion $FD_1$ in PCM 111 shown in EMBODIMENT 1-11. The above U.S. Patent does not suggest the simultaneous provision of the transmissive portions FA, FB in EMBODIMENT 1-11 at all.

The drive unit 22 of wafer stage WST shown in FIG. 4 may have the function of conventional FLEX method in the control for finely moving the wafer along the optical axis. Also employing the FLEX method, the effect to increase the depth of focus by the present invention can be greatly enhanced. The present invention can be applied to any type of projection exposure apparatus. The invention can be applied for example to stepper-type exposure apparatus using a projection lens, step-and-scan type exposure apparatus using a catadioptric system, or 1:1 mirror-projection-type exposure apparatus. It is understood that the conventional FLEX method cannot be easily applied to the scan-type (step-and-scan) or mirror-projection-type apparatus, because the reticle and the wafer are scanned during exposure in the plane perpendicular to the optical axis of projection optical system. In contrast, the present invention can be extremely readily applied to such scan-type exposure apparatus.

Figure 12:
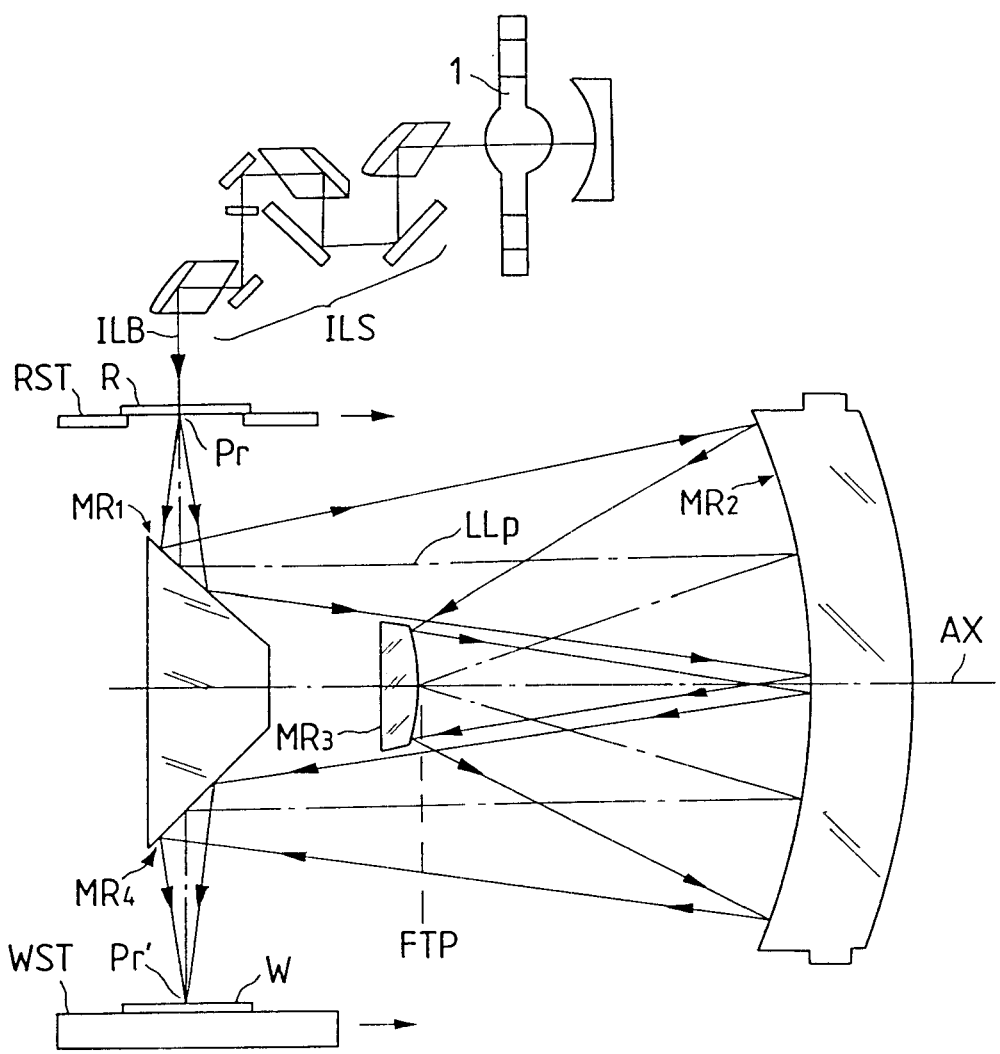
FIG. 12 is a path diagram to show an example of optical structure of mirror projection type aligner.
Figure 13:
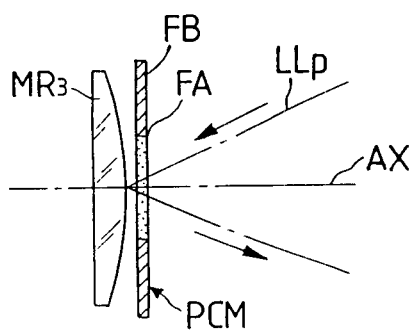
FIG. 13 is a drawing to show a state in which each PCM in the first embodiment is applied to the constitution in FIG. 12.

Now described referring to FIGS. 12 and 13, is an embodiment in which the present invention is applied to a 1:1 mirror-projection-type aligner.

In FIG. 12, illumination light from mercury lamp (Xe—Hg lamp) is guided through an illumination optical system ILS to impinge on an arcuate slit illumination area on teticle R. The reticle is held on a reticle stage RST which can be linearly moved in synchronism with a wafer stage WST at the same speed. The projection optical system is composed of a trapezoidal optical block having reflective surfaces $MR_1$, $MR_4$ respectively on the reticle side and on the wafer side, a large concave mirror $MF_2$ and a small convex mirror $MR_3$. The radius of curvature of the concave mirror $MR_2$ is set as about a double of radius of curvature of the convex mirror $MR_3$. In case of the system shown in FIG. 12, the surface of convex mirror $MR_3$ is often made coincident with the Fourier transform plane FTP to the reticle pattern surface (or wafer surface).

An imaging beam emergent from a point Pr on reticle R advances along the principal ray LLP via the reflective plane $MR_1$, the upper side of concave mirror $MR_2$, the entire surface of convex mirror $MR_3$, the lower side of concave mirror $MR_2$, and the reflective plane $MR_4$ to converge at a point Pr' on wafer W. Even when the surface of convex mirror $MR_3$ is at the pupil plane of system as in this arrangement, the PCM in each EMBODIMENT as described above can be used as it is or with a slight modification.

Specifically, the PCM is positioned in the close vicinity of the concave mirror $MR_3$, as shown in FIG. 13, so that the polarization state of imaging beam is changed twice in (forward and backward) optical path when the beam is incident from the concave mirror $MR_2$ into the convex mirror $MR_3$ and when the beam is outgoing from the convex mirror $MR_3$ to the concave mirror $MR_2$. The following points must be, however, considered. If the central circular (or annular) transmissive portion FA and the peripheral annular transmissive portion FB both are formed simply of polarizing plates as in EMBODIMENT 1-1, 1-9, 1-11 or 1-12, they can be used as they are. Contrary to it, if a part of transmissive portions FA, FB is a half-wave plate or a quarter-wave plate as in EMBODIMENT 1-2, 1-3 to 1-6, or 1-10, the half-wave plate must be changed into a quarter-wave plate and the quarter-wave plate into a one-eighth-wave plate in this embodiment, taking into consideration the double polarization effect in forward and backward optical path.

Also in case of projection exposure apparatus with light source of excimer laser, secondary light source images (numerous point light sources) formed on the exit side of fly's-eye lens or the like are re-imaged on the pupil plane of projection optical system. Then, if an optical element (lens, reflective surface, aperture stop, PCM, etc.) is located on the pupil plane for a long period under use, the optical element could be deteriorated due to the light source images converged thereon. Accordingly, the PCM or the like should be preferably arranged slightly away from the pupil plane, rather than at the exact pupil plane.

Although the polarization control element 6 in FIG. 4 is provided in the illumination optical system in each embodiment as described, the polarization control element 6 may be disposed at any location in the optical path before the PCM in the projection optical system PL. As an example, the light source is a linearlypolarized laser and a quarter-wave plate as the polarization control element 6 is inserted between the reticle R and the projection optical system PL, whereby the entire imaging beam emergent from the reticle R may be converted into circularly polarized light.

Meantime, since the lenses or reflective surfaces in projection optical system used in exposure apparatus of this type are made of extremely uniform glass materials, the polarization direction of incident beam into projection optical system should coincide with the polarization direction of outgoing beam therefrom. They could be slightly deviated from each other in some occasion. In that case, even if the PCM is located at the ideal position, the polarization directions of two beams LFa, LFb cannot be in perfect complementary relation. However, since such deviation from the complementary relation is small, the effect of the present invention will not be affected at all.

Next described based on the simulation results are the operation and effect in the first embodiment of the present invention.

Figure 14:
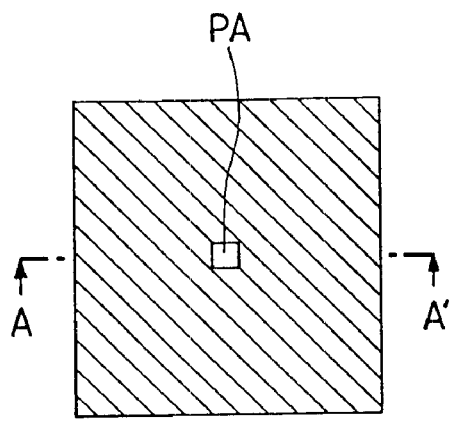
FIG. 14 is a plan view to show a contact hole pattern.

FIG. 14 shows a square contact hole pattern PA used in the following simulations, which corresponds to a square with each side of 0.3 μm on wafer. In the following simulations, an image intensity distribution is evaluated on wafer in a cross section along A–A' line in FIG. 14.

Figure 15:
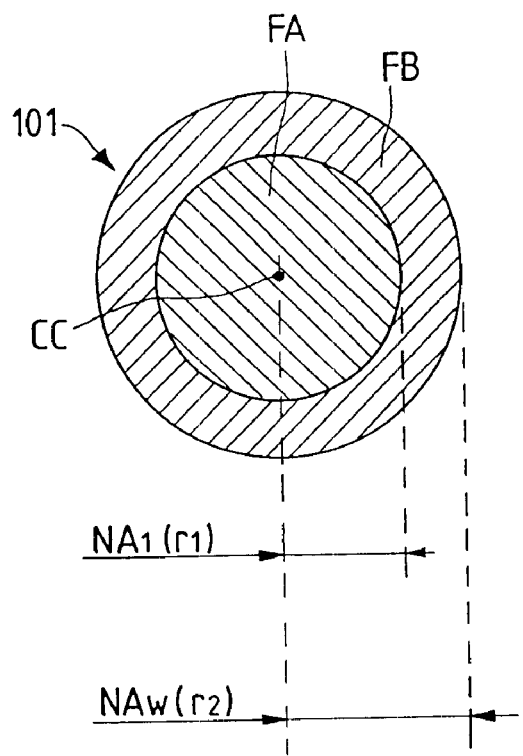
FIG. 15 is a plan view to show an example of PCM.

FIG. 15 shows the PCM 101 shown in FIG. 6, in which the ratio $r_1/r_2$ of radius $r_1$ of circular transmissive portion FA to maximum radius $r_2$ of pupil is set to be equal to $NA_1/NAw=0.707$ as described above. In more detail, it is determined to satisfy $\sin^2\theta_1=\frac{1}{2}$ ($NAw^2$), where $\theta_1$ is the maximum incident angle of imaging beam passing through the transmissive portion FA. The following simulations all were conducted under the conditions of NAw=0.57 and the exposure wavelength of i-line (wavelength 0.365 μm). Also, the σ value, which is a coherence factor of illumination beam, was 0.6.

Figure 16:
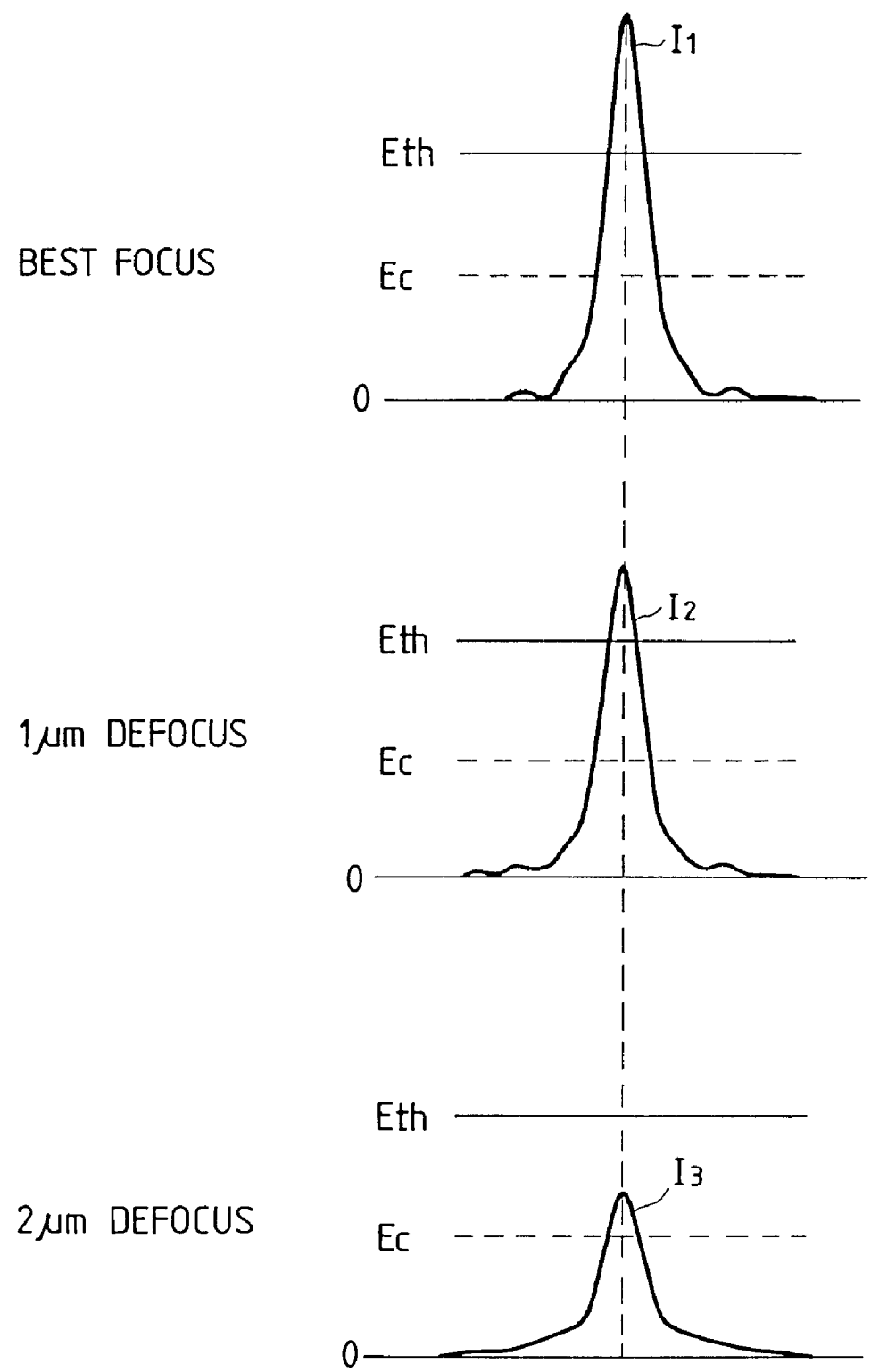
FIG. 16 is a drawing to show graphs of light image intensity distribution to show a simulation result of the effect of the second embodiment for a single hole pattern.

FIG. 16 shows an optical intensity distribution $I_1$ at the best focus position, an optical intensity distribution $I_2$ at a defocus position of 1 μm and an optical intensity distribution $I_3$ at a defocus position of 2 μm for an image of pattern PA projected onto the wafer. In FIG. 16, Eth represents an optical intensity necessary for complete removal (exposure) of positive photoresist on wafer and Ec an optical intensity at which the positive resist starts dissolving (film reduction). A longitudinal magnification (exposure amount) of each intensity distribution is set such that the diameter of contact hole (width of slice across Eth) at the best focus position is 0.3 μm.

Figure 17:
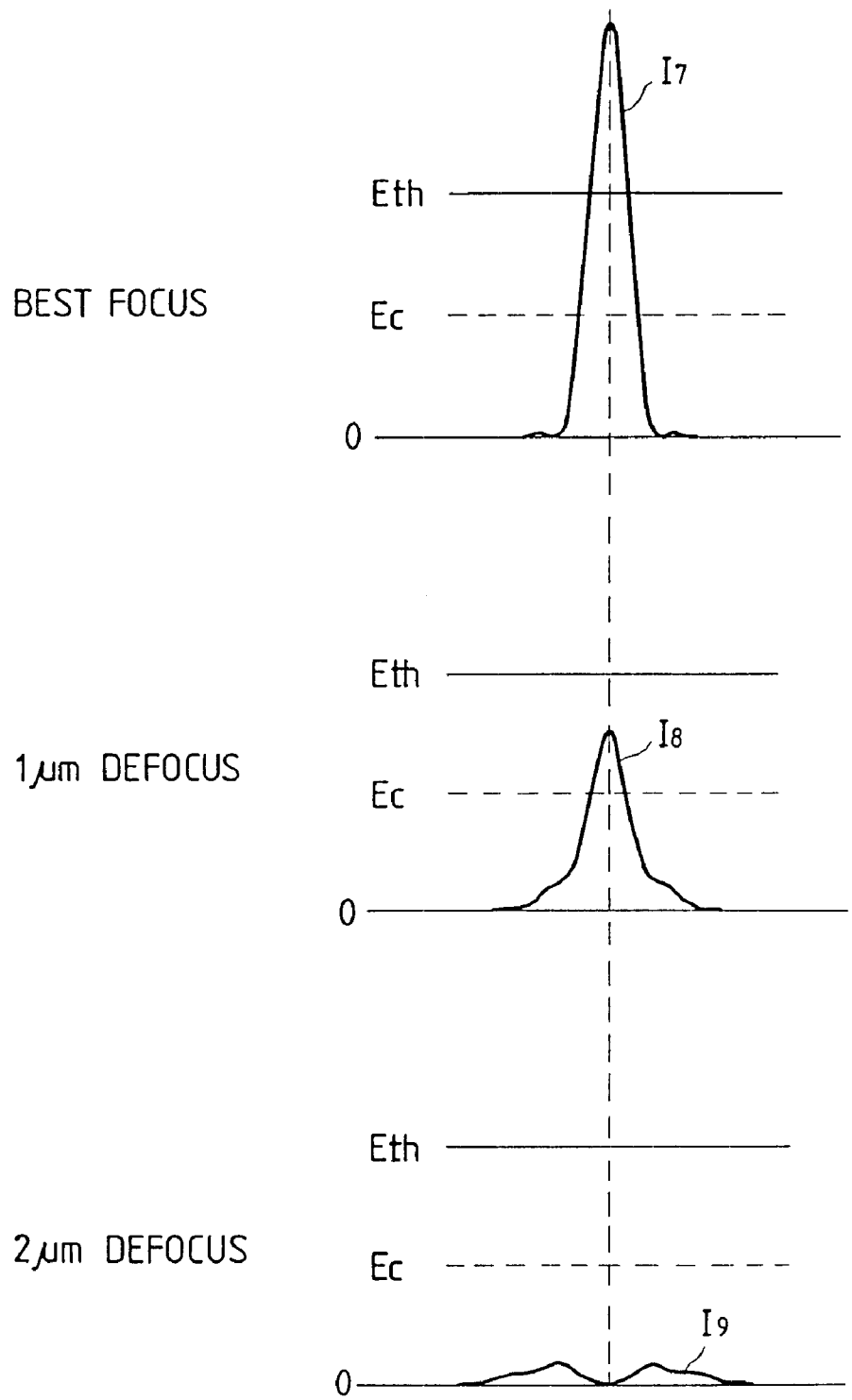
FIG. 17 is a drawing to show graphs of light image intensity distribution to show a simulation result of conventionally ordinary exposure method for a single hole pattern.

For comparison sake, FIG. 17 shows optical intensity distributions $I_7$, $I_8$, $I_9$ at the best focus position, at a defocus position of 1 μm and at a defocus position of 2 μm, respectively, in a conventionally ordinary exposure apparatus having no PCM. The simulation conditions therefor are similarly NAw=0.57, wavelength λ=0.365 μm, and σ=0.6.

Comparing FIG. 16 with FIG. 17, the embodiment with PCM decreases a change in image intensity in defocus (contrast drop) and increases the depth of focus as compared with the conventional example.

Further, FIG. 18 shows a change of optical intensity distribution $I_{10}$, $I_{11}$, $I_{12}$ of image in combination of ordinary projection exposure apparatus with the FLEX method. A separate exposure step is carried out at each defocus amount of +1.25 μm, 0 and –1.25 μm, that is, three steps in total, for each of the best focus position, the defocus position of 1 μm and the defocus position of 2 μm.

Comparing the simulation result in FIG. 18 with the simulation result in FIG. 16, it is seen that the increase effect of focal depth by the SFINCS method according to the present invention is equivalent to that by the FLEX method.

Figure 20:
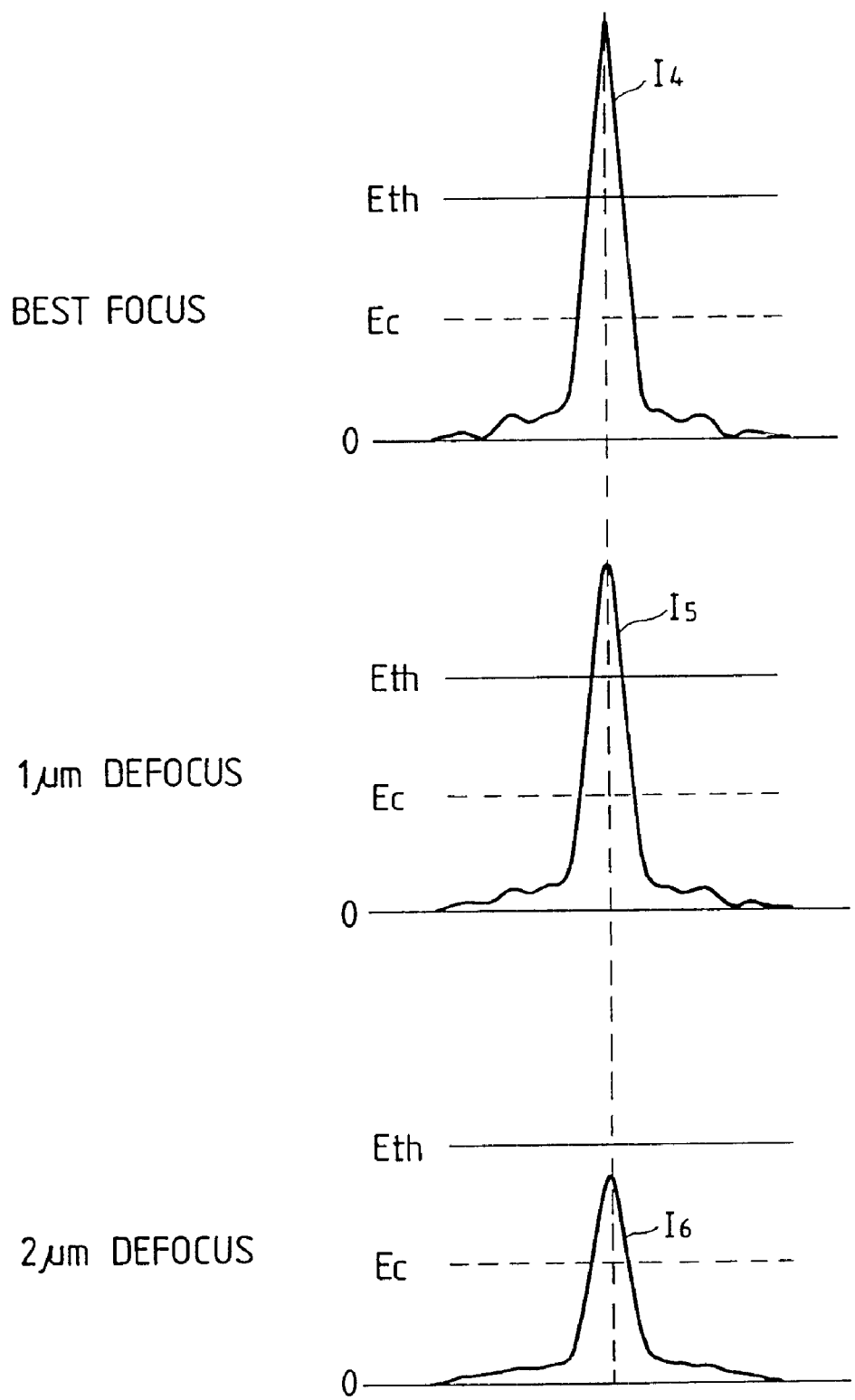
FIG. 20 is a drawing to show graphs of light lo image intensity distribution to show a simulation result of the effect of the second embodiment for a single hole pattern.

FIG. 20 shows a simulation result in case of the PCM 111 in FIG. 7 being used.

Figure 19:
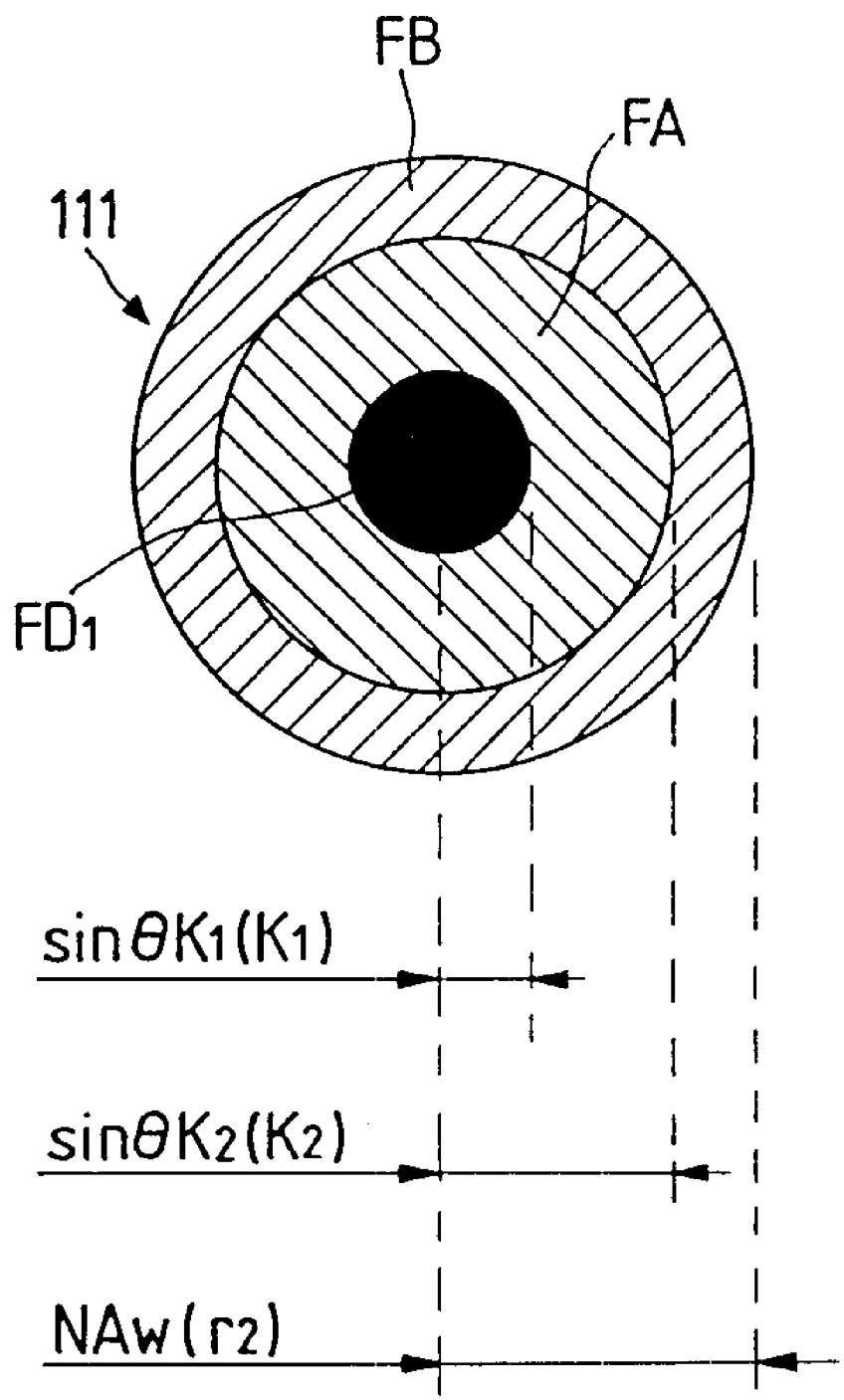
FIG. 19 is a plan view to show an example of PCM.

It is presumed as shown in FIG. 19 that the radius $K_1$ of circular shield portion $FD_1$ in PCM 111 is determined in the relation of 0.31 $r_2$ (that is, $\sin\theta_{K1}=0.31$ NAw) and the radius $K_2$ of intermediate annular transmissive portion FA is set in the relation of 0.74 $r_2$ (that is, $\sin\theta_{K2}=0.74$ NAw). The exposure conditions of NAw=0.57, σ=0.6 and λ=0.365 μm are the same as those in the preceding simulations.

Using the PCM 111, sufficient increase effect of depth of focus can be attained as seen in optical intensity distributions $I_4$, $I_5$, $I_8$ at the best focus position, at the defocus position of 2 μm and at the defocus position of 1 μm as shown in FIG. 20.

Figure 21:
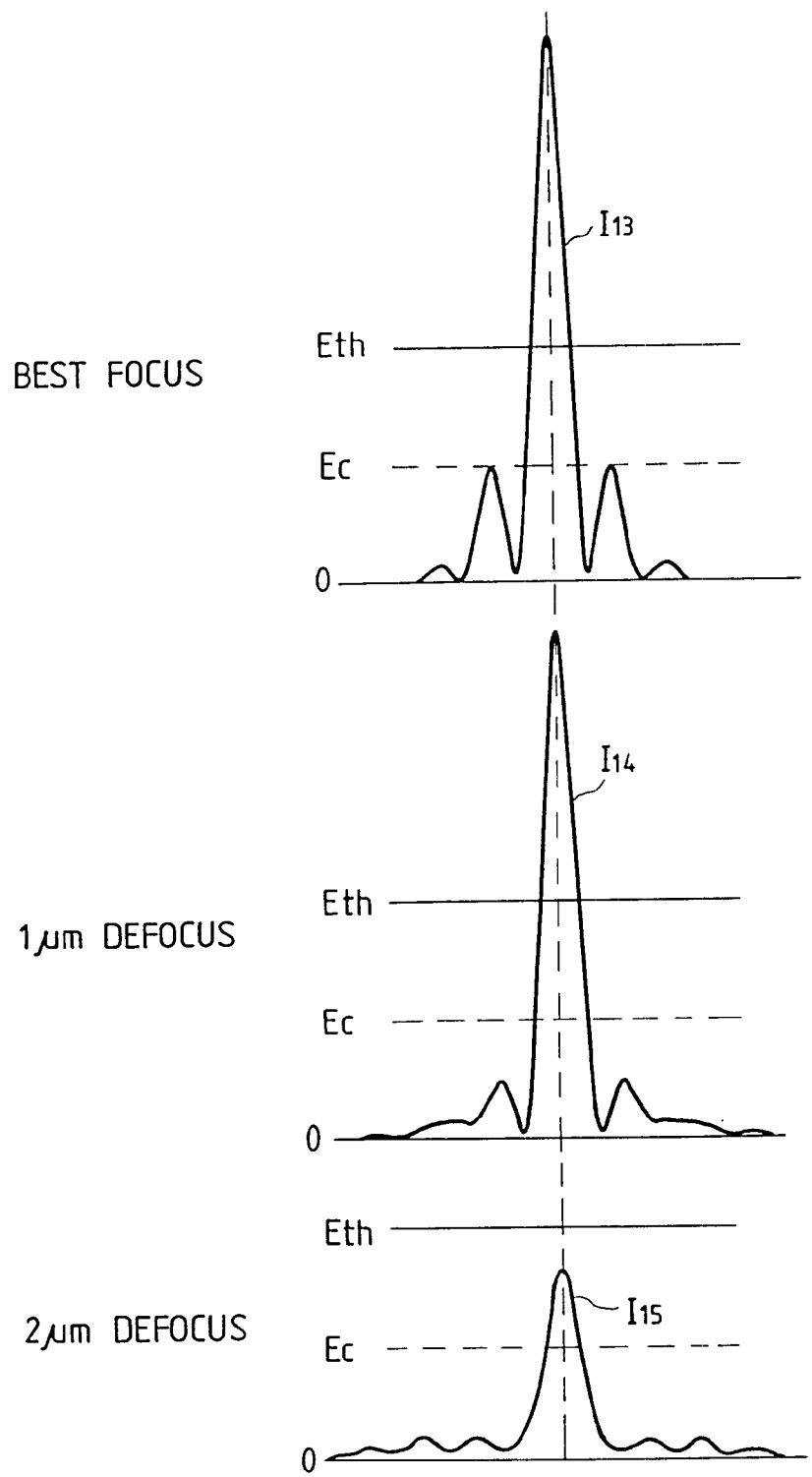
FIG. 21 is a drawing to show graphs of light image intensity distribution to show a simulation result of conventional Super-FLEX method (1) for a single hole pattern.

FIG. 21 shows a simulation result in the conventional Super-FLEX method for comparison, showing optical intensity distributions $I_{13}$, $I_{14}$, $I_{15}$ obtained at the best focus position, at the defocus position of 1 μm and at the defocus position of 2 μm when the pupil is covered by a filter with numerical aperture NAw of 0.57 and complex amplitude transmittance of –0.3 in a portion within the radius of 0.548 NAw from the center of pupil.

A sharp profile is obtained at the best focus position in the Super-FLEX method, but the center intensity drop with increase of defocus amount takes place suddenly at a certain defocus amount. However the increase effect of focal depth is approximately equal to those in the embodiments shown in FIGS. 16 and 20. In the Super-FLEX method, subpeaks (ringings) appear around the main image shown as the central intensity, as shown in optical intensity distribution $I_{13}$ in FIG. 21. The subpeaks cause no problem in projection of isolated contact hole pattern PA as shown in FIG. 14, but could cause a big problem in case of projection of plural contact hole patterns adjacent to each other, as described later.

Figure 22:
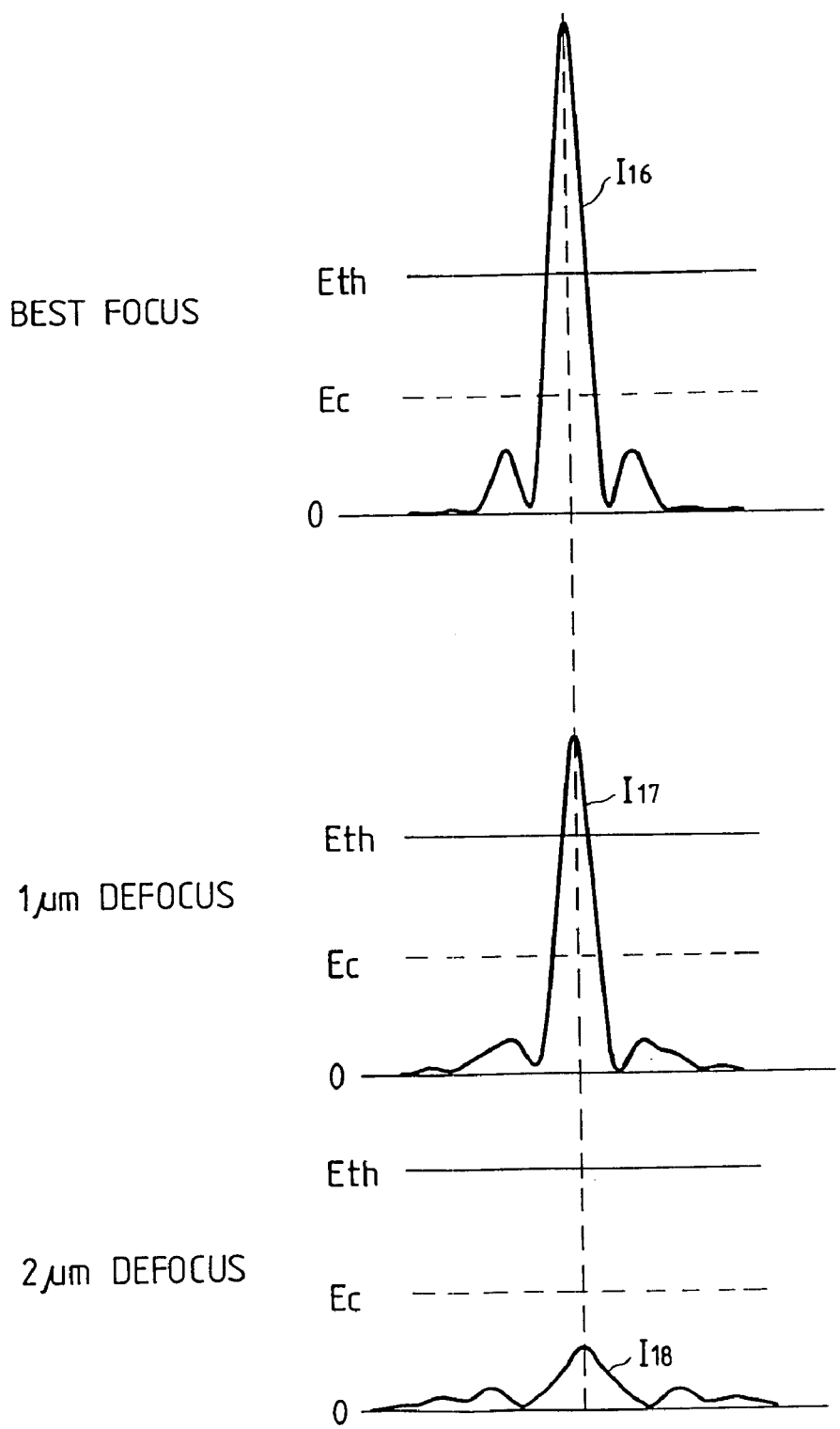
FIG. 22 is a drawing to show graphs of light image intensity distribution to show a simulation result of conventional Super-FLEX method (2) for a single hole pattern.

FIG. 22 shows a simulation result in case of a filter having a weaker effect than the pupil filter in the Super-FLEX method, which was the simulation model in FIG. 21, in order to prevent the ringing. In this case, the filter used has numerical aperture NAw of projection optical system of 0.57 and complex amplitude transmittance of –0.3 in a portion corresponding to radius 0.447 NAw in the central portion of pupil. As seen from intensity distributions $I_{16}$, $I_{17}$, $I_{18}$ at the best focus position, at the defocus position of 1 μm and at the defocus position of 2 μm, the ringing is certainly weakened as compared with the case of FIG. 22, but the increase effect of focal depth is lowered at the same time.

Figure 23:
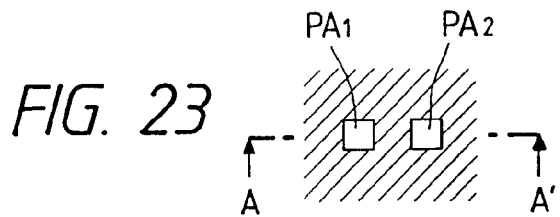
FIG. 23 is a plan view to show two hole patterns located close to each other.

FIGS. 24A to 24D show simulation results of image intensity distribution obtained in the various exposure methods when two adjacent contact hole patterns $PA_1$, $PA_2$ as shown in FIG. 23 are projected onto a wafer. A distance between the centers of patterns $PA_1$, $PA_2$ are designed such that their projected images on wafer are separated by 0.66 μm between the centers thereof.

Figure 24A:
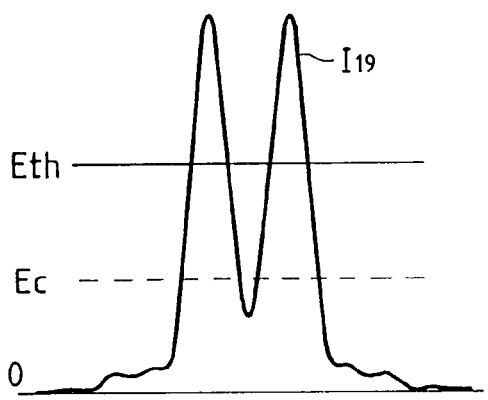
FIGS. 24A, 24B, 24C and 24D are graphs of light image intensity distribution respectively to show a simulation result of each of various exposure methods for two hole patterns located close to each other.
Figure 24B:
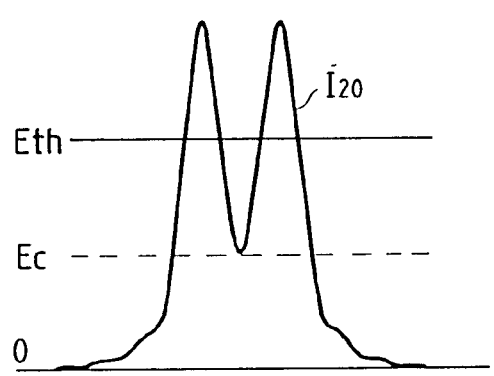
Figure 24C:
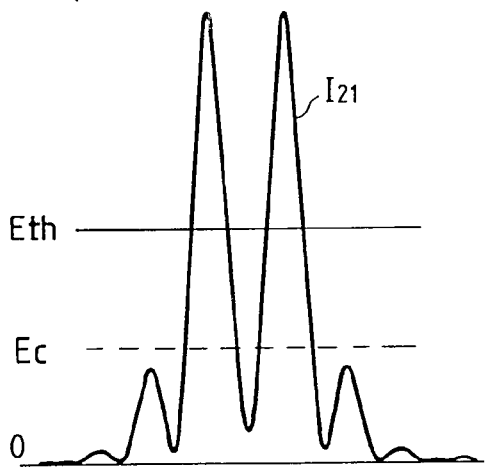
Figure 24D:
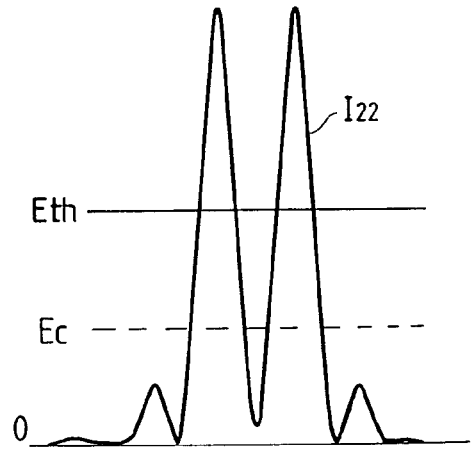

FIG. 24A shows an image intensity distribution obtained by an embodiment having the same simulation conditions as those in FIG. 20, FIG. 24B shows an image intensity distribution obtained by the conventional FLEX method, FIG. 24C shows an image intensity distribution obtained by the Super-FLEX method (1) under the same conditions as those in FIG. 21, and FIG. 24D shows an image intensity distribution obtained by the Super-FLEX method (2) under the same conditions as those in FIG. 28. The image intensity distributions all were obtained at the best focus position.

As seen from the simulation results in the images obtained in FIGS. 24A, 24C and 24D, an intensity between two hole images is lower than the film. reduction intensity Ec so that the (positive) resist fully remains between the two holes, whereby resist images of the two holes are well formed as separated. In contrast, in the FLEX method shown in FIG. 24B, an intensity between the two hole images is not sufficiently low so that the resist between the two holes reduces its thickness, resulting in failing to obtain good patterns. Namely, a slight difference in exposure amount could cause the images of two contact holes to be connected with each other. Although the SFINCS method in the embodiment and the conventional FLEX method showed the equivalent increase effect as to the depth of focus in projection of isolated contact hole pattern, the SFINCS method in the embodiment is superior to the FLEX method in respect of resolution (fidelity) of adjacent hole patterns.

In the simulations in FIGS. 24C and 24D, the distance between the centers of two hole patterns $PA_1$, $PA_2$ is determined in such a condition that a peak of ringing caused by one hole pattern is formed at the center peak caused by the other hole pattern. Thus, no ringing appears between the two hole pattern images. This means that a ringing appears if the distance between the centers of two hole patterns $PA_1$, $PA_2$ is different from the above condition (0.66 µm on wafer).

Figure 25A:
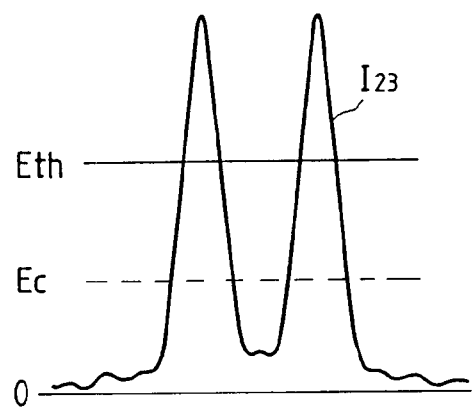
FIGS. 25A, 25B and 25C are graphs of light image intensity distribution respectively to show a simulation result of each of various exposure methods for two hole patterns located close to each other.
Figure 25B:
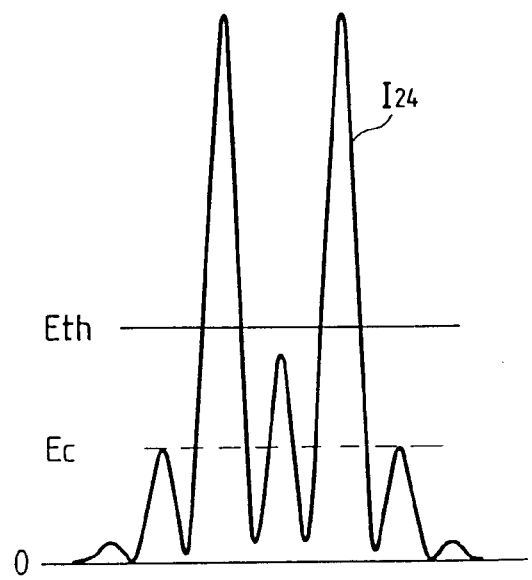
Figure 25C:
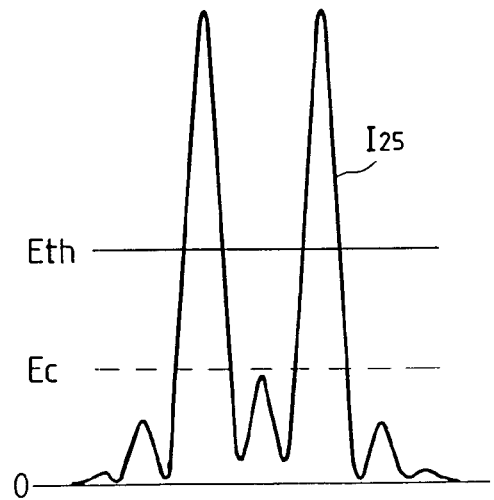

FIGS. 25A to 25C show simulation results of intensity distribution at the best focus position for two contact hole images juxtaposed at a distance of 0.96 µm (on wafer) apart from each other between the centers. FIG. 25A shows an optical intensity distribution $I_{23}$ of image by the SFINCS method under the conditions shown in. FIG. 20, in which a portion between two hole images is sufficiently dark, so that good a resist patterns may be formed. FIG. 25B shows an intensity distribution $I_{24}$ in the Super-FLEX method (1) under the conditions shown in FIG. 21, in which ringings caused by the two hole patterns are combined (added) with each other, so that a bright subpeak (over the film reduction intensity Ec) appears between the two hole images. The resist will be reduced in thickness in this portion. Thus, good resist images cannot be obtained by this method. In contrast, FIG. 25C shows an image intensity distribution $I_{22}$ obtained by the Super-FLEX method (2) under the conditions shown in FIG. 22 when two hole patterns separate at 0.96 µm from each other between the centers are projected. With the Super-FLEX method (2) having such relatively weak effect, lowered ringings appear, thus causing no film reduction. Then good resist images can be obtained. However, the sufficient increase effect of depth of focus cannot be attained under such conditions as compared with the embodiments of the present invention, as described with FIG. 22.

Figure 26:
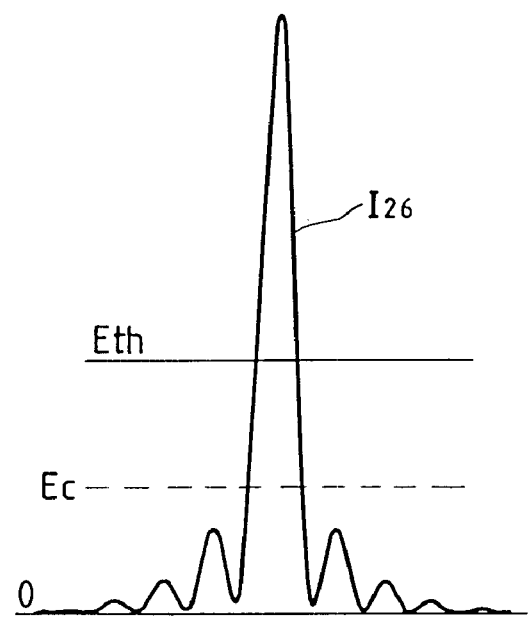
FIG. 26 is a graph to show an image intensity distribution for a single hole pattern obtained with a circular shield portion at the center of pupil.

FIG. 26 shows an optical intensity distribution $I_{26}$ of image of isolated hole pattern, which was obtained when only a circular shield plate having a, radius of 0.707 times the effective radius $r_2$ of pupil of projection optical system (NAw×0.707) is located on the pupil plane. In this case, ringings also appear on the periphery of main image, which make difficult applications to projection exposure of closely located contact hole patterns.

Figure 27:
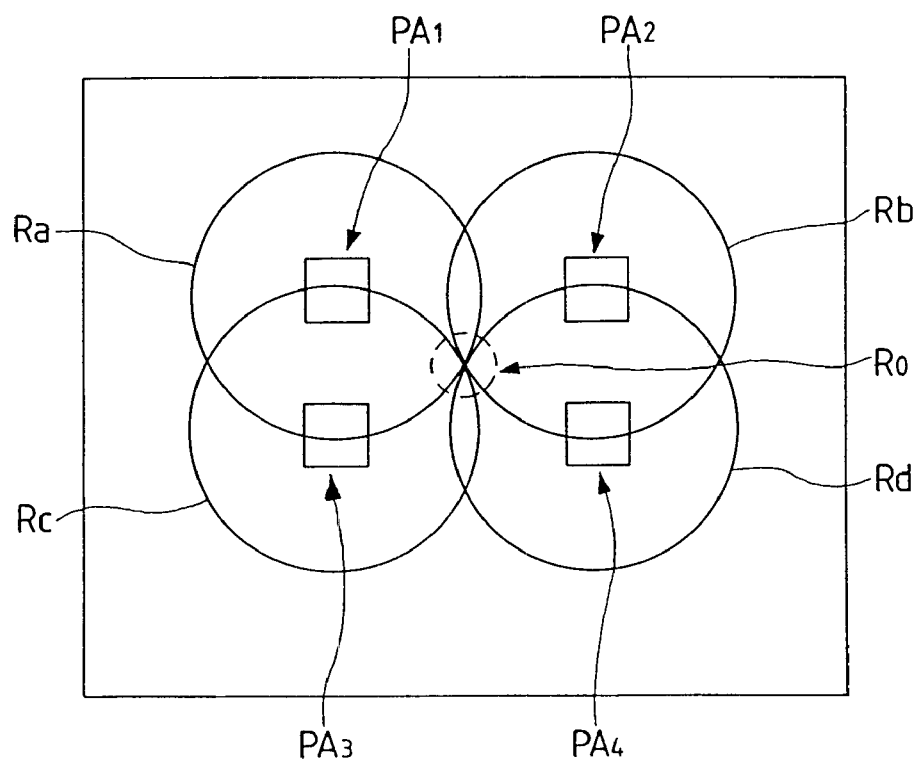
FIG. 27 is a drawing to show a relation between two-dimensionally distributed contact hole patterns and ringing.

FIG. 27 shows an example of two-dimensional, arrangement of contact hole patterns $PA_1$, $PA_2$, $PA_3$, $PA_4$ used in a memory cell portion in DRAM as an example of a plurality of closely located contact holes. If the conventional Super-FLEX method is employed for such hole pattern group, a ringing (subpeak) Ra, Rb, Rc, Rd appears around each hole. The four ringing peaks are superimposed in the overlapping region Ro among them. With such patterns and even by the Super-FLEX method (2) showing relatively moderate effect, which did not cause film reduction in case of only two hole patterns (in case of two overlapping ringing peaks), the height of subpeak is almost doubled as compared with that in FIG. 25C to exceed the film reduction intensity Ec, resulting in failing to form good pattern images. In other words, an image of originally absent hole on reticle (ghost image) will be formed at the position of region Ro on wafer.

In the SFINCS method of the present invention, the optical intensity distribution is below a half of film reduction intensity Ec in the intermediate portion between two hole patterns, as shown in FIG. 25A. Therefore, even if the added intensity in the region Ro shown in FIG. 27 is a double of that in the state of FIG. 25A, the resulting intensity will be lower than the film reduction intensity Ec.

In each embodiment of the present invention as described above, photoelectrically detecting means for photoelectrically detecting a part of beam passing through the projection optical system may be provided on the wafer stage WST in order to judge whether the direction of polarization is appropriate or not, or whether the polarization state of imaging beam through the PCM is good or not when the illumination light ILB to the reticle is polarized in a specific direction. Also, in case that a reticle with line and space pattern is used, the system can be arranged such that the PCM is retracted out of the projection optical system and that a part of illumination system is interchangeable to fit the SHRINC method. While using the PCM in projection exposure of contact hole pattern, the SHRINC method or the modification illumination system such as the annular illumination light source can be employed in addition. In that case, only the PCM may be arranged to recede when a reticle to be exposed for contact hole is interchanged into one for line-and-space.

The PCMs in the embodiments have circular or annular transmissive portions, but the shape of transmissive portions is not limited to those literally expressed. For example, the circular transmissive portion may be formed as a polygon including a rectangle and the annular transmissive portion may be modified to have a ring shape surrounding the polygon. Further, the PCM was composed of the central circular transmissive portion and one or two annular transmissive portions surrounding it in the each embodiment, but the annular transmissive portion may be divided into more than two sections. In that case, areas of the circular transmissive portion and n of annular transmissive portions are determined as to be almost equal to each other. That is, each area is set to equal $1/(n+1)$ times the effective aperture area of pupil.

Second Embodiment

Next described is the second embodiment of the present invention, in which the interference reducing member CCM is constructed to utilize the optical properties other than the polarization property. The polarization control element 6 in FIG. 4 is obviated in the second embodiment.

As described before with FIGS. 3A and 3B, the radius $r_1$ of circular transmissive portion FA around the center of pupil is set with respect to the effective maximum radius $r_2$ of pupil ep in the relation of $r_2^2=2r_1^2$. Actually,, the radius should be set several % larger than that. As apparent from this equation, an area $\pi r_1$ of circular transmissive portion FA is about a half of an area $\pi r_2^2$ of effective pupil aperture.

Now, light from the mercury lamp 1 in FIG. 4 is randomly polarized and its coherence length $\Delta Lc$ is very short. Supposing the illumination light is the i-line, the center wavelength $\lambda_0=365$ nm, and the wavelength width $\Delta\lambda=5$ nm, the coherence length $\Delta Lc$ is obtained as follows.

$$\Delta Lc = \lambda_0^2/\Delta\lambda \approx 26 \ \mu m$$

Figure 28A:
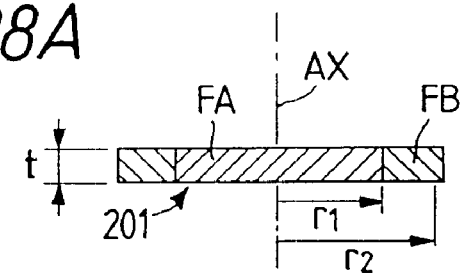
FIGS. 28A and 28B are a cross section and a plan view to show a first specific example of coherence reducing member CCM in the second embodiment of the present invention.
Figure 28B:
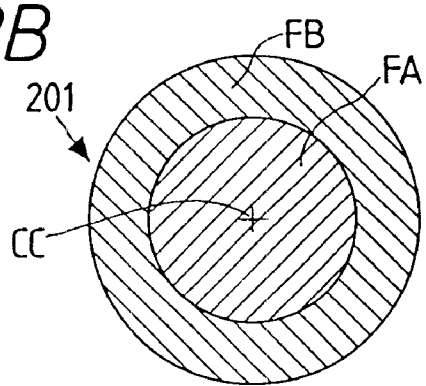

FIGS. 28A and 28B show an example of structure of interference reducing member CCM according to the present embodiment.

In FIGS. 28A and 28B, the CCM 201 is so arranged that a circular transmissive portion FA with radius $r_1$ from the center point CC is constituted of a plane-parallel glass or plane-parallel crystal element with index of refraction of $n_1$ and thickness t and that an annular peripheral transmissive portion FB of a plane-parallel glass or crystal element with index of refraction of $n_2$ and thickness t. If there is an optical path length difference exceeding the coherence length $\Delta Lc$ of imaging beam between imaging beam LFa passing through the transmissive portion FA and imaging beam LFb passing through the transmissive portion FB, the two beams LFa, LFb are temporally incoherent. Namely, the two glass materials (refractive indices $n_1$, $n_2$) and the thickness t may be well determined to satisfy the relation of $|(n_2-n_1)t| \geq \Delta Lc$.

Here assuming the transmissive portion FA is made of glass with index of refraction $n_1=1.50$, the transmissive portion FB is of glass with index of refraction $n_2=1.60$, and the illumination light is the i-line ($\alpha\lambda=5$ nm) of mercury lamp, the thickness t is not less than 260 μm from $|(1.60-1.50)t| \geq 26$ μm. There exists no upper limit of thickness t, and, therefore, the glass plate may have a thickness of several mm. However, if the illumination light from light source is extreme ultra-violet light (for example wavelength band of from 240 nm to 250 nm from xenqn-mercury lamp), a too thick thickness t is not advantageous, because normal optical glass increases absorption with increase in thickness.

In any event, after the imaging beam passes through the transmissive portions FA, FB, emergent beams (LFa, LFb) become incoherent with each other. These two mutually incoherent beams from the central portion and from the peripheral portion reach the wafer, each of which is amplitude-synthesized only with itself, and separately form images (intensity distributions) $Pr_1'$, $Pr_2'$, which increase the depth of focus of a synthesized image (synthetic intensity distribution) therefrom.

Figure 29A:
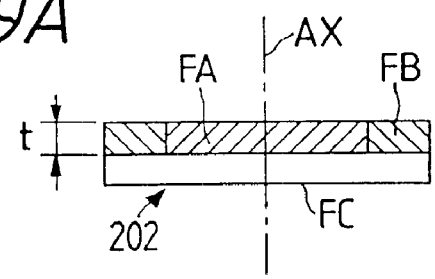
FIGS. 29A and 29B are a cross section and a plan view to show a second specific example of CCM.
Figure 29B:
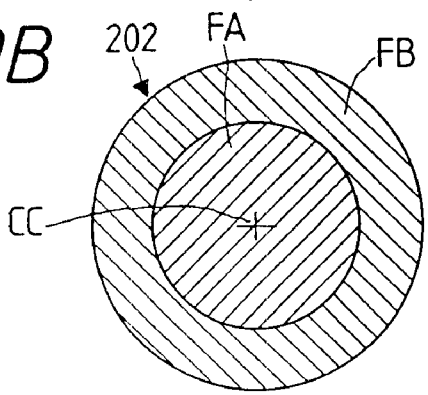

In FIGS. 29A and 29B, CCM 202 further has a transparent plate FC with uniform thickness on the entire surface of exit plane of the above CCM 201 (otherwise on the entrance side). The transparent plate FC is made of quartz glass or fluorite transmitting the extreme ultra-violet light. The transparent plate FC may be bonded to the optical glass of transmissive portions FA, FB or may be located at a certain gap therebetween. The CCM 202 can make the beam through the transmissive portion FA and the transparent plate FC temporally incoherent with the beam through the transmissive portion FB and the transparent plate FC.

FIGS. 30 to 35 ate cross sections to show some modifications of CCM working as the path difference control member.

Figure 30:
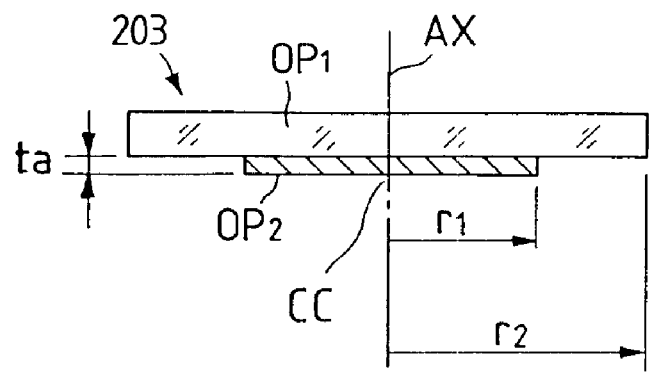
FIG. 30 is a cross section to show a third specific example of CCM.

CCM 203 shown in FIG. 30 is constructed such that a glass or resin thin plate $OP_2$ with thin thickness ta is mounted or bonded to a transparent circular base (glass, quartz, etc.) with even thickness and radius slightly larger than the effective maximum radius $r_2$ of pupil ep. The thin plate $OP_2$ forms a circular transmissive portion FA with radius $r_1$ and index of refraction $n_1$. Then there is a path difference $(n_1-1)ta$ between a beam passing through both the thin plate $OP_2$ and the base $OP_1$ and a beam passing only through the base $OP_1$. Accordingly, from the relation with the coherence length ΔLc of illumination beam, the thickness ta of thin plate $OP_2$ should be determined to satisfy the condition of $(n_1-1)ta \geq \Delta Lc$.

The material for thin plate $OP_2$ may be one of glass materials, crystals, or resins having high transmittance for ultra-violet light. For example, it may be CYTOP (trade name) manufactured by Asahi Glass Co., Ltd. The CCM 203 may be produced such that after the thin plate $OP_2$ is bonded onto the base $OP_1$, the surface, of thin plate $OP_2$ is polished to obtain desired planeness and uniformity of total thickness of member. Alternatively, the thin plate $OP_2$ may be formed as a film deposited on the base $OP_1$ by the sputter method, the vapor deposition method, or the CVD method. Further, in case of the thin plate $OP_2$ being made, of a resin, the resin may be applied onto the base in a liquid state by the spin coat method.

Figure 31:
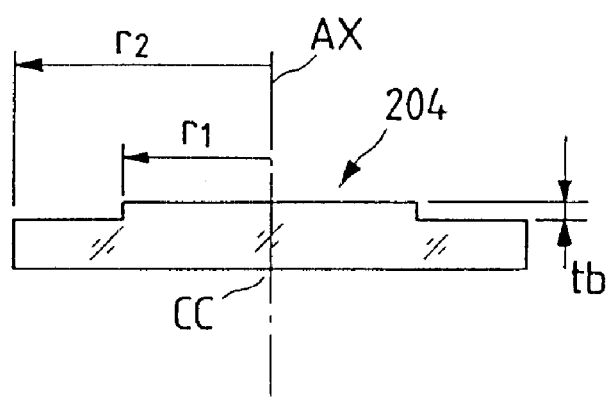
FIG. 31 is a cross section to show a fourth specific example of CCM.

CCM 204 shown in FIG. 31 has a circular transmissive portion FA with radius $r_1$ formed in the central portion by removing by etching the peripheral portion of at least one surface of circular transparent parallel base of quartz or the like. With index of refraction $n_2$ for the base, a step tb is determined to satisfy the relation of $(n_2-1)tb \geq \Delta Lc$. Since the index of refraction of fused quartz is about 1.5 in general in the ultra-violet region, when the coherence length ΔLc of i-line of mercury lamp is 26 μm, the step, tb is not less than 52 μm. In case of the base being made of fluorite, which has an index of refraction of about 1.46, the step tb is not less than 57 μm.

Figure 32:
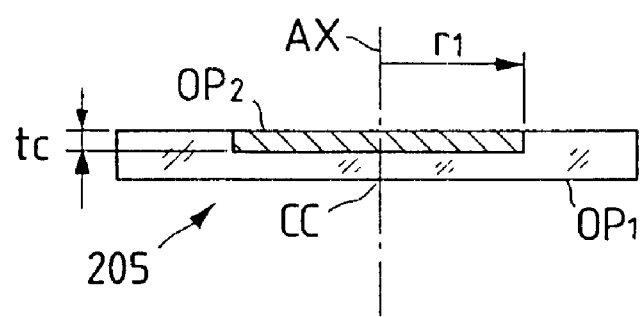
FIG. 32 is a cross section to show a fifth specific example of CCM.

CCM 205 shown in FIG. 32 has the structure complementary to that of above CACM 204, in which a circular recess with radius $r_1$ and depth tc is formed in the central portion of circular transparent parallel base $OP_1$ of quartz or the like and a thin plate $OP_2$ made of glass or resin is mounted or bonded into the circular recess. Letting $n_1$ be an index of refraction of the thin plate $OP_2$ and $n_2$ be an index of refraction of the base $OP_1$, the depth tc is determined to satisfy the condition of $(n_1-n_2)tc \geq \Delta Lc$. There is no need to make the surface of thin plate $OP_2$ coincident with the surface of base $OP_1$.

Figure 33:
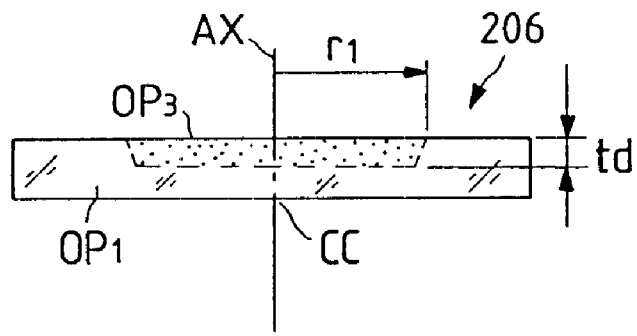
FIG. 33 is a cross section to show a sixth specific example of CCM.

CCM 206 shown in FIG. 33 is constructed such that a circular transparent base $OP_1$ includes a region $OP_3$ having a different index of refraction therefrom formed in the central circular region with radius $r_1$ by ion implantation or by thermal diffusion method of impurity ion. Letting $n_2$ be an index of refraction of the base $OP_1$, $n_3$ be an index of refraction of the region $OP_3$, and td be a thickness of the region $OP_3$, a change amount in index of refraction $(n_3-n_2)$ or the thickness td is controlled to satisfy the condition of $|(n_3-n_2)td| \geq \Delta Lc$.

Figure 34:
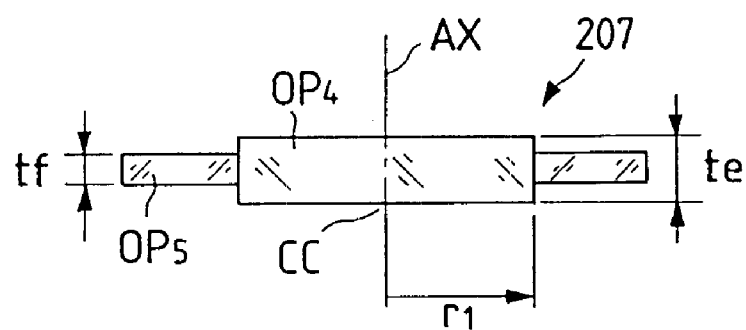
FIG. 34 is a cross section to show a seventh specific example of CCM.

CCM 207 shown in FIG. 34 is constructed such that a circular transparent base $OP_4$ and an annular transparent base $OP_5$ same in index of refraction but different in thickness are separately produced and then combined with each other, which is similar to the CCM 204. The circular transparent base $OP_4$ has a radius $r_1$, constituting the transmissive portion FA. Letting te be a thickness of circular base $OP_4$, tf be a thickness of annular base $OP_5$, and $n_2$ be an index of refraction of the two bases, the thicknesses are determined to satisfy the condition of $|(te-tf)(n_2-1)| \geq \Delta Lc$. Further, if the refractive index ne of circular base $OP_4$ is made different from the refractive index nf of annular base $OP_5$, the thicknesses may be determined to satisfy the relation of $|(ne-1)te-(nf-1)tf| \geq \Delta Lc$. Accordingly, if the two bases $OP_4$, $OP_5$ have respective indices of refraction ne, nf different from each other, the thicknesses te, tf of the two bases $OP_4$, $OP_5$ can be made equal to each other. In that case, the CCM 207 becomes equal to the structure of the CCM 201 shown in FIGS. 28A and 28B. Further, in case of the structure of CCM 207, when te, ne, tf, nf are determined approximately to satisfy the relation of te(1−1/ne)=tf(1−1/nf), influence on optical aberration of projection system can be minimized.

Figure 35:
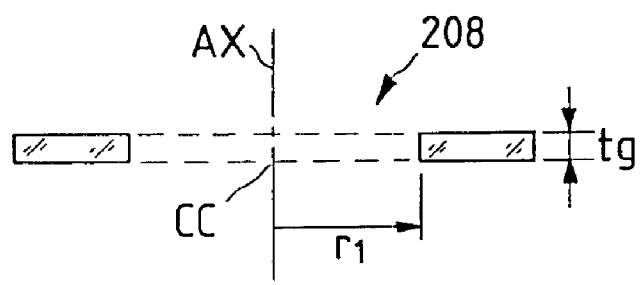
FIG. 35 is a cross section to show an eighth specific example of CCM.

CCM 208 shown in FIG. 35 is an annular thin plate with thickness tg made for example of quartz or the like and having a circular aperture at center. The thickness tg may be determined under the same condition as that for the thickness ta of thin plate $OP_2$ in CCM 203.

Figure 36A:
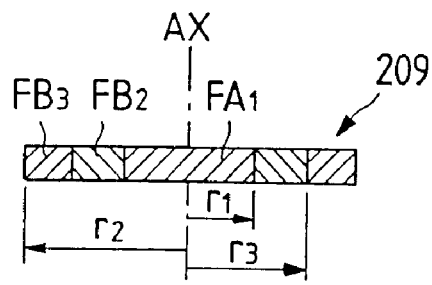
FIGS. 36A and 36B are a cross section and a plan view to show a ninth specific example of CCM.
Figure 36B:
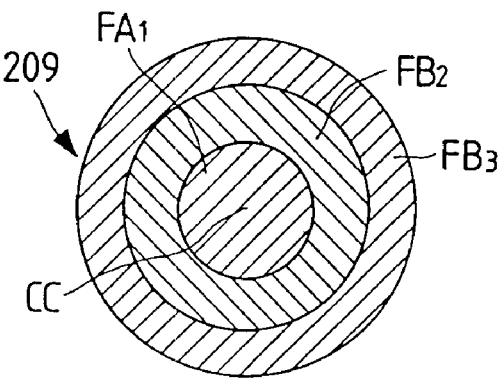

CCM 209 shown in FIGS. 36A and 36B has three segmental regions of concentric transmissive portions $FA_1$, $FB_2$, $FB_3$ (with radius $r_1$, $r_3$ or $r_2$), each of which provides an optical path length difference more than the temporal coherence length ΔLc for an imaging beam passing through the transmissive portion. As its specific structure, either one of CCMs 201 to 208 as described above can be employed according to the circumstances. It is necessary that after passing through the three transmissive portions the imaging beams are arranged not to interfere with each other. The coherence does not have to be perfectly zero. Sufficiently reduced coherence suffices.

A modification of the CCM 209 is such that a transparent thin film (phase shifter) is provided on either one of the central transmissive portion $FA_1$ and the outermost transmissive portion $FB_3$, by which a phase difference of λ/2 is given between a beam through the transmissive portion $FA_1$ and a beam through the transmissive portion $FB_3$. Also in this case, a beam through each of two transmissive portions $FA_1$, $FB_3$ is given a path length difference more than the coherence length $\Delta Lc$ with respect to the beam through the intermediate transmissive portion $FB_2$. Accordingly, if the transmissive portions $FA_1$, $FB_3$ are constructed as same in thickness and material, the transmitting beams therethrough will interfere with each other. However, since the two beams are opposite in phase to each other, they serve as a kind of double focus filter, obtaining the increase effect in depth of focus.

Figure 37:
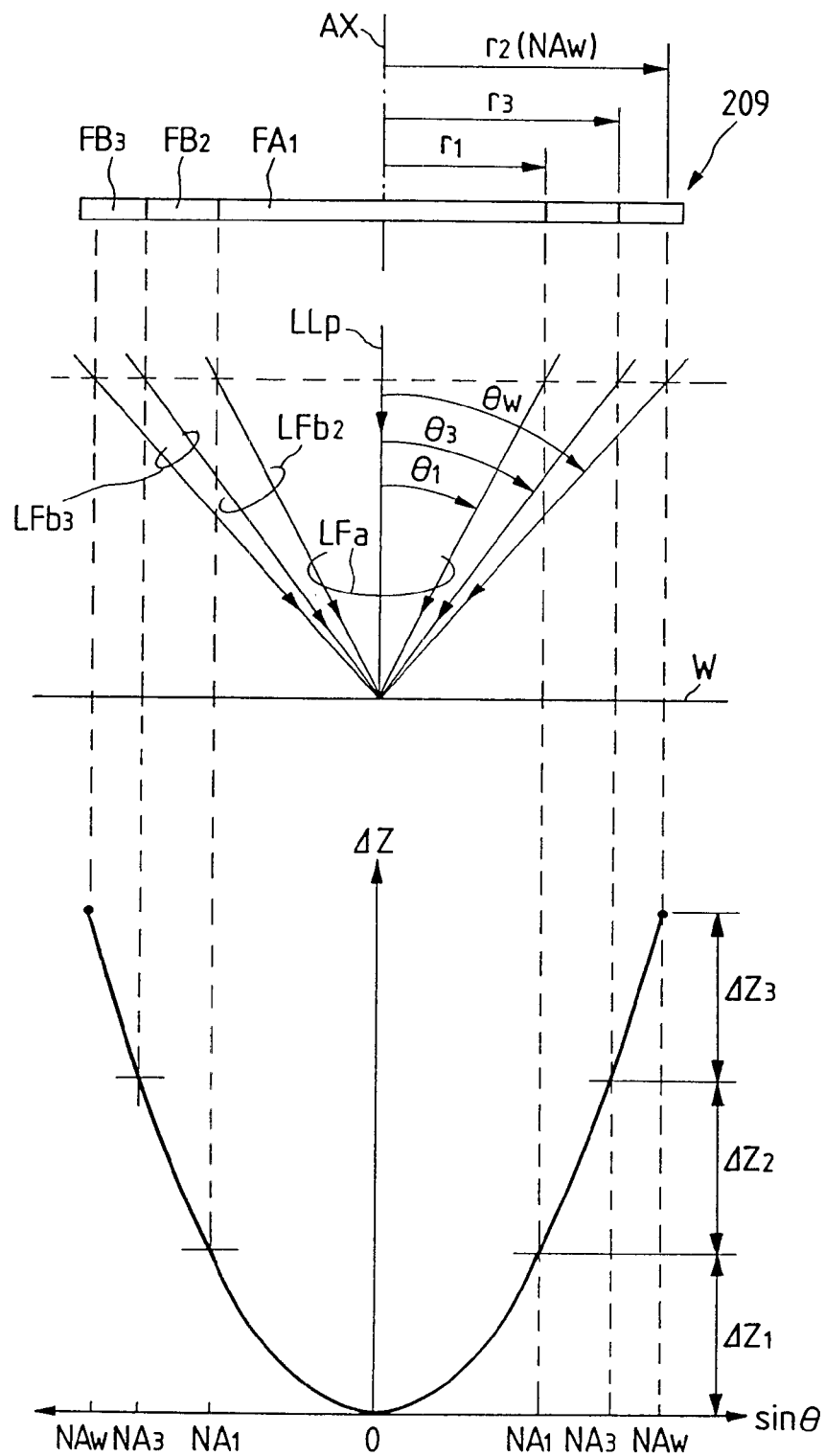
FIG. 37 is a drawing to show a relation between imaging beams and path difference ΔZ in the beams in defocus in the ninth specific example.

FIG. 37 shows a state of emergent imaging beams from the CCM 209 onto wafer W and a graph of optical path length difference $\Delta Z$ caused therein (as shown by the same method as in FIGS. 3A and 3B). In case of the CCM 209, the imaging beam reaching the wafer (a point image) includes three segmental beams of beam LFa including the principal ray LLp and passing through the circular transmissive portion $FA_1$ and beams $LFb_2$, $LFb_3$ passing through the annular transmissive portions $FB_2$, $FB_3$, respectively. In the arrangement without provision of phase shifter as described above, these three beams LFa, $LFb_2$, $LFb_3$ are very low in coherence with each other.

An incident angle $\theta w$ of a ray passing through a position of the effective maximum radius (radius $r_2$) of pupil ep of projection optical system corresponds to the numerical aperture NAw on the wafer side of projection optical system. The beam LFa has a distribution in an angular range of from the normal-incident ray (principal ray) LLp to an incident angle $\theta_1$, a beam $LFb_2$ a distribution in an angular range of from the incident angle $\theta_1$ to angle $\theta_3$, and the beam $LFb_3$ a distribution, in an angular range of from the incident angle $\theta_3$ to the angle $\theta w$. If the rear lens group GB in projection optical system PL has a focal length f, the radii $r_1$, $r_3$ of the transmissive portions $FA_1$, $FB_2$ on the pupil ep are in the relations of $r_1 = f \sin \theta_1$ and $r_3 = f \sin \theta_3$.

With a defocus amount $\Delta F$, letting $\Delta Z_1$ be a maximum path length difference caused in beam LFa, $\Delta Z_2$ be a maximum path length difference caused in beam $LFb_2$ and $\Delta Z_3$ be a maximum path length difference caused in beam $LFb_3$, the differences can be expressed as follows.

$$\Delta Z_1 = (\Delta F \cdot \sin^2 \theta_1)/2 = (\Delta F \cdot NA_1^2)/2$$

$$\Delta Z_2 = (\Delta F(\sin^2 \theta_3 - \sin^2 \theta_1))/2 = (\Delta F(NA_3^2 - NA_1^2))/2$$

$$\Delta Z_3 = (\Delta F(\sin^2 \theta w - \sin^2 \theta_3))/2 = (\Delta F(NAw^2 - NA_3^2))/2$$

Then the radii $r_1$, $r_3$ are so determined as to satisfy the following relations of incident angles $\theta_1$, $\theta_3$.

$$\sin^2 \theta_1 = NA_1^2 = \frac{1}{3}(NAw^2)$$

$$\sin^2 \theta_3 = NA_3^2 = \frac{2}{3}(NAw^2)$$

The path length differences of three beams LFa, $LFb_2$, $LFb_3$ become equal to each other as follows.

$$\Delta Z_1 = \Delta Z_2 = \Delta Z_3 = (\Delta F \cdot NAw^2/3)/2$$

This condition means nothing but equalizing three of area $\pi r_1^2$ a of transmissive portion $FA_1$, area $\pi(r_3^2 - r_1^2)$ of transmissive portion $FB_2$ and effective area $\pi(r_2^2 - r_3^2)$ of transmissive portion $FB_3$.

As described before, in the conventionally ordinary projection exposure, the optical path length difference $\Delta Z$ with defocus amount $\Delta F$ was expressed as $\Delta Z = (\Delta F \cdot NAw^2)/2$. In the present embodiment, in contrast, if the permissible range of path length difference is $\lambda/4$ than a resultant image is accepted as a good image up to a defocus amount $3\Delta F$, which is three times larger than that in the conventional method. This means that the depth of focus is tripled as compared with that in the conventional method.

The CCM 209 may be divided into m (natural numbers) regions not less than four, which are a circular transmissive portion and annular transmissive portions providing m segmental beams incoherent with each other. In this case, if areas (radii) of central circular transmissive portion and (m−1) annular transmissive portions are determined to be equal to an area obtained by dividing by m the total area calculated with the effective maximum radius of pupil ep (if an aperture stop limits the size of beam, a radius of aperture in the stop), the depth of focus increases m times greater than that in the conventional case.

Suppose $\theta_{out}$ is an incident angle of ray passing through a point at the maximum radius in a beam through a transmissive portion and $\theta_{in}$ ($\theta_{in} = 0$ for principal ray LLp) is an incident angle of ray passing through a position at the minimum radius. Then, when the relation, $\sin^2 \theta_{out} - \sin^2 \theta_{in} = NAw^2/m$, is satisfied each path length difference $\Delta Z$ due to defocus in each segmental beam becomes $1/m$ times that in the conventional case, thus obtaining the maximum depth of focus.

Figure 38A:
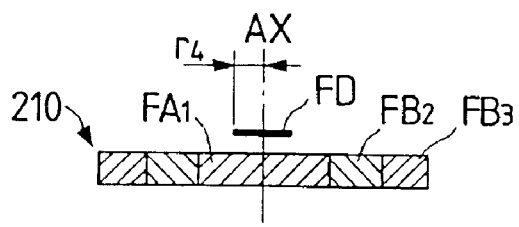
FIGS. 38A and 38B are a cross section and a plan view to show a tenth specific example of CCM.
Figure 38B:
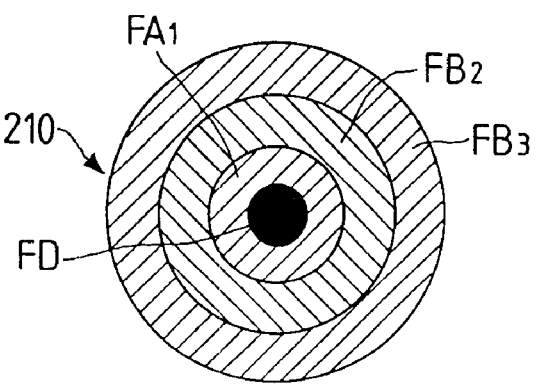

CCM 210 shown in FIGS. 38A and 38B has a circular shield portion FD with radius $r_4$, which is provided next to or fit to the central portion of the CCM 209 in the same manner as the shield portion $FD_1$ shown in EMBODIMENT 1-11 in FIG. 7. It is considered in this case that the imaging beam incident into the pupil ep is divided into four beams by the shield portion FD and the annular transmissive portions $FA_1$, $FB_2$, $FB_3$ and that among the four divided beams three types of beams other than that impinging on the shield portion FD reach the wafer.

Figure 39:
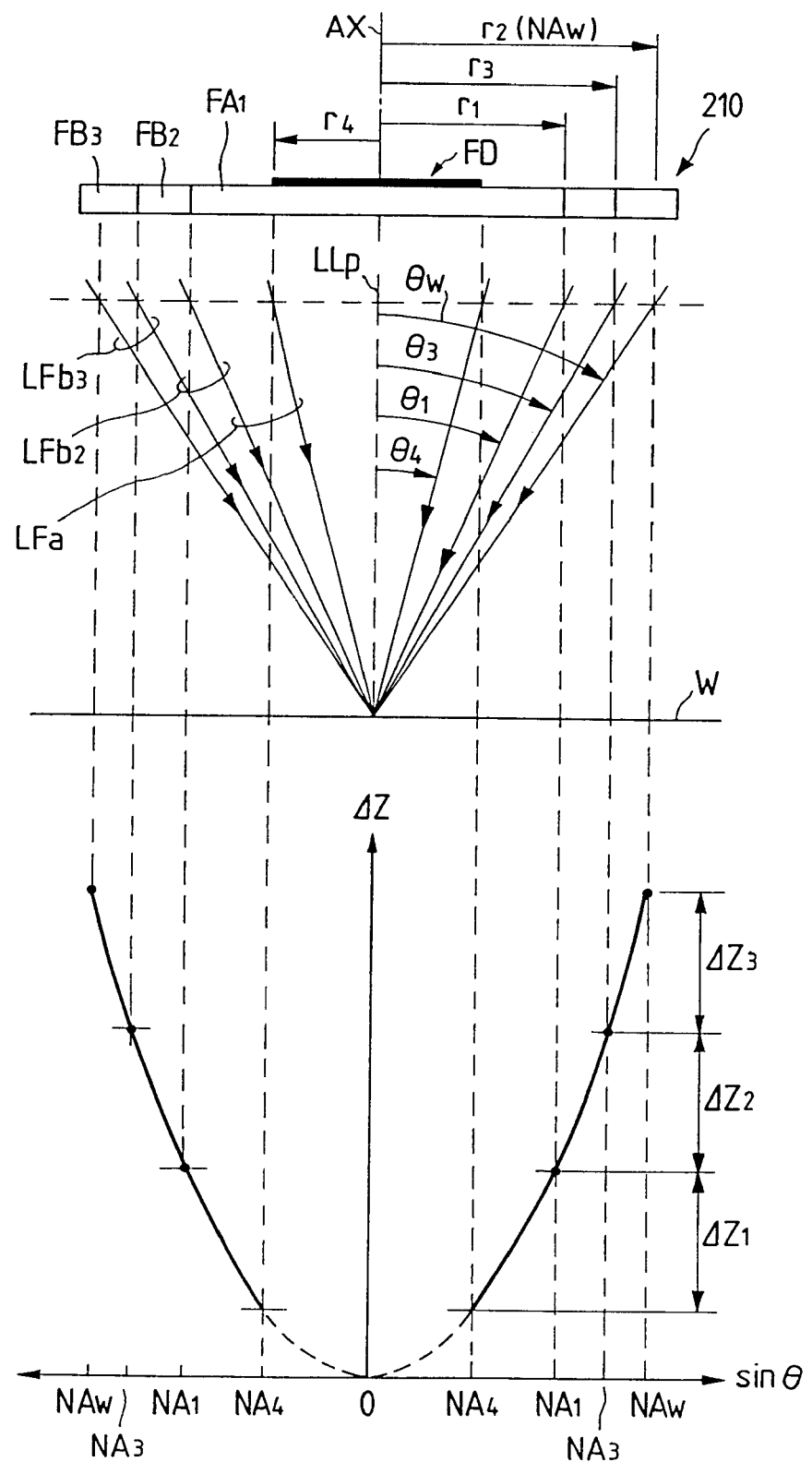
FIG. 39 is a drawing to show a relations among the CCM of the tenth specific example, imaging beams, and path difference ΔZ in the beams in defocus.

FIG. 39 shows a state of emergent imaging beams from the CCM 210 reaching the wafer W and a graph of path length difference $\Delta Z$ caused therein. The radii of shield portion FD and annular transmissive portions $FA_1$, $FB_2$, $FB_3$ are determined to satisfy the relation of $r_4 < r_1 < r_3 < r_2$, as shown. Maximum incident angles of beams LFa, $LFb_2$, $LFb_3$ through the respective transmissive portions are $\theta_1$, $\theta_3$ and $\theta w$, and a minimum incident angle of beam LFa is $\theta_4$.

If the path, length differences $\Delta Z_1$, $\Delta Z_2$, $\Delta Z_3$ in beams LFa, $LFb_2$, $LFb_3$ in defocus are determined to satisfy the condition of $\Delta Z_1 = \Delta Z_2 = \Delta Z_3$, that is, if the radii $r_4$, $r_1$, $r_3$ are determined to equalize the areas of transmissive portions $FA_1$, $FB_2$, $FB_3$, the increase effect in depth of focus is maximized by the beam splitting.

The path length differences $\Delta Z_1$, $\Delta Z_2$, $\Delta Z_3$ with defocus amount $\Delta F$ change depending upon the area of circular shield portion FD or radius $r_4$. Then, under the precondition that the areas of three transmissive portions $FA_1$, $FB_2$, $FB_3$ are set to equalize the path length differences $\Delta Z_1$, $\Delta Z_2$, $\Delta Z_3$ as described above, the following relation holds:

$$\Delta Z_1 = \Delta Z_2 = \Delta Z_3 = (NAw^2 - k^2 \cdot NAw^2)/3$$

where k is a ratio $r_4/r_2$ between the radius $r_4$ of circular shield portion FD and the effective radius $r_2$ of pupil ep. In this equation $k^2 \cdot NAw^2$ corresponds to the area of shield portion FD, which is nothing but $NA_4^2 = \sin^2 \theta_4$. Accordingly, by provision of shield portion BFD with certain area (radius $r_4$), values of path length differences $\Delta Z_1$, $\Delta Z_2$, $\Delta Z_3$ can be made smaller than those in case of the CCM 209, further increasing the depth of focus.

Figure 40:
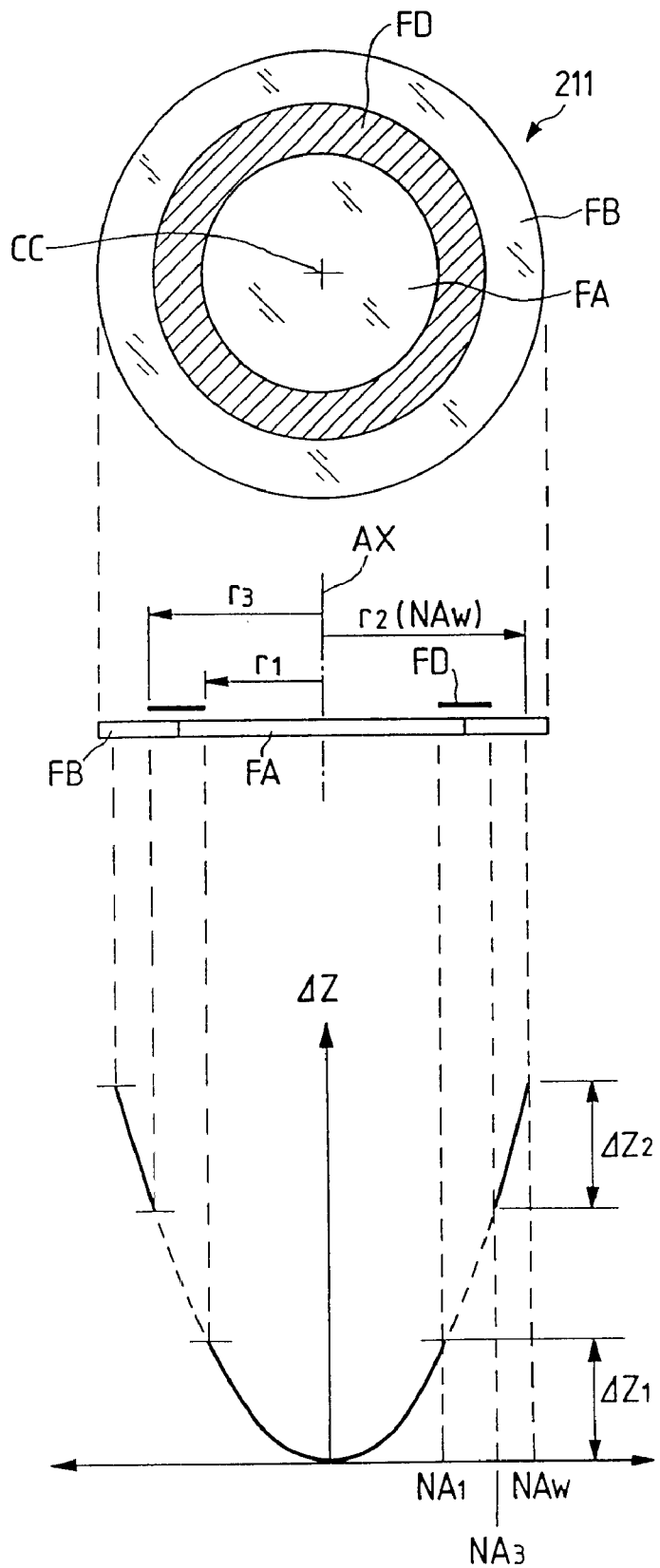
FIG. 40 is a drawing to show a relation between an eleventh specific example of CCM and path difference ΔZ in each beam in defocus.

As a modification of CCM 210, an annular shield portion as shown in FIG. 40 will do to increase the depth of focus depending upon its area. FIG. 40 shows CCM 211 as an example of such arrangement by a plan view and a cross section thereof, and a graph of path length difference $\Delta Z$.

The CCM 211 has an annular shield portion FD with inner radius $r_1$ and outer radius $r_3$. There area circular transmissive portion FA with radius $r_1$ inside the shield portion FD and an annular transmissive portion FB with inner radius $r_3$ outside the shield portion FD. Each beam through transmissive portion FA, FB is given a path difference not less than the coherence length $\Delta Lc$.

Also in this case, if the radii $r_1$, $r_3$ of transmissive portions FA, FB or shield portion. FD is determined relative to the effective radius $r_2$ of pupil such that the path length difference $\Delta Z_1$ in defocus of beam through the transmissive portion FA is made almost equal to the path length difference $\Delta Z_2$ in defocus of beam through the transmissive portion FB, the increase effect in depth of focus is maximized.

In the above embodiments, the size and structure of CCM are determined under the precondition that an imaging beam from contact hole pattern on reticle is nearly uniformly distributed on the pupil ep of projection optical system and is distributed up to the effective maximum radius $r_2$. Whether a case satisfies such a precondition can be mostly determined by the reticle-side numerical aperture NAr of projection optical system PL, wavelength $\lambda$ of illumination light ILB, and the size of contact hole pattern Pr. Therefore, it is practical as exposure apparatus to insert the CCM into the imaging beam when the size of contact hole pattern Pr is lower than a certain value.

In the present embodiment each CCM as described above is arranged to give each of beams divided at pupil ep a path length difference not less than the temporal coherence length $\Delta Lc$. The coherency could be lowered by another method. For example, if an exposure apparatus is provided with a projection optical system composed of reflection mirrors or a combination of reflection mirrors and refracting elements (lenses), the projection optical system itself has less chromatic aberration. Such an exposure apparatus sometimes uses as the illumination light, light with broad wavelength width or a plurality of bright-line spectral components close to each other (for example, g-line and h-line of mercury lamp).

Figure 41:
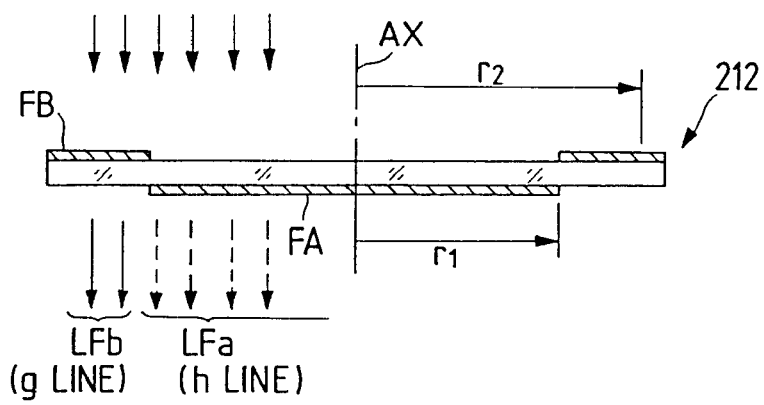
FIG. 41 is a cross section to show a twelfth specific example of CCM.

CCM 212 shown in FIG. 41 has the structure suitable for such an apparatus, in which band-pass filters having different wavelength ranges of transmitting beams are formed on a central, circular transmissive portion FA with radius $r_1$ and on a peripheral, annular transmissive portion FB, respectively. The band-pass filters may be formed for example as multi-layer dielectric thin films, which are deposited on a transparent circular base. A dielectric thin film of central transmissive portion FA is vapor-deposited on one surface of the base, while another dielectric thin film of annular transmissive portion PB (inner radius $r_1$) is on the other surface of base. The transmissive portion FA transmits only h-line of wavelength 405 nm while the transmissive portion FB only g-line of wavelength 436 nm for example. Since the beam passing through the pupil ep is divided into two beams LFa, LFb respectively passing through the central portion and through the peripheral portion, the radius $r_1$ of transmissive portion FA is set to satisfy the relation of $r_2^2 = 2r_1^2$ for the effective radius $r_2$ of pupil ep.

When the transmitting light LFa through the circular transmissive portion FA and the transmitting light LFb through the annular transmissive portion FB have different wavelength ranges separated by the band-pass filters, as described above, the two beams LFa, LFb become incoherent with each other, increasing the depth of focus. The band-pass filters may be formed of absorptive colored glass.

Figure 42:
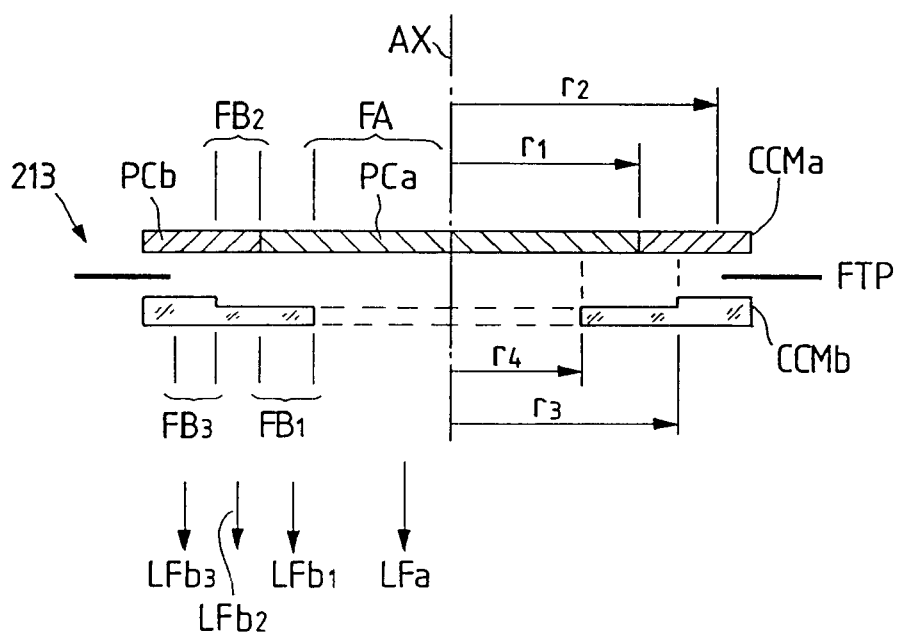
FIG. 42 is a cross section to show a thirteenth specific example of CCM.

As another method, it may be contemplated that the beam distributed on the pupil is divided by polarization to nullify coherency. This method is described referring to FIG. 42.

CCM 213 is a combination of two transparent circular bases CCMa, CCMb. The base CCMa includes a circular transmmissive portion PCa with radius $r_1$ and an annular transmissiive portion PCb with inner radius $r_1$ and outer radius $r_2$ (effective pupil radius). Both or either one of the transmissive portions PCa, PCb are made of either a polarizing plate, a quarter-wave plate or a half-wave plate for making polarization states of beams therethrough incoherent with each other. On the, other hand, the base CCMb is formed as a ring quartz plate having a circular aperture with radius $r_4$, in which a first annular transmissive portion is formed in first thickness with inner radius $r_4$ and outer radius $r_3$ and a second annular transmissive portion in second thickness with inner radius $r_3$ and outer radius not less than $r_2$.

The radii $r_1$ to $r_4$ are determined to satisfy the conditions of $r_4 < r_1 < r_3 < r_2$ and $r_4^2 = (r_1^2 - r_4^2) = (r_3^2 - r_1^2) = (r_2^2 - r_3^2)$. The two bases CCMa, CCMb may be arranged on either side of Fourier transform plane FTP in a close arrangement to each other or in a bonded state. As so arranged, a beam LFa passing through the circular transmissive portion FA with radius $r_4$ is incoherent with a beam $LFb_1$ passing through the annular transmissive portion $FB_1$ with radius between $r_4$ and $r_1$, though they have the same polarization state, because the path length difference is not less than the coherence length $\Delta Lc$. Also, a beam $LFb_2$ passing through the annular transmissive portion $FB_2$ with radius between $r_1$ and $r_3$ is incoherent with the beams $LFb_1$, LFa, be cause they have different polarization states. Further, a beam $LFb_3$ passing through the annular transmissive portion $FB_3$ with radius between $r_3$ and $r_2$ is incoherent with the beam $LFb_2$, because the path length difference is not less than the coherence length $\Delta Lc$, and incoherent with the beam $LFb_3$ or with the beams $LFb_1$, LFa, because they have different polarization states.

Consequently, the four segmental beams LFa, $LFb_1$, $LFb_2$, $LFb_3$ are incoherent with each other, so that the theoretical depth of focus becomes four times greater than that in the conventional methods.

Figure 43:
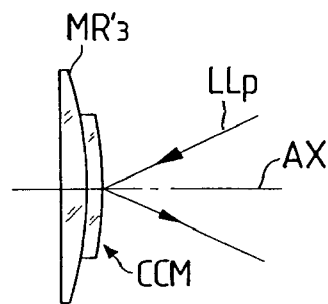
FIG. 43 is a drawing to show a state in which the second embodiment of CCM is applied to a mirror projection type aligner.

The same effect as in the first embodiment as described before can be enjoyed by arranging the CCM in the second embodiment in place of the PCM set in the TTL alignment system shown in FIGS. 11A and 11B. The CCM in the present embodiment can be applied to the mirror-projection-type aligner in FIG. 12. Specifically, the CCM can replace the PCM in FIG. 13. Alternatively, as shown in FIG. 43, a fine step having a predetermined area can be provided on the surface of concave mirror $MR_3'$ serving as the Fourier transform plane so that the upper surface and the lower surface of the step gives the path length difference not less than the coherence length $\Delta Lc$ for reflected beam. In this case, the step can be formed integrally with the mirror $MR_3'$. In either case, the step portion corresponds to the CCM. A transmissive object such as a thin film can also be provided instead of the step portion formed on the surface of concave mirror $MR_3'$ in FIG. 43. In that case, the thickness d of transmissive object is determined such that an optical path length difference $2(n-1)d$, caused in a forward and backward passage of beam in the transmissive object with index of refraction n, is greater than the coherence length $\Delta Lc$.

In the second embodiment, the same simulations were carried out as the simulations described with FIGS. 14 to 27, comparing with the conventionally ordinary exposure method, the FLEX method, and the Super-FLEX method. The simulation results were almost the same as those in the first embodiment. Therefore, the detailed description is omitted herein.

The path length difference, between the imaging beams split by the CCM as described in the second embodiment is greater than the temporal coherence length ΔLc of illumination light ILB and far larger than the path length difference given in the conventional Super-FLEX method (a half wave to several waves). Further, in the Super-FLEX method, all imaging beams passing through a filter, which is disposed on the pupil plane of projection optical system and has a complex amplitude transmittance, interfere with each other (are amplitude-synthesized) on the wafer. Accordingly, the CCM in the present embodiment is theoretically completely different from the Super-FLEX method.

The CCM of the present embodiment functions only for the purpose of dividing the imaging beam passing through the pupil plane (almost uniformly distributed in case of contact hole pattern) into several beams in the radial direction in order to lower the coherence between the segmental beams. It is thus noted that each CCM has no effect to shift the best focus position (position of focus) along the optical axis. AX of projection optical system for plural images ($Pr_1'$, $Pr_2'$, etc.) formed independent of each other by the segmental beams, that is, no effect to provide a certain kind of spherical aberration.

In the present embodiment, when the pupil plane ep of projection optical system is divided into m regions of circular region or annular regions, the areas of divided regions do not have to be equal to each other. For example, in case that the optical path length difference is not greater than the temporal coherence length ΔLc between two beams passing through a pair of circular and annular regions or between two beams passing through a pair of two annular regions in the use of phase shifter or the like, and that the path length difference is a half of wave, the area had better difference between the above pair of regions. It is because if the two beams having the path length, difference of half wave are almost equal in quantity of light to each other, the beams are canceled with each other at the imaging position whereby the intensity thereof becomes zero. Instead of changing the area between the regions, the transmittance of one region may be decreased. Of course, the area and the transmittance both may be changed. Also, if the CCM is used as a transmissive member, an anti-reflection coat may be preferably provided on the surface thereof.

Third Embodiment

Next described is the third embodiment of the present invention, in which the coherence reducing portion is constituted by space filters. In the third embodiment, a plurality of space filters each having a diameter covering the maximum diameter of pupil ep are alternately set on the Fourier transform plane FTP of projection optical system PL. The polarization control element 6 in FIG. 4 is also obviated in the present embodiment.

Figure 44:
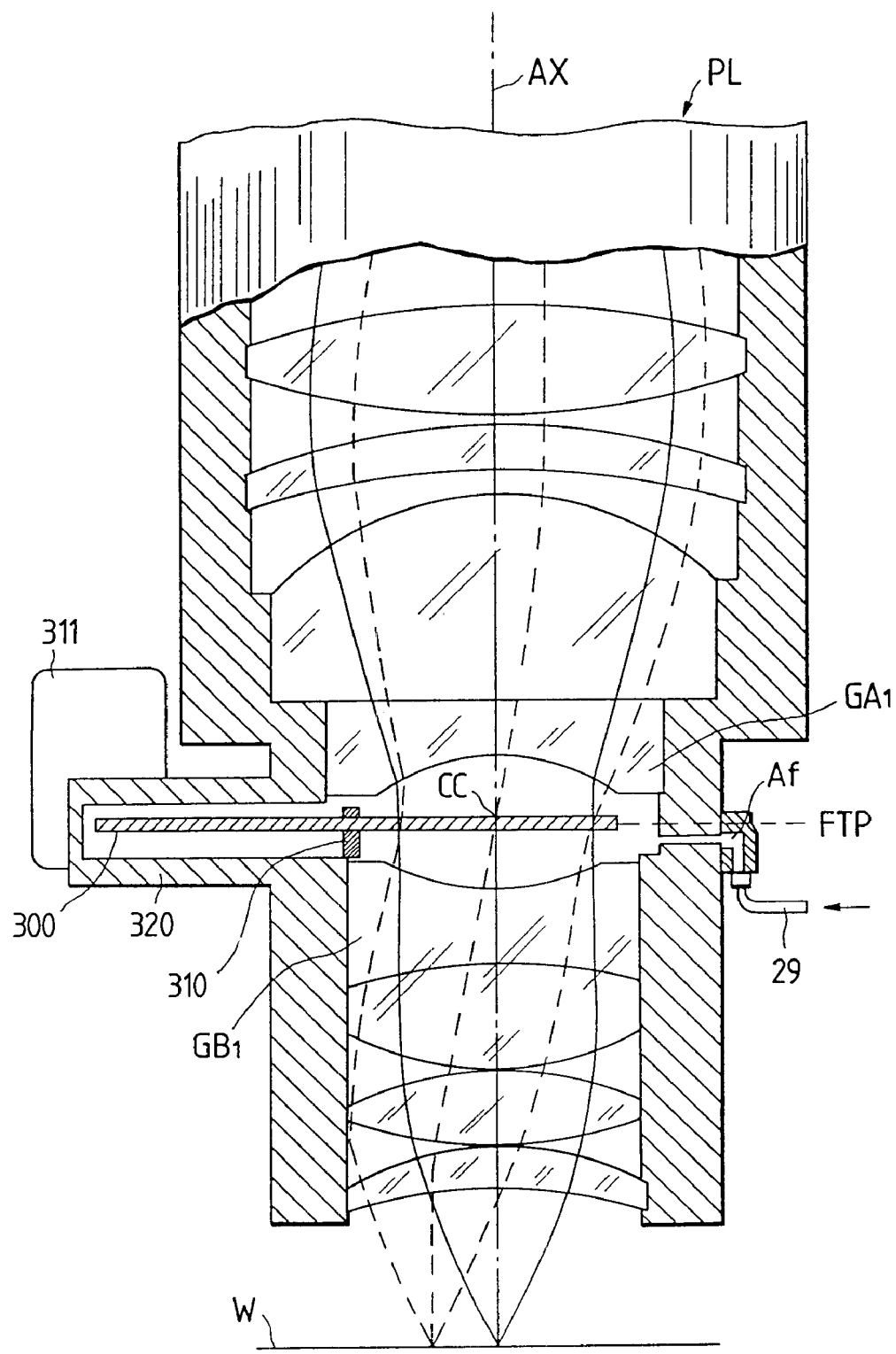
FIG. 44 is a partial cross section to show the construction of the third embodiment of projection optical system according to the present invention.

As shown in FIG. 44, a turret 300 provided with a plurality of (three in FIG. 6) space filters is set at the Fourier transform plane FTP of projection optical system PL as rotatable about a drive shaft 310. The turret 300 and the drive shaft 310 are set in a space surrounded by a cover 320 so as not to be exposed directly to the outside air. An actuator 311 such as a rotary motor is connected to the drive shaft 310. The other part of structure is the same as that in the first embodiment shown in FIG. 5.

Figure 45:
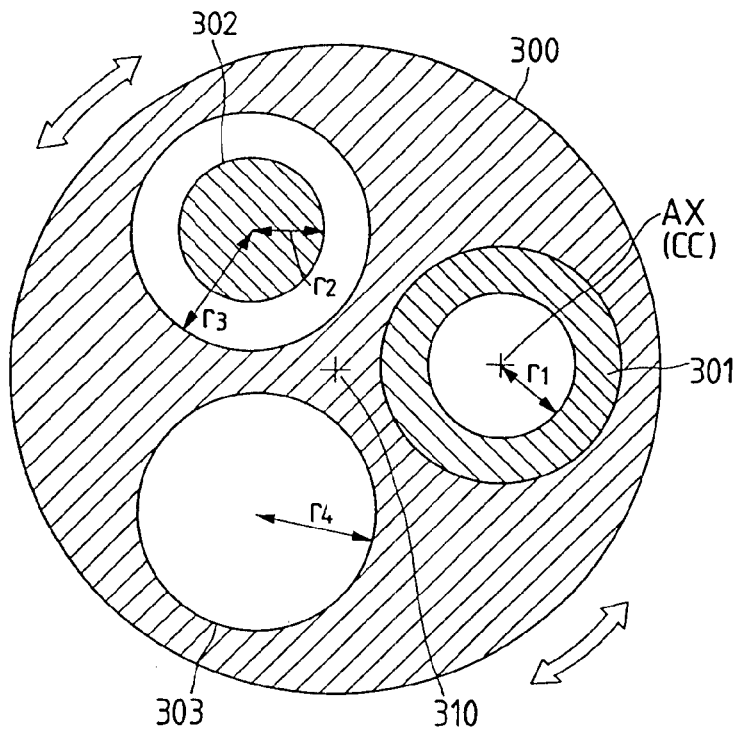
FIG. 45 is a plan view to show a turret having a plurality of space filters as a first specific example.

FIG. 45 shows a specific example of structure of turret 300 provided with a plurality of space filters. The turret 300 has three space filters 301, 302, 303 around the shaft 310. The first space filter 301 has a circular aperture with radius $r_1$ surrounded by an annular shield portion. The second space filter 302 is an annular transmissive filter with outer radius $r_3$ having a circular shield portion with radius $r_2$ at the center. Also, the third space filter 303 has a circular aperture with radius $r_4$ equal to the radius of pupil ep (corresponding to numerical aperture NAw), which is used in exposure of patterns other than contact hole patterns. These space filters may be formed by punching a shield plate such as metal plate or by patterning of a shield layer of metal deposited over the entire surface of plane plate of glass, quartz, etc.

In the present embodiment, first exposure is effected in the state that the first space filter 301 is set in the pupil ep with the center almost coinciding with the optical axis AX of projection optical system and then second exposure is effected in the state that the second space filter PCM 2 is set in the pupil ep by rotating the turret 300 with the center almost coinciding with the optical axis AX. By the first and second exposure, exposure is completed in a shot area on wafer. The main control unit 25 controls through the drive unit 26 opening and closing of rotary shutter 3 controlling start and end of each first and second exposure. The drive system 20 controls the rotation of turret 300 in accordance with a command from the main control unit 25. The controls of rotary shutter 3 and turret 300 are synchronized with each other.

FIG. 45 shows the optical axis AX of projection optical system PL and a state in which the center CC of circular aperture in the first space filter 301 is aligned with the optical axis AX.

The following relations are satisfied to determine the radius $r_1$ of circular transmissive portion of first space filter 301 used in first exposure (corresponding to FA in FIGS. 3A and 3B), and the inner radius $r_2$ and the outer radius $r_3$ of annular transmissive portion of second space filter 302 used in second exposure (corresponding to FB in FIGS. 3A and 3B) for the effective maximum radius $r_4$ of pupil ep.

$$r_1 = r_2 = r_4/\sqrt{2};$$

and $$r_3 = r_4$$

As apparent from the above equations, the area $\pi r_1^2$ of circular transmissive portion and the area $\pi(r_3^2 - r_2^2)$ of annular transmissive portion each are about a half of the area $\pi r_4^2$ of effective pupil aperture. Accordingly, the depth of focus in image-forming of contact hole pattern in the present embodiment is almost doubled as compared with that in the conventional method.

Also, wavefront aberration due to defocus in first and second exposure may be made further smaller than a half of that in the conventional method, if the radius $r_1$ of circular transmissive portion and the inner radius $r_2$ of annular transmissive, portion are determined to satisfy the following relations.

$$r_1 < r_4/\sqrt{2};$$

and $$r_2 > r_4/\sqrt{2}$$

Namely, the depth of focus is increased more than a double of that in the conventional method. In this case, however, a problem arises of decrease in quantity of exposure light, because the first and second space filers 301, 302 both have an area of transmissive portion smaller than a half of the area of pupil aperture in the conventional method.

Then, to reduce a loss in quantity of exposure light, the radius $r_1$ and the inner radius $r_2$ maybe satisfactorily determined to satisfy the following relations.

$$r_1 > r_4/\sqrt{2};$$

and $$r_2 < r_4/\sqrt{2}$$

As so determined, the illumination beam distributed in an annular region near radius $r_4/\sqrt{2}$ in the pupil plane is effective to illuminate the wafer in each of first exposure and second exposure. In compensation for the decrease in light quantity loss, the increase effect in depth of focus will be weakened more or less. The radius $r_1$ and the inner radius $r_2$ may be set in another arbitrary ranges. For example, they may be determined to satisfy the following relations.

$$r_1 = r_2 < r_4/\sqrt{2};$$

or $$r_1 = r_2 > r_4/\sqrt{2}$$

Figure 46:
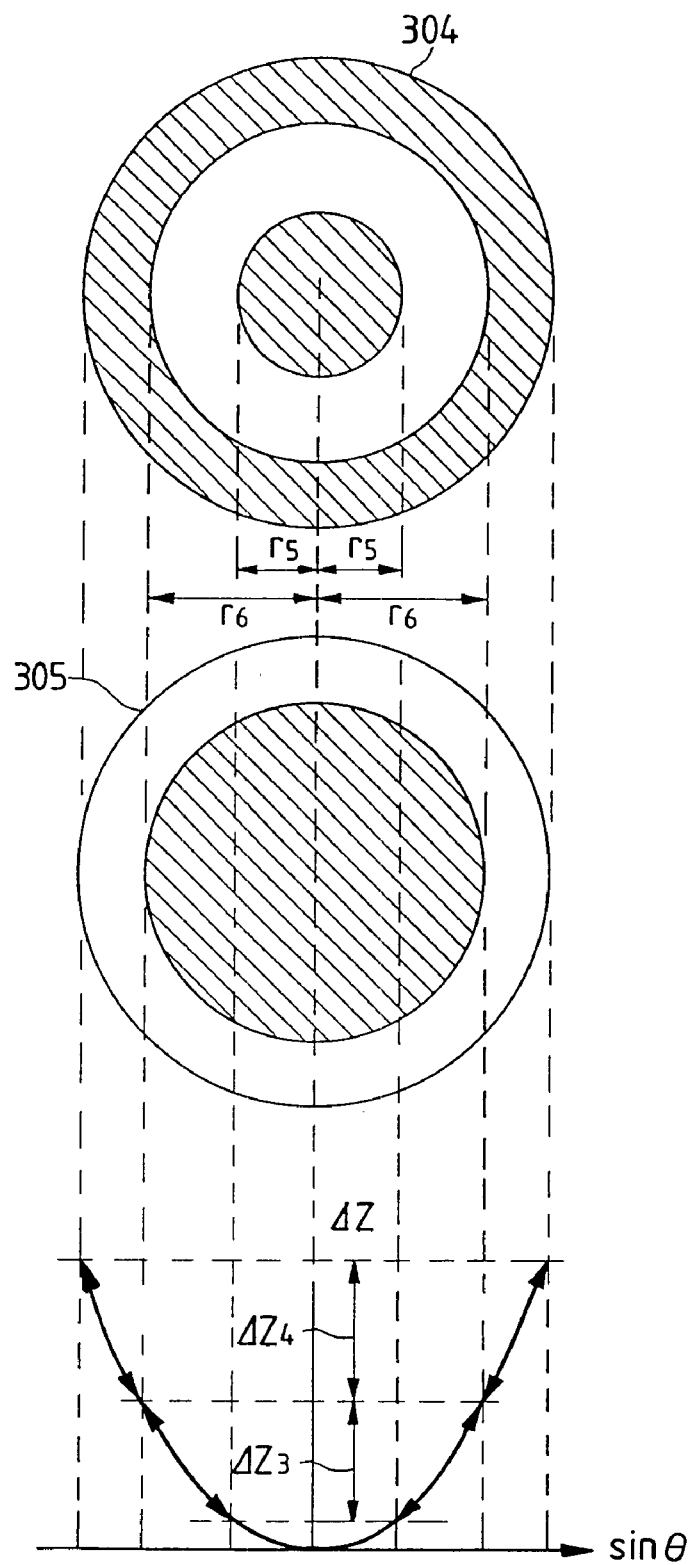
FIG. 46 is a plan view to show a second specific example of first and second space filters with a drawing to show a relation between the space filters and path difference ΔZ in each beam in defocus.

FIG. 46 shows the structure of space filters in a modification of the present embodiment. A first space filter 304 has a circular shield portion with radius $r_5$ at the center and an annular transmissive portion with inner radius $r_5$ and outer radius $r_6$ outside thereof. Also, a second space filter 305 has a circular shield portion with radius $r_6$ at the center and an annular transmissive portion outside thereof having an outer radius equal to the outer radius $r_3$ (=NAw) of the second space filter 302 in FIG. 6.

The first and second space filters are used in first exposure and in second exposure, respectively. Each space filter limits the range of incident angle of illumination beam therethrough into wafer to decrease the path length difference with defocus. The path length difference is $\Delta Z_3$ in first exposure and $\Delta Z_4$ in second exposure.

The space filters 304, 305 may have the same area of transmissive portion, if the radii $r_5$, $r_6$ are determined to satisfy the following relation:

$$r_3^2 - r_6^2 = r_6^2 - r_5^2.$$

That is, $$r_6^2 = (r_3^2 + r_5^2)/2.$$

Then, the path length difference $\Delta Z_3$ becomes equal to that $\Delta Z_4$, maximizing the increase effect in depth of focus.

Since the circular shield portion with radius $r_5$ exists in the central portion of first space filter 304, thus even with the projection optical system of same numerical aperture NAw, the path length differences $\Delta Z_3$, $\Delta Z_4$ in the present embodiment can be made lower than the path length differences ($\Delta Z_1$, $\Delta Z_2$ in FIG. 3) in the embodiment of FIG. 45, then increasing the depth of focus greatly thereby. It should be noted that the relation for radii $r_5$, $r_6$ is not limited to the above example but may be arbitrarily determined. Further, the outer radius of annular transmissive portion in the first space filter 304 may be determined as to differ from the inner radius of annular transmissive portion in the second space filter 305.

Figure 47:
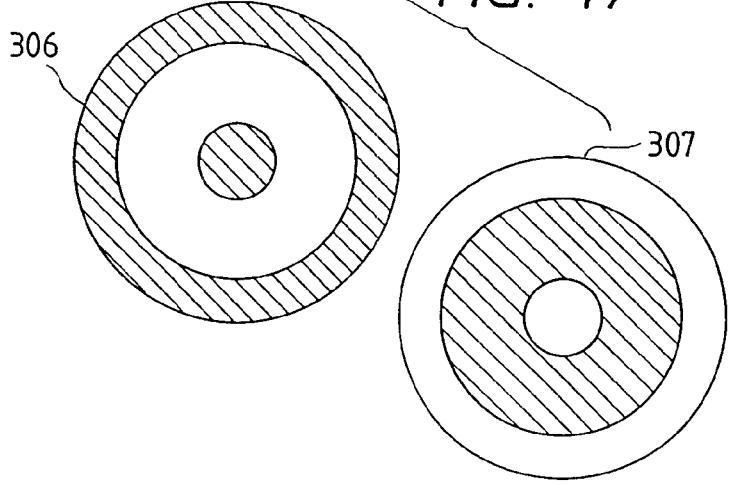
FIG. 47 is a plan view to show a third specific example of first and second space filters.

FIG. 47 shows the structure of space filters in another modification of the present embodiment. A first space filter 306 has an annular transmissive portion between central and peripheral shield portions. On the other hand, a second space filter 307 has an annular shield portion between central and peripheral transmissive portions. The first space filter 306 limits the range of incident angle into wafer to increase the depth of focus similarly as described above. In contrast, the second space filter 307 functions as a triple focus filter as described in the first or second embodiment.

Figure 48:
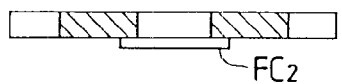
FIG. 48 is a cross section to show a modification of the third specific example.

The second space filter 307 may be modified as shown in FIG. 48. In more detail, a phase plate (or phase film) $FC_2$ is provided on the central circular transmissive portion to shift the path length difference by a half of wave with respect to the transmitting light through the outermost annular transmissive portion,, so that the phase is inverted to each other between the transmitting beams, obtaining the increase effect in depth of focus.

In the present embodiment, the shutter 3 is opened to start first exposure while the first space filter is set. After a predetermined time elapsed, the shutter 3 is closed. At the time of closure of shutter 3, the turret 300 is driven to locate the second space filter in position and the shutter 3 is opened in that state to start second exposure. An integral exposure amount (illuminance×time) for illumination on reticle may be arbitrary in each of first and second exposure. Namely, the integral exposure amount in the first exposure and the integral exposure amount in second exposure may be equal to each other or different from each other. In summary, a sum of integral exposure amounts in first exposure and in second exposure should better be equal to the optimum exposure amount, but a ratio of the integral exposure amounts, is arbitrary.

In case that a pulse light source such as excimer laser is used as the exposure light source, the space filters may be exchanged from one to another during an elongated oscillation interval between pulse beams to change over between the first exposure and the second exposure. During the exchange of space filters, an energy amount per pulse reaching the wafer may be adjusted below an energy amount to start the film reduction of positive resist by lowering a voltage applied to the excimer laser source or by increasing a reduction rate of pulse beam energy. In this case, the light source continues pulse, oscillation, which is advantageous in narrowing and stabilizing wavelength.

In some projection optical systems, a variable aperture stop is provided on the Fourier transform plane to change the effective pupil diameter. In this case, the aperture stop and the space filters are located as close as possible while avoiding mechanical interference there between. Also, if the variable aperture stop is provided adjacent to the space filters, the variable aperture stop transmitting only a beam in a circular region about the optical axis AX on the Fourier transform plane may be also used as the first space filter. In this case, the second space filter transmitting only a beam through the annular region may be made removably mountable relative to the pupil of projection optical system, which can decrease the size of changeover mechanism. Further, the third space filter may be made as a variable aperture stop.

In the present embodiment there is a case in which the best focus position of projection optical system differs between in first exposure and in second exposure, if the projection optical system has a spherical aberration. In such a case, the best focus position can be measured in each of first exposure and second exposure using a focus position detecting system as described for example in U.S. patent application Ser. No. 830,213 filed Jan. 30, 1992. The focus measurement is carried out in the state that the first or second space filter is set on the pupil plane. The surface of wafer can be well located at the best focus position in each first or second exposure using the focus sensor as disclosed for example in U.S. Pat. No. 4,558,949.

The FLEX method may be further employed in each first or second exposure, enabling to further increase the depth of focus. If the best focus position is different between in first exposure and in second exposure, as described above, start and stop positions of wafer movement may be well determined depending upon the best focus position. Also, the position of wafer in second exposure may be shifted a small amount along the optical axis from the position of wafer in first exposure, further increasing the depth of focus. However, in case that the exchange of space filters shifts the best focus plane relative to the wafers the wafer does not have to be shifted.

An image formed by the annular transmissive portion is liable to have a ringing as described in FIG. 26. Then the film reduction is likely to take place in the ringing portion when the image is formed in the vicinity of photoresist surface (on the side close to the projection optical system). When the best focus position is different between in the first exposure and in the second exposure, it suffices that the focus position or the image-forming properties of projection optical system (spherical aberration for example) is adjusted to make the best focus position by the space filter having the annular transmissive portion farther from the projection optical system, accordingly.

Although the present embodiment was described with examples in which a pattern replication was completed by two segmental processes of first exposure and second exposure, the exposure may be divided into three segmental steps. If the exposure is completed by segmental steps the exposure steps are carried out while interchanging m space filters. The m space filters used therein are for example a central transmissive filter and (m−1) annular transmissive filters different in inner radius and outer radius from each other.

Moreover, without using the turret plate as the exchanging mechanism of space filters, a plurality of space filters may be arranged in a stack-condition in the axial direction and in a close relation as being capable of being inserted into or retracted away from the pupil ep. Also, the first or second space filter may be formed as a combination of two or more space filters. As another arrangement, the space filter may be formed by a liquid crystal device or electrochromic device, whereby a light shield region can be changed at high speed in the pupil plane without using such an exchanging mechanism.

When the space filters in the third embodiment replace the PCM employed in the TTL alignment system shown in FIGS. 11A and 11B, the same effect as in the first embodiment can be enjoyed.

In the third embodiment, same simulations as those described according to FIGS. 14 to 27 were carried out, comparing with the conventionally ordinary exposure method, the FLEX method and the Super-FLEX method. The simulation results were substantially the same as those in the first embodiment. Therefore, the details are, omitted to explain herein.

Fourth Embodiment

The fourth embodiment of the present invention will be next described.

As already described, the SFINCS method of the present invention can increase the depth of focus for an image especially of contact hole pattern. The simulation results were shown in FIGS. 23–27 as to the projected images of plural contact hole patterns close to each other. In the present embodiment a σ value of illumination optical system (ratio between numerical aperture of illumination beam (corresponding to the incident angle range) and reticle-side numerical aperture of projection optical system) is set to a relatively large value, for example a value not less than 0.5, to reduce the spatial coherency of illumination beam on the reticle, whereby connection hardly occurs between adjacent patterns.

First described is the range of incident angle of illumination beam ILB into reticle (σ value for example).

FIG. 49A is a partial cross section of the reticle R1 for contact hole pattern as shown in FIG., 23, in which two transparent patterns $PA_1$, $PA_2$, each to be a contact hole pattern in 0.3 μm square on wafer, are separate 0.66 μm which is a converted distance on wafer, from each other FIG. 49B shows a simulation result of coherence function (complex coherence) on reticle under illumination by an illumination system having σ value of 0.4, 0.6 or 0.8 when a pattern on the above reticle R1 is projected by a projection optical system for i-line with wafer-side numerical aperture NAw of 0.57. A coherence function is generally obtained by Fourier transform of light source shape as seen from above an object (reticle herein) from the van Cittert-Zernike theorem. In the projection exposure apparatus (stepper) of this type, the light source shape is generally circular as equivalent to the aperture shape in circular stop (for example, the stop 8 in FIG. 4) disposed on the exit plane of fly's eye lens 7. A Fourier transform of circle is a well-known Bessel function of the first kind. Since a radius of circle defining the light source shape is σ·NAr, the coherence function is $2 \cdot J_1(2\pi x N A r \sigma / \lambda)/(2\pi x N A r \sigma / \lambda)$. In the function x represents a distance to a reference point set at an arbitrary position on reticle.

In the case of FIG. 49B, the reference of coherence function is set at the center of left contact hole $PA_1$. The coherence function C4 with σ=0.4 takes a positive value at the position of right contact hole $PA_2$. Accordingly, constructive coherence in amplitude will result between a beam passing through the left contact hole $PA_1$ as reference and a beam passing through: the right contact hole $PA_2$. As a result, a part of light quantity of the two hole images is diffracted to reach a portion which is expected to be a dark portion on wafer and which corresponds to the shield portion PM, between the two hole patterns $PA_1$, $PA_2$, so that the reaching beams interfere with each other to intensify the amplitude, failing to make the portion sufficiently dark.

Figure 50A:
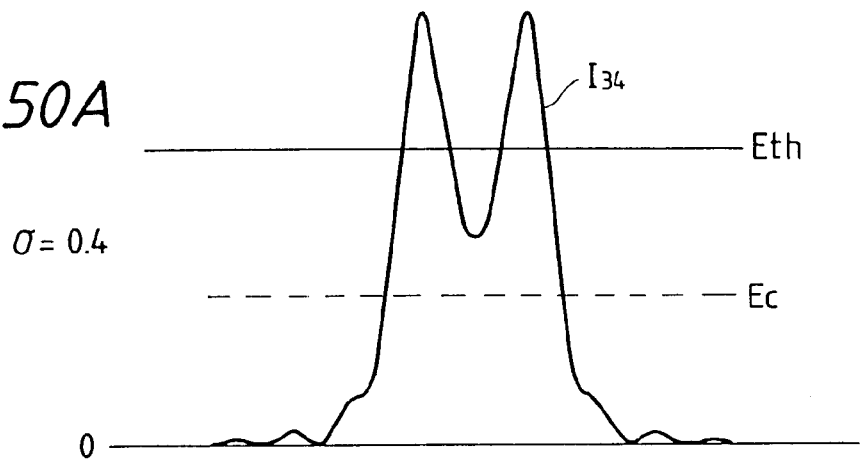
FIGS. 50A, 50B and 50C are graphs of light image intensity distribution to show a simulation result for each σ value in which two hole patterns are projected by the conventionally ordinary exposure method.
Figure 50B:
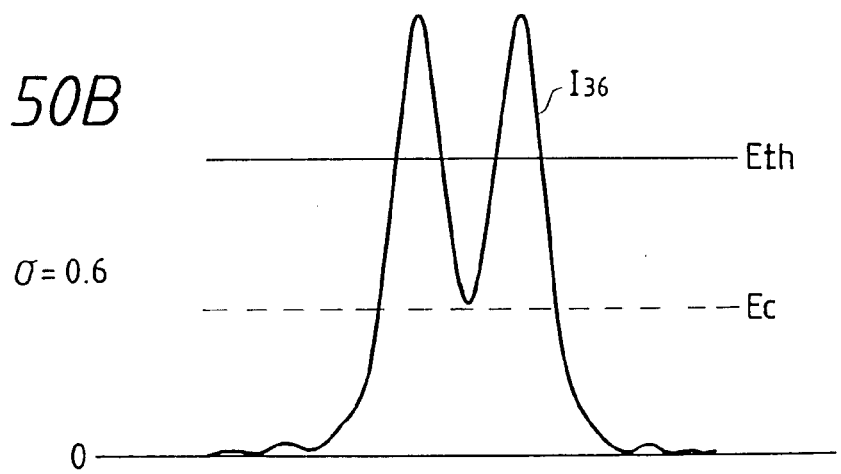
Figure 50C:
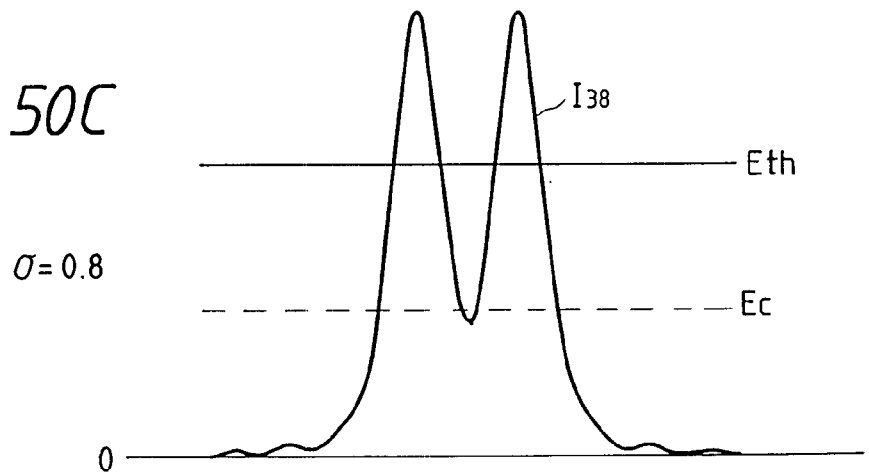

FIGS. 50A, 50B and 50C show intensity distributions of optical images (simulation values) of hole patterns formed when the coherence reducing member CCM is provided on the pupil plane ep. In the drawings, Eth represents a quantity of light (exposure amount) necessary for completely dissolving the positive resist after development, and Ec a quantity of light with which the positive resist starts dissolving (film reduction intensity). In the drawing, the vertical scale of optical image (intensity distribution) is defined such that the slice width at the level of light quantity of Eth is 0.3 μm of designed value.

With illumination condition of σ=0.4, the optical intensity between the two hole images, is greater than the film reduction intensity Ec as shown by the distribution $I_{34}$ shown: in FIG. 50A. Then the positive resist will be reduced in thickness between the two hole images and, therefore, good patterns completely separated from each other cannot be obtained. Here the coherence reducing member CCM located on the pupil plane ep is so arranged that the radius of central transmissive portion FA (or $FA_1$) is $1/\sqrt{2}$ of radius of pupil (corresponding to NAw=0.57), that the inner radius of peripheral annular transmissive portion FB (or $FB_1$) is equal to the radius of central transmissive portion, and that the outer radius thereof is equal to the radius of pupil. The same result will be obtained with the coherence reducing member PCM utilizing the polarization effect as described in the first embodiment or with the coherence reducing member CCM utilizing the path length difference greater than the coherence length as described in the second embodiment.

When the σ value is 0.6 without changing any other conditions, the coherence function C6 takes a value of nearly 0 at the position of right contact hole $PA_2$ (FIG. 49B). Then, beams passing through the two contact holes rarely interfere with each other consequently, beams turning in the portion on wafer, corresponding to the intermediate shield portion PM, from the two hole images will not interfere with each other, which improves the separation between the two holes as compared with the case of σ=0.4.

FIG. 50B shows the simulation result of intensity distribution $I_{36}$ for the optical image in this case. According to the simulation result, a quantity of light in the intermediate portion is slightly greater than the film reduction intensity, Ec, by which a slight film reduction is anticipated on the resist pattern. However, the light quantity of this level can be acceptable, if a resist with higher quality than the presently used resist is used.

With σ value of 0.8, the coherence function C8 takes a value of coherence function of illumination beam reaching the right contact hole pattern $PA_2$ opposite in sign to a value of coherence function of illumination beam reaching the left contact hole $PA_1$ (that is, the beams are opposite in phase to each other). Accordingly, beams turning in from the two hole patterns $PA_1$, $PA_2$ cancel each other, making the intermediate shield portion PM sufficiently dark.

FIG. 50C shows an intensity distribution $I_{38}$ of optical image with σ=0.8. The conditions other than the σ value are the same as above. With σ=0.8, the intensity distribution $I_{38}$ of optical image becomes lower than the film reduction intensity Ec in the intermediate portion, whereby the resist patterns of the two hole patterns are perfectly separated from each other. In the above description, the light quantity Ec starting the film, reduction of positive resist is set to a half of Eth, which is the current capability of positive resist. The film reduction intensity Ec will be able to be set higher near Eth with progress in capability of positive resist in future. In such an occasion, the two hole patterns could be perfectly separated even with σ=0.6 as described. Also, if the distance between the two hole patterns is greater than 0.66 μm employed in the above simulations, for example if the distance is about 0.8 μm, the two hole patterns can be well separated even with σ=0.6. This is caused not only by the effect of increase in distance between the two hole patterns but also by a great contribution of the fact that the coherence function C6 is negative at a position apart 0.8 μm under the condition of σ=0.6. From the above discussion, although it depends on the properties of resist (improvement thereof), the projection exposure is preferably carried out with σ value greater than about 0.5, considering the present distance between hole patterns (about 1 μm).

Figure 51:
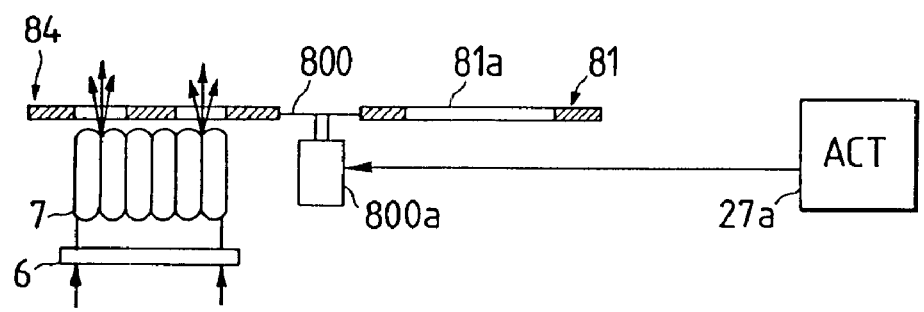
FIG. 51 is a cross section of illumination system including a turret with various aperture stops.

As described above, a method to make the value of coherence function opposite in sign between two adjacent contact holes, is to use illumination light having a relatively large σ value. The annular illumination method or the SHRINC method can be employed to obtain further enhanced effect. As an example thereof, a turret 800 having a plurality of stops 81 to 84 is placed in the vicinity of the exit plane of fly's-eye lens 7 in the apparatus of FIG. 4, as shown in FIG. 51. The turret 800 can be rotated by a motor 800a, which is operated through a drive unit 27a based on a command from the main control unit 25. This command is one based on information from a bar code on reticle as described before, or one input by an operator for example.

Figure 52:
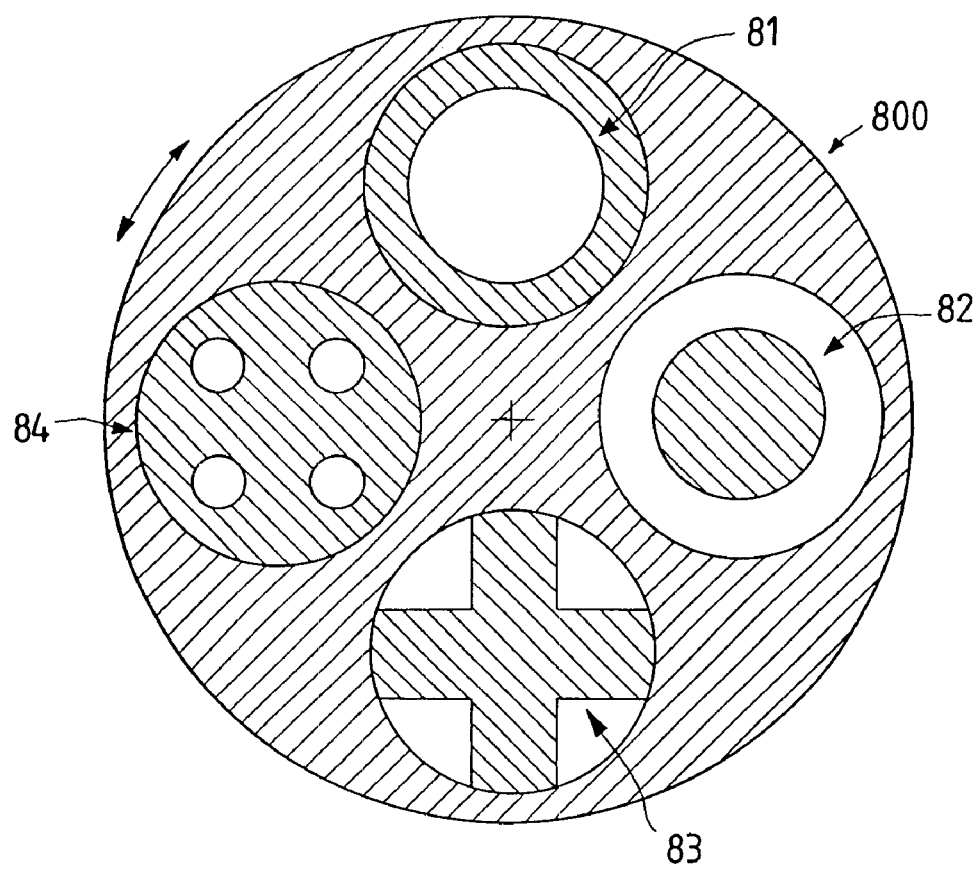
FIG. 52 is a plan view of the turret in FIG. 51.

FIG. 52 shows the shape of stops mounted on the turret 800. Reference numeral 81 denotes a stop for conventional illumination system having a circular aperture, 82 a stop for annular illumination having an annular aperture, and 83, 84 stops for the SHRINC method as so-called as irregular light source. Each stop 81 to 84 is set at a position substantially conjugate with the pupil ep (Fourier transform plane) of projection lens PL and close to the exit side of fly's-eye lens 7.

Figure 53A:
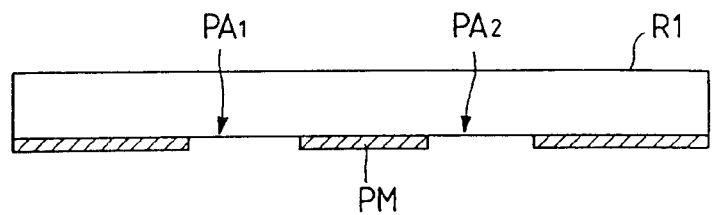
FIG. 53A is a cross section to show a contact hole pattern.
Figure 53B:
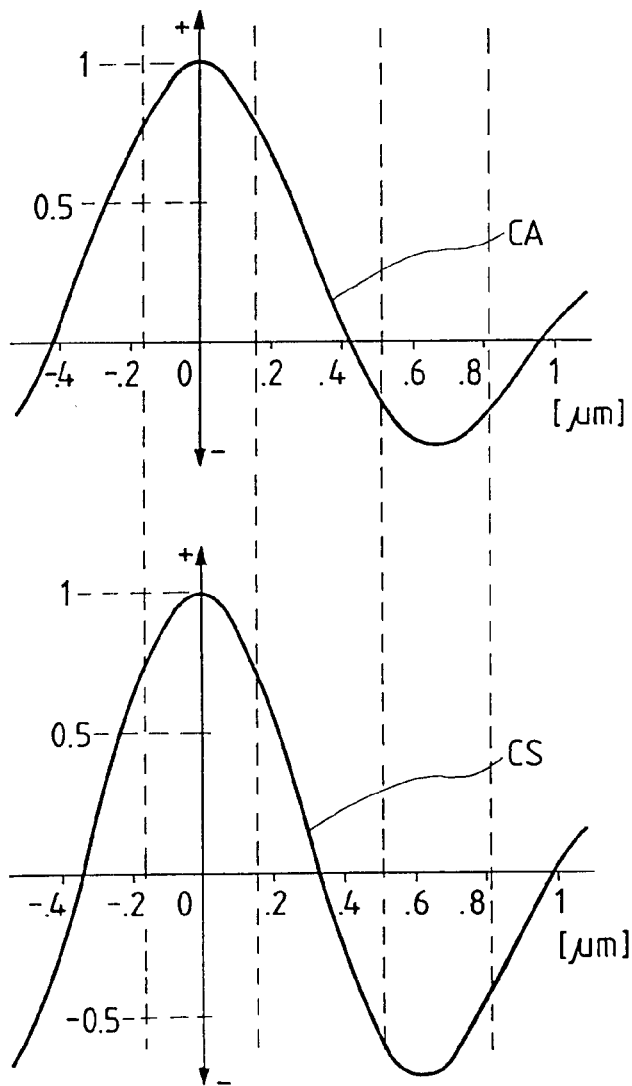
FIG. 53B is a drawing to show graphs illustrating a simulation result of coherence function for the contact hole pattern in FIG. 53A, applying the annular illumination method and the SHRINC method.

FIG. 53A shows a partial cross section of reticle R1, which is the same as that in FIG. 49A, and FIG. 53B shows a coherence function on reticle pattern under illumination light in each of the annular illumination method and the SHRINC method. The simulation conditions herein are the same as those in FIG. 49B except for the illumination system. Curve CA shows a simulation result of coherence function in case of annular illumination in which the central portion of illumination beam (secondary light source images) in the condition of σ=0.7 is shielded about two thirds of the maximum radius thereof. The coherence function herein is also obtained by Fourier transform of light source shape. For example, in case of annular illumination, letting ξ be a ratio of annular zone (which is 2/3 in this case) and σ be the maximum radius of annular light source image, the coherence function (complex coherence) may be expressed as follows by a Bessel function of the first kind with ρ=2πxNArσ/λ.

$$\frac{2J_1(\rho)/\rho - 2\xi^2 J_1(8\rho\xi)/(\rho\xi)}{1-\xi^2}$$

In the function x represents a distance from the reference point to an arbitrary point.

Also, curve CS represents a coherence function by the SHRINC method, in which four light source images each having σ value of aperture of about 0.25 are formed around four points which are optimum where there are hole patterns at pitch of 0.66 μm in two directions perpendicular to each other. For two contact hole patterns $PA_1$, $PA_2$ juxtaposed on reticle, four light source images by the SHRINC method using either one of two types of stops 83, 84 are adjusted in the rotational direction to take the optimal position. The optimal position of light source images in the SHRINC method is determined according to the pitch of periodic pattern on reticle, as described in detail in U.S. patent application Ser. No. 791,138 filed Nov. 13, 1991.

These illumination systems are effective to make the value of coherence function at the right contact hole pattern $PA_2$ greatly negative with reference to the left hole pattern $PA_1$. Accordingly, when either the annular illumination method or the SHRINC method is employed, the canceling effect of light works stronger in the intermediate portion between the two hole images than in the case of σ=0.8 using the circular stop 81 as described above, whereby a quantity of light is further decreased in the shield portion PM and, therefore, the two hole images can be separated better from each other.

Figure 54A:
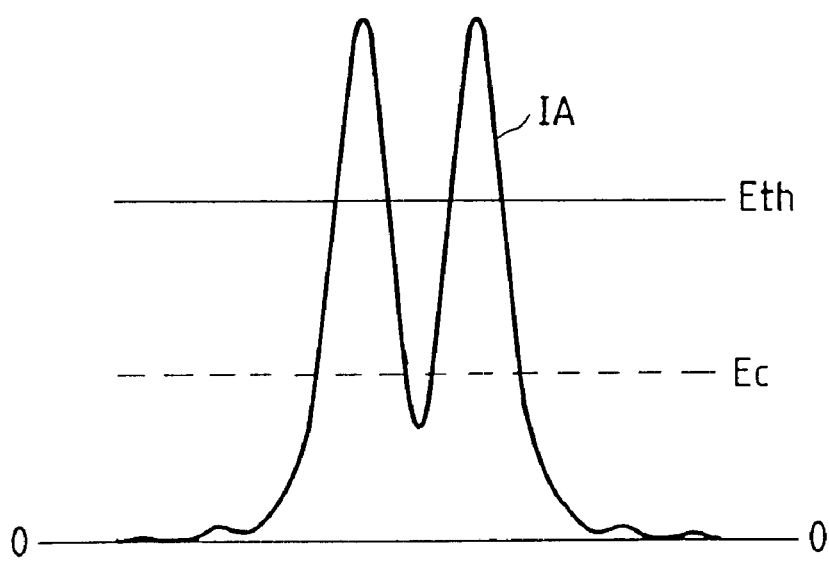
FIGS. 54A, 54B; 55A, 55B, 55C; 56A, 56B, 56C; 57A, 57B, 57C; 58A, 58B, 58C; 59A, 59B, 59C; 60A, 60B, 60C; 61A, 61B, 61C; and 62A, 62B, 62C are graphs respectively to show a simulation result of coherence function for two contact hole patterns.
Figure 54B:
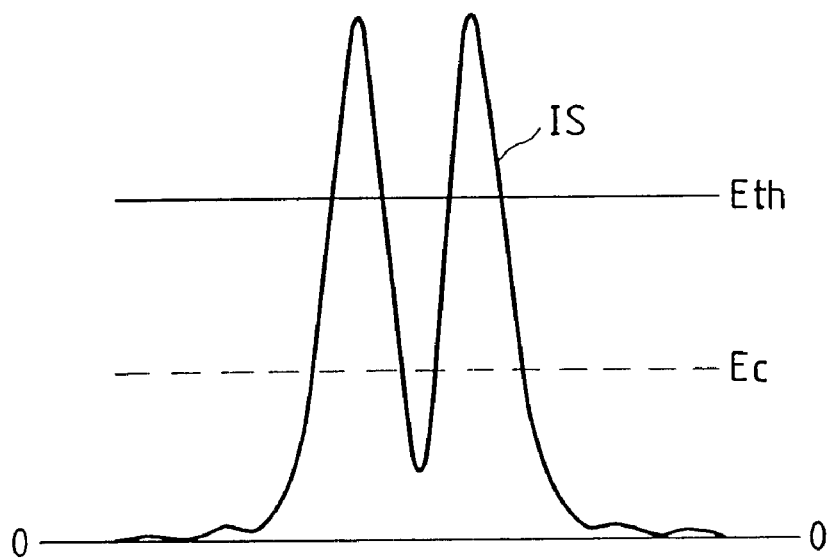

FIGS. 54A and 54B show intensity distributions IA, IS of optical images in the simulation results FIG. 54A shows the case of annular illumination method under the above conditions and FIG. 54B the case of SHRINC method under the above conditions. As seen from these simulations, the intermediate portion between the two hole pattern images is sufficiently dark in either of the illumination methods. The coherence reducing member herein on the pupil plane is the same as what is described in case of σ=0.4, 0.6 or 0.8.

Figure 55A:
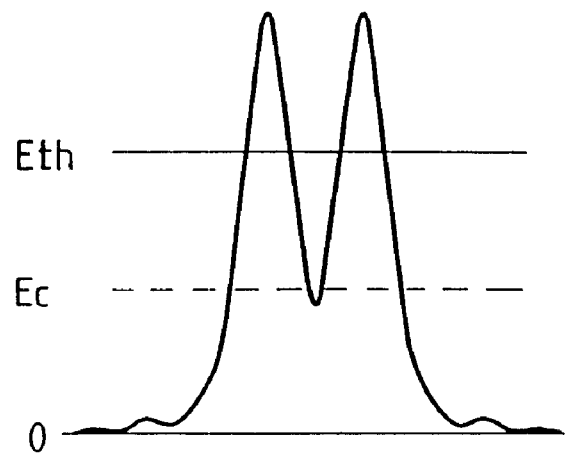
Figure 55B:
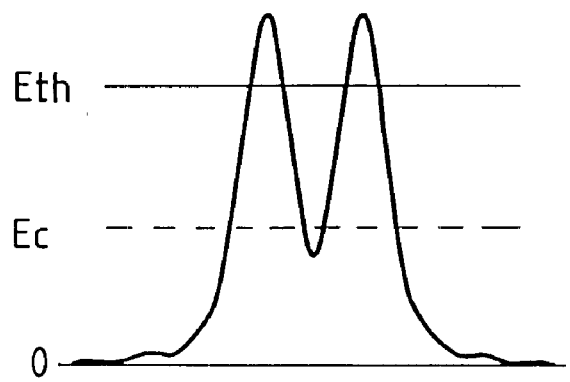
Figure 55C:
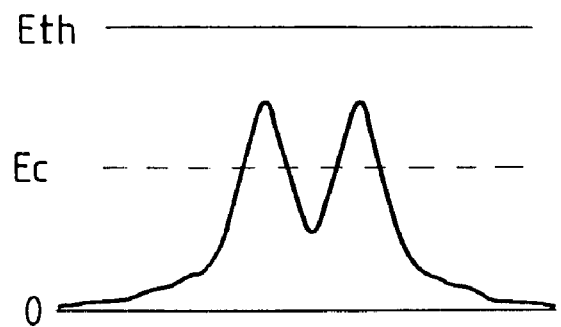

Next described is an increase in depth of focus in the present embodiment, based on simulation results. FIG. 55A shows an intensity distribution at the best focus position in the case that the illumination system of σ=0.8 (circular aperture Stop 81 selected to have σ=0.8) is added to the SHRINC method using the coherence reducing member, and FIGS. 55B and 55C intensity distributions at the defocus position of 1 μm and at the defocus position of 2 μm, respectively, which are simulation results of optical images of hole patterns. The conditions herein (N.A., wavelength, pattern shape) are the same as those as described above. It is noted that FIG. 55A is the same as FIG. 50C and is again depicted herein for easy comparison with the defocus states. As apparent from the simulations, the image intensity is lower than the film reduction intensity EC between the two hole pattern images even at the defocus position of 2 μm.

Figure 56A:
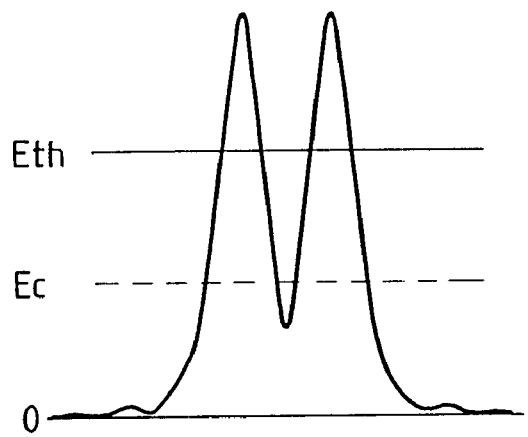
Figure 56B:
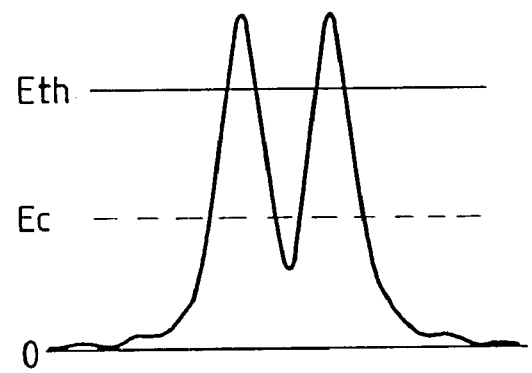
Figure 56C:
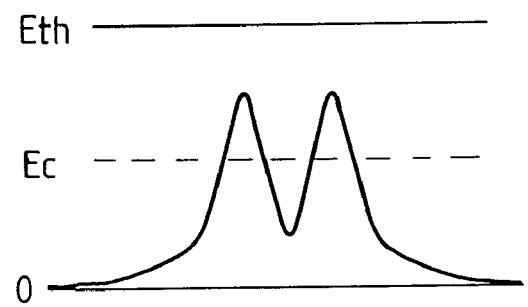

FIGS. 56A, 56B and 56C show simulation results of intensity distribution of hole pattern image obtained when the same annular illumination system as one used in the above-described simulations in FIGS. 53A and 53B (annular stop 82 which cuts off two thirds of radius in the central portion of secondary light source images with a size corresponding to σ=0.8) is added to the SHRINC method using the coherence reducing member, respectively showing intensity distributions at the best focus position, at the, defocus position of 1 μm and at the defocus position of 2 μm.

Figure 57A:
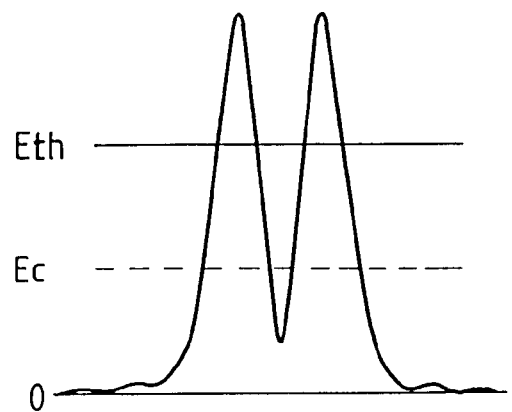
Figure 57B:
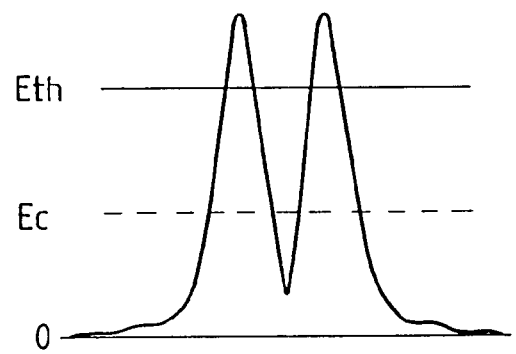
Figure 57C:
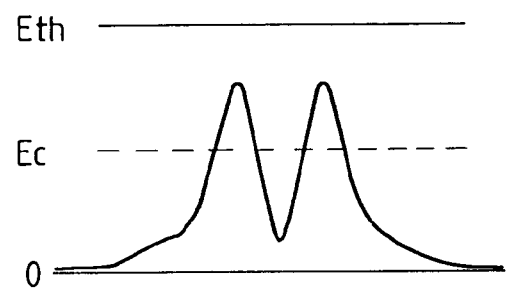
Figure 59A:
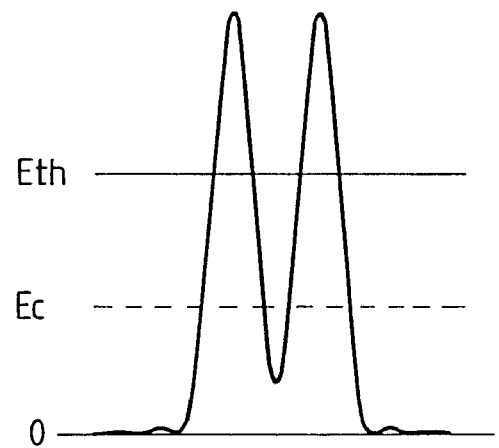
Figure 59B:
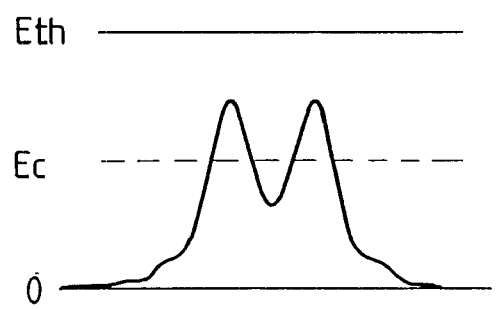
Figure 59C:
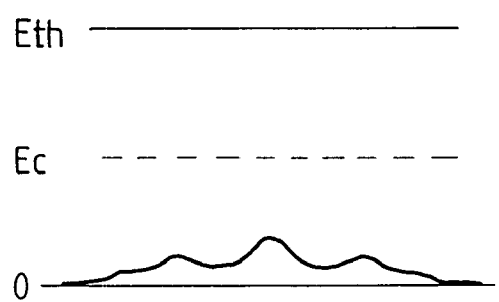

FIGS. 57A, 57B and 57C show simulation results of intensity distribution of hole pattern images in the case that the SHRINC method used in FIGS. 53A and 53B is combined with the SFINCS method. For comparison sake, FIGS. 59A, 59B and 59C show simulation results of intensity distribution of optical image in the conventionally common image-forming method. In the common method the coherence reducing member was not used on the pupil plane and the σ value was 0.6. The other conditions (N.A., wavelength, pattern shape) are the same as those in the SFINCS method as having been described above. Comparing the SFINCS method by the present embodiment in FIGS. 55A–55C, 56A–56C and 57A–57C with the conventional image-forming method in FIGS. 59A–59C, the increase in depth of focus is clearly greater in the present embodiment, and the optical intensity distribution at the 2 μm defocus position in the SFINCS method according to the present invention keeps its contrast almost equal to that in the intensity distribution at the 1 μm defocus position in the common method. It means that the depth of focus is almost doubled.

Figure 58A:
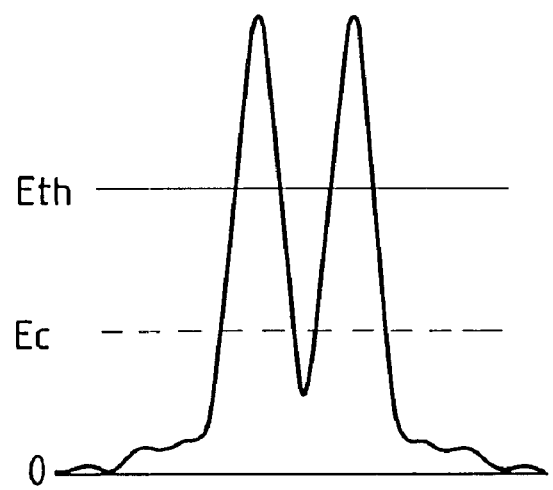
Figure 58B:
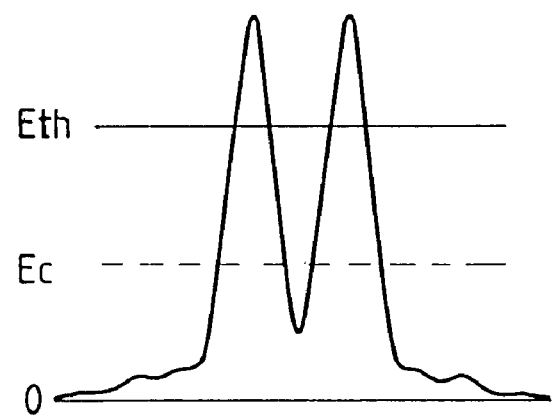
Figure 58C:
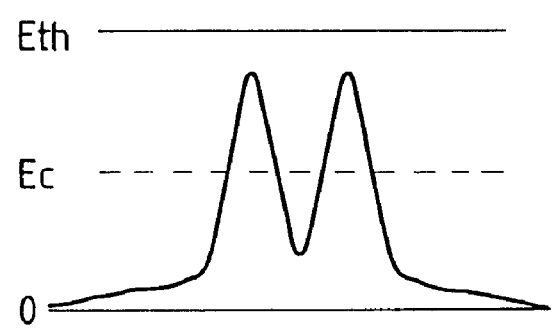

FIGS. 58A–58C show image intensity distributions obtained in a modification of the present invention, in which the σ value of illumination system is set to 0.8 using a circular aperture stop 81, the coherence reducing member provided on the pupil plane has the same structure as the coherence reducing member 111 shown in EMBODIMENT 1–11 in FIG. 7, the radius of central shield portion is determined for effective radius of pupil (which is numerical aperture=NAw) as 0.31×NAw, and the outer radius of annular transmissive portion FA (which is equal to the inner radius of annular transmissive portion FB) is 0.74×NAw. The coherence reducing method may be either one using the polarization effect or one using the path length difference. It is seen from the simulation results that even with the same illumination system of σ=0.8 the portion between two hole images is darker in the example of FIG. 18 than in the example of FIG. 15, whereby the separation capability is improved.

Figure 60A:
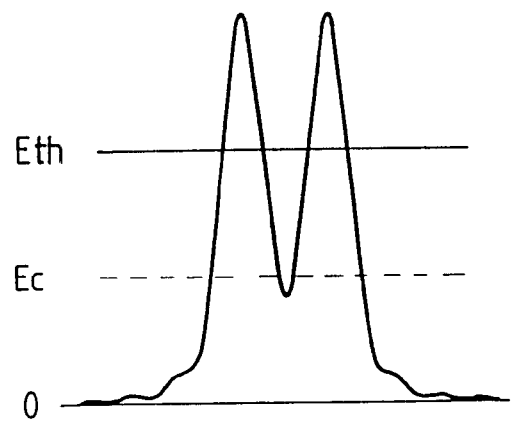
Figure 60B:
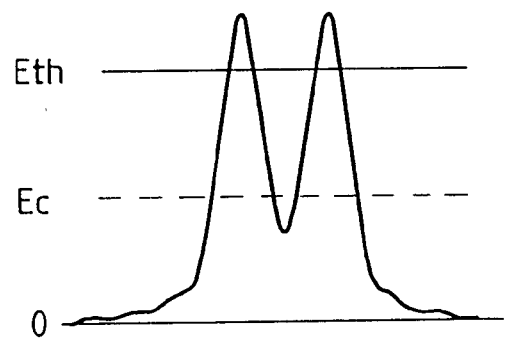
Figure 60C:
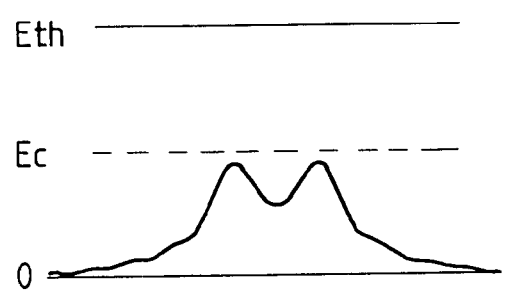

FIGS. 60A, 60B and 60C show simulation results of intensity distribution of hole pattern image for comparison sake in the case that the FLEX method is combined with the common illumination method. The FLEX method hereein is a method in which multiple exposure is made while the wafer is consecutively moved to three focus positions. The three wafer positions (focus positions) are −1 μm, 0 μm and +1 μm along the Z direction. Also in this FLEX method, the optimum condition is realized at the best focus position, in which resist images of two contact hole patterns $PA_1$, $PA_2$, can be separated from each other (the intermediate shield portion PM has an intensity below the film reduction intensity Ec) and the depth of focus can be increased. Comparing the intensity distribution at the 2 μm defocus position between FIG. 60C and FIGS. 55C, 56C, 57C and 58C, it is seen that the hole pattern images obtained in the present embodiment is higher in, peak intensity and quality of image. If the conditions of the FLEX method in the above simulation is changed for example such that the distance between focus positions is increased or such that four or more focus positions are used for multiple exposure, the image intensity distribution at the 2 μm defocus position in FIG. 60C can be improved, but in the intensity distribution at the best focus position in FIG. 60A the intensity of the intermediate portion between the two hole pattern images will exceed the film reduction intensity Ec, resulting in causing a film reduction in resist pattern.

Figure 61A:
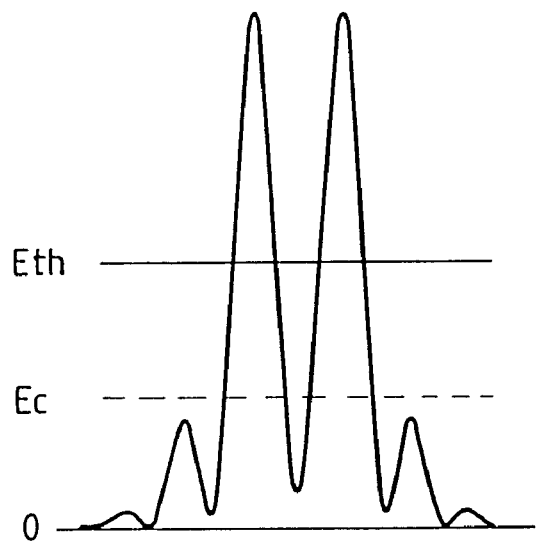
Figure 61B:
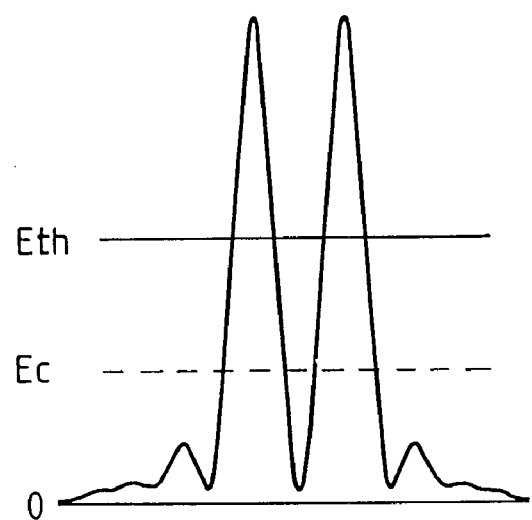
Figure 61C:
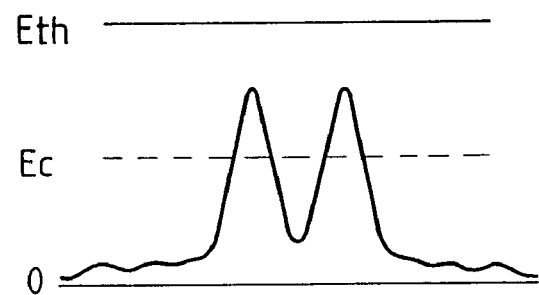

FIGS. 61A, 61B and 61C show simulation results in the conventional Super-FLEX method for comparison, with optical intensity distributions at the best focus position, at the defocus position of 1 μm and at the defocus position of 2 μm, which were obtained when a filter having the numerical aperture. NAw of 0.57 and the complex amplitude transmittance of −0.3 in the portion within the radius of 0.548 NAw from the center of pupil was disposed at the pupil. The Super-FLEX method can provide a sharp profile at the best focus position, but the center intensity starts dropping suddenly at a certain defocus amount as the defocus amount increases. On the other hand, the increase effect in depth of focus is at the same level as those in the embodiments shown in FIGS. 55A, 56A, 57A and 58A. As shown in FIG. 61A, subpeaks (ringings) appear around the main image represented by the center intensity in the Super-FLEX method.

Figure 62A:
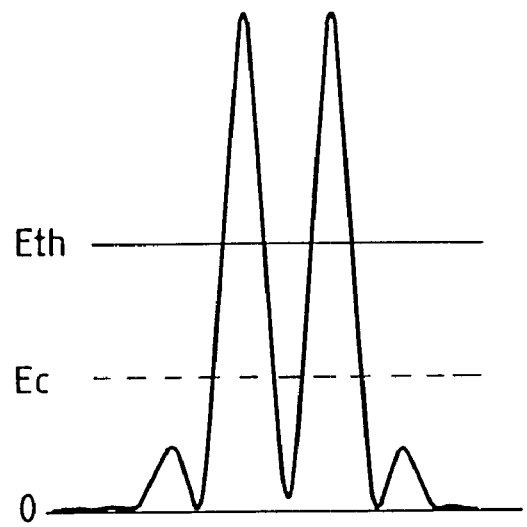
Figure 62B:
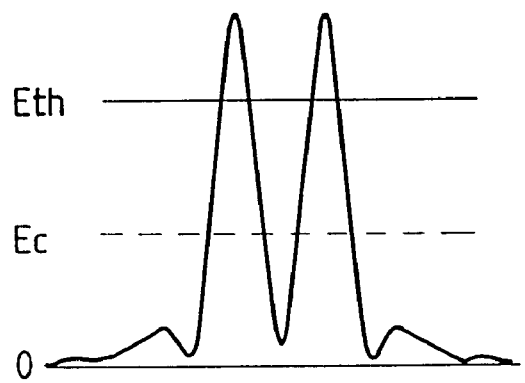
Figure 62C:
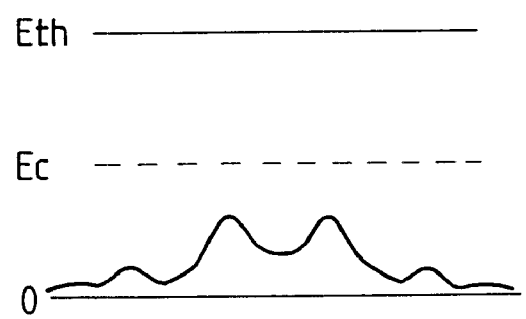

FIGS. 62A, 62B and 62C show simulation results in the case that a filter weaker in function than the pupil filter in the above simulation model (Super-FLEX (1)) is used in order to prevent such ringings. In this case, the filter employed has a numerical aperture NAw of projection optical system of 0.57 and a complex amplitude transmittance of −0.3 in the portion corresponding the radius 0.447 NAw in the center portion of pupil. As seen from the results the ringings are weakened as expected, and the increase effect in depth of focus is also lowered.

The simulation results were already shown in FIGS. 25A, 25B and 25C for the case that thee distance between the centers of two hole patterns $PA_1$, $PA_2$ was changed from 0.66 μm to 0.96 μm on wafer (conversion values on wafer).

The connection between images, which is seen in projection of a plurality of adjacent contact hole patterns as shown in the above simulation results, is caused mainly by the imaging beam passing through the central circular region FA (or $FA_1$) in the pupil plane ep of projection lens PL. It is known by the optical theory that the size (radius) $D_1$ of a contact hole pattern image $Pr_1'$ formed by the imaging beam LFa passing only through the central-circular region is given by the following relation, based on the numerical aperture $NA_1$ corresponding to the radius $r_1$ of circular region, if the size is as fine as the exposure wavelength λ.

$$D_1 \delta 0.61 \cdot (\lambda/NA_1)$$

In the relation $NA_1$ is a numerical aperture on the wafer side corresponding to the radius $r_1$, which is determined as shown in FIGS. 3A and 3B. In this case, even when a hole pattern is a square on reticle, an image $Pr_{1'}$ is almost circular on the wafer. Accordingly, in order to enhance the degree of separation between two adjacent hole pattern images, it is important that, considering the magnification 1/M of projection lens, illumination beams respectively reaching two positions apart by distance $0.61 \cdot M \cdot (\lambda/NA_1)$ from each other on reticle be spatially incoherent with each other, that is, that the coherence function take an approximately zero or negative value at one of the two positions with respect to the other. This means that a numerical aperture of illumination beam reaching the reticle, NAi $(\sin \phi/2)$, is made greater than a reticle-side numerical aperture $NA_1/M$ of imaging beam LFa passing through the central circular region in the pupil. It is because from the above equation of coherence function the distance on wafer making the coherence function 0 is approximately 0.61 $\lambda/NA_1$ similarly as described above.

When the reticle-side numerical aperture $NA_1/M$ of imaging beam LFa is $NAr_1$ and if $NAi > NAr_1$ cannot be achieved using a normal circular aperture stop 81, the annular stop 82 in FIG. 52 will do. In this case, it is found that when the numerical aperture corresponding to the radius of central circular shield portion in the annular stop 82 is NAs (value on reticle) and assuming $k = NAi/NAr \leq 1$, the radius of central circular shield portion can be approximately determined to satisfy the following relation:

$$NAs \geq NAr_1 \cdot \sqrt{1-k}$$

(where $k \geq 0.62$). The above relation makes incoherent with each other the illumination beams respectively reaching two positions apart by the distance $0.61 \cdot M \cdot (\lambda/NA_1)$ from each other, which means that the coherence function takes a zero or negative value at one position with respective to the other position. It should be noted that the annular illumination system is not limited to the case of $NAi/NAr_1 \leq 1$, but can be employed for the case of $NAi/NAr_1 \geq 1$.

Figure 63A:
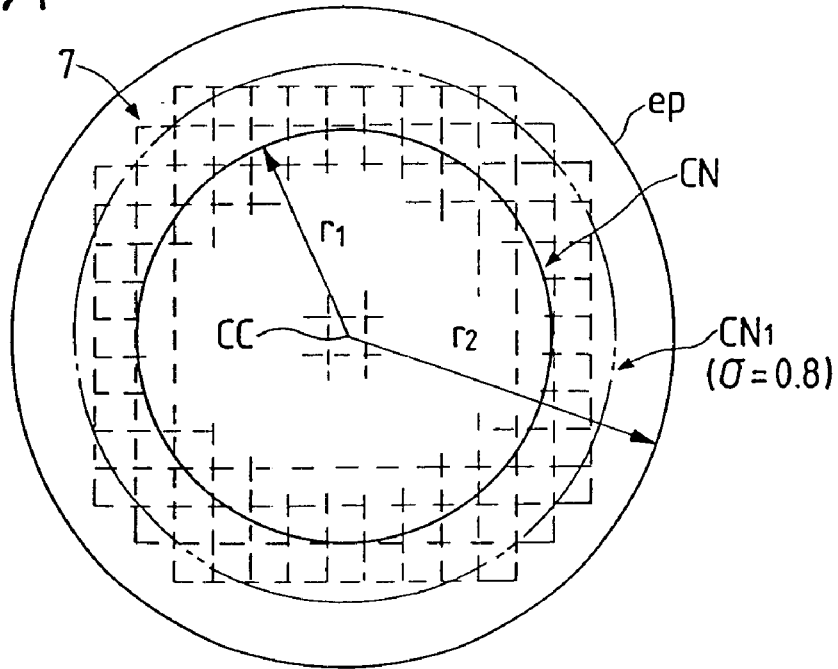
FIGS. 63A and 68B are schematic drawings respectively to show a positional relation between the pupil of projection optical system and an exit plane projection image of fly's-eye lens.
Figure 63B:
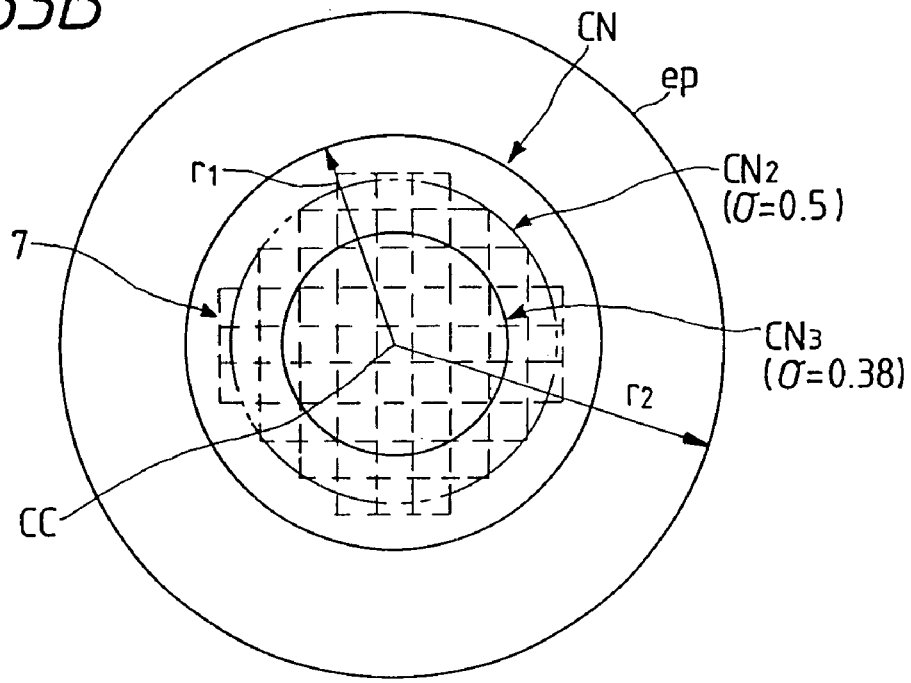

FIGS. 63A and 63B schematically show a state of exit plane of fly's-eye lens 7 forming images on the pupil plane ep of projection lens. In FIG. 63A, images, which are secondary light source images are formed on the exit plane of fly's-eye lens 7 in a circle $CN_1$ sized about 80% (0.8 $r_2$) of the effective maximum radius $r_2$ of pupil ep. In this case, the circle $CN_1$ has the σ value of 0.8. In the drawing, a circle CN with radius $r_1$ represents a boundary between central circular transmissive region FA (or $FA_1$) and annular transmissive region FB (or $FB_1$) in CCM or PCM. Assuming the relation of $2r_1^2 \delta r_2^2$ holds, the radius $r_1$ corresponds to the σ value of 0.707.

The reason why the illumination condition of σ=0.8 shows the excellent result in particular in image formation of a plurality of adjacent contact hole patterns is that the size of secondary light source images (exit plane of fly's-eye lens 7) in the pupil ep is greater in consequence than the circle of border (corresponding to σ=0.707), as described above. This is equivalent to the aforementioned condition of $NAi/NAr_1 > 1$.

In contrast, FIG. 63B shows a case that the area of secondary light source images in the pupil plane ep is relatively small and that the image of exit plane of fly's-eye lens 7 is formed in a circle $CN_2$ of σ=0.5 (the radius of which is 0.5 $r_2$). Naturally, the circle $CN_2$ is smaller than the circle CN of border and satisfies the previous condition of $k = NAi/NAr_1 \leq 1$. Then $k = 0.5/0.707 \approx 0.71$. The numerical aperture NAs of central circular shield portion is defined as follows for changeover to annular illumination:

$$NAs = NAr_1 \cdot \sqrt{0.29}$$

Since $NAr_1$ corresponds to the σ value of 0.707, NAs is about 0.38 as the σ value. In the drawing the circle $CN_3$ defines the location of the central shield portion on the pupil plane ep, from which the size of shield portion can be specified on the pupil plane of fly's-eye lens 7. In the case of FIG. 63B, the size of secondary light source images corresponds to the σ value of 0.5 and the size of central shield portion in the annular illumination stop 82 corresponds to the σ value of 0.38. Therefore, the radius of central shield portion is set to approximately $0.38/0.5 \approx 0.76$ times the radius of secondary light source images on the exit plane of fly's-eye lens 7.

It was described that the equation for determining the size (numerical aperture NAs) of central shield portion in the annular stop 82 was applied under the condition of $0.62 \leq k \leq 1$. The lower limit 0.62 of k can be determined under such a condition that when the annular stop is set for the secondary light source images, the radius of necessary shield portion is equal to the radius of secondary light source images. For example, let us consider the illumination condition of σ=0.42 without changing the border circle CN (σ value 0.707) in CCM or PCM. In this case, $k = 0.42/0.707 \approx 0.594$. Then a σ value of not less than 0.45 is necessary for the numerical aperture NAs of central shield portion in the annular stop 82. However, since the size of secondary light source images is originally 0.42 of σ value, the value is inappropriate. This means that the original size of secondary light source images (σ=0.42) has a spatial coherency which is too high to form well-separated projection images of two contact hole patterns apart $0.61 \cdot M \cdot \lambda/NA_1$ ($= 0.61 \cdot \lambda/NAr_1$) on reticle. In other words, the illumination condition of σ=0.42 is initially inappropriate for projection of a plurality of adjacent contact hole patterns close at about $0.61 \lambda/NAr_1$ on reticle by the SFINCS method.

Also, when a pitch between a plurality of contact hole pattern images to be transferred onto wafer is about the size $D_1$ ($0.61 \cdot M \cdot \lambda/NA_1$ on reticle) and the SHRINC method is employed using four (or two) secondary light source images (four apertures in stop. 81, 84) having the optimized arrangement for the pitch, at two positions separated at pitch $M \cdot D_1$ to $2M \cdot D_1$ on reticle, the coherence function may take an approximately zero or negative (sign-inverted) value at one position relative to a value at the other position. When the pitch is $D_1$, the coherence function becomes negative if the arrangement of four light source images is optimum for the pitch $D_1$ in the SHRINC method while 0 if the arrangement of four light source images is optimum for the pitch $2 \times D_1$ in the SHRINC method.

Figure 64:
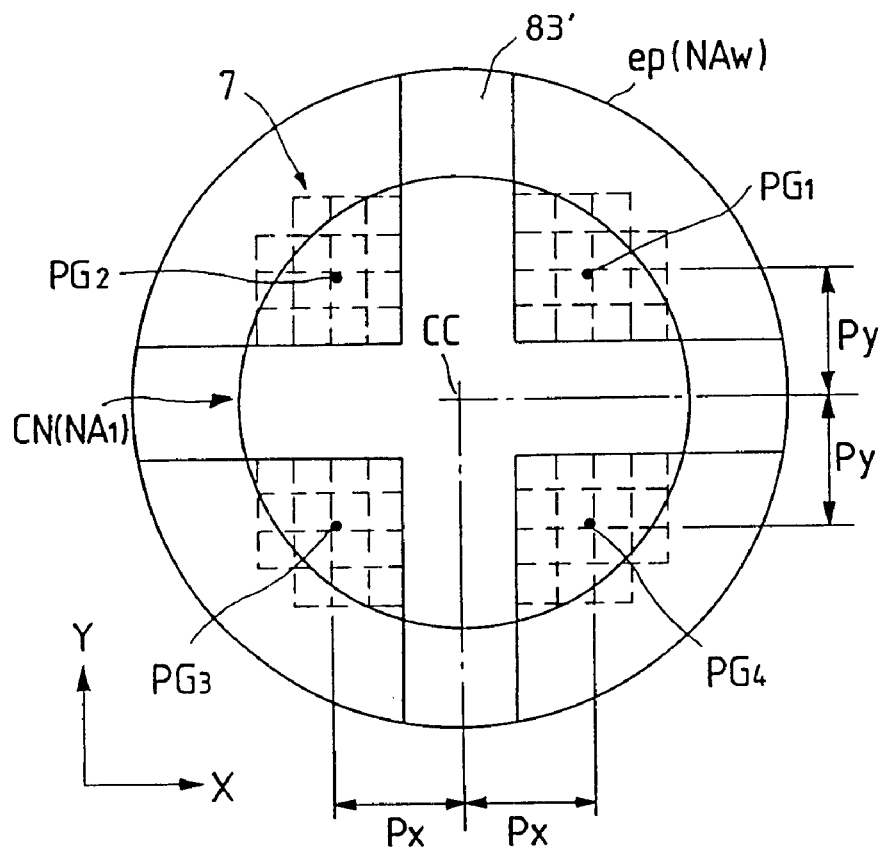
FIG. 64 is a schematic drawing to show a positional relation between the pupil of projection optical system and an exit plane projection image of fly's-eye lens after passing through a stop in the SHRINC method.

FIG. 64 shows an arrangement of image 83' in stop 83 on the pupil plane ep, which has a cross shield portion extending in the x and y directions and crossing at the center CC. In the arrangement, the x-directional or y-directional width of cross shield portion is set to be aligned with a border line between a plurality of square pillar elements constituting a fly's-eye lens 7. Further, it is preferable that each of four apertures defined by the cross shield portion includes the same number of elements of fly's-eye lens as much as possible.

In FIG. 64, the exit end plane of fly's-eye lens 7 is divided into four by the four apertures in the stop 83, and centroids $PG_1$ to $PG_4$ in respect of light quantity are shown by solid dots for the thus divided groups of fly's-eye lens elements. X-directional and y-directional offset amounts Px, Py of the light-quantity centroids $PG_1$ to $PG_4$ from the center CC correspond to the pitch $MD_1$ to $2MD_1$ of patterns on reticle.

Figure 65:
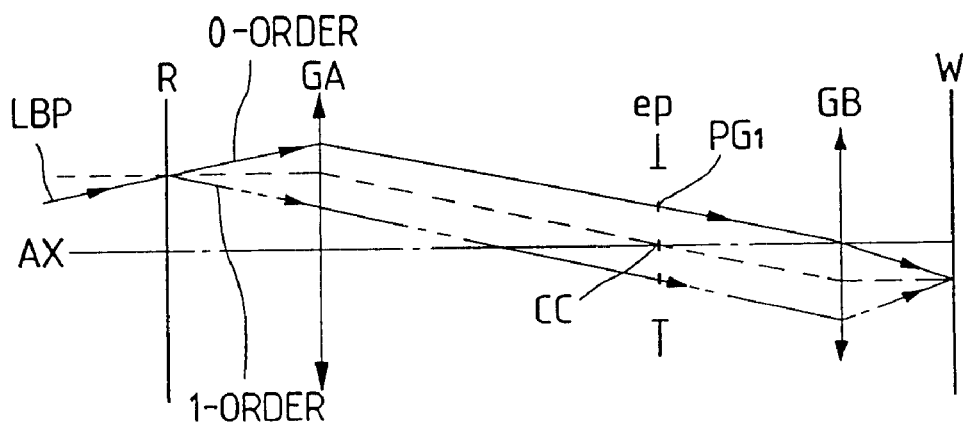
FIG. 65 is a ray diagram to illustrate the principle of SHRINC method.

The meaning of correspondence between the positions of centroids $PG_1$ to $PG_4$ and the pattern pitch $MD_1$ to $2MD_1$ can be explained from the principle of SHRINC method as shown in FIG. 65. If there are periodic patterns at pitch $MD_1$ to $2MD_1$ on reticle R, an illumination beam LBP emergent from the light-quantity centroid of one element group among the four divided groups in the fly's-eye lens is incident into the reticle as inclined relative to the principal ray (broken line) normal to the reticle. The zeroth order ray from the reticle pattern passes through the point $PG_1$ in the pupil ep in the projection lens PL (front-group lens GA and rear-group lens GB). This point $PG_1$ is the light-quantity centroid $PG_1$ in FIG. 64.

On the other hand, a first-order-diffracted ray from the reticle patterns advances symmetrically with the zeroth-order ray with respect to the principal ray (broken line) so that it may be made to pass through a point symmetric with the point $PG_1$ with respect to the center CC on the pupil plane ep. In case that the patterns have a pitch in the x direction, the first-order-diffracted ray therefrom passes through the position of light-quantity centroid $PG_2$ in the pupil ep in FIG. 26; if the patterns have a pitch in the y direction, the first-order-diffracted ray therefrom passes through the position of light-quantity centroid $PG_4$ in FIG. 26.

The inclination of illumination ray LBP, that is, the offset amount Px, Py of light-quantity centroids of four segmental, groups in the fly's-eye lens, is determined, depending upon the pattern pitch so as to obtain such a state.

If the pitch of at least two contact hole pattern images transferred onto the, wafer is $D_1$ to $2D_2$, the exposure wavelength is i-line ($\lambda=0.365$ μm), the wafer-side numerical aperture $NA_1$ of circular transmissive portion FA is 0.707 NAw, and the wafer-side numerical aperture NAw of projection lens is 0.57, from $D_1=0.61$ $\lambda/NA_1$, the pitch $D_1$ is about 0.55 μm (2.76 μm on reticle). Also, if the distance $D_1$ on wafer is considered as the pitch, the incident angle $\theta_k$ of optimum illumination ray LBP (see FIG. 65) into the reticle in the SHRINC method is defined as $\sin 2\theta_k = \lambda/MD_1$. From this equation, $M \cdot \sin \theta_k \approx \lambda/2D_1$ is the same value as the wafer-side numerical aperture NAk of the zeroth-order ray from the illumination ray LBP. Then the following equation holds.

$$NAk = \lambda/2D_1 = \lambda/2(0.61\ \lambda/NA_1) = NA_1/1.22$$

It thus suffices that the position of light-quantity centroid for correspondence to the distance $D_1$ to $2D_1$ is located in the range of NAk to NAk/2 as the wafer-side numerical aperture. Specifically, if Px=Py, as shown in FIG. 64, each centroid $PG_1$ to $PG_4$ is located on a circle (radius Px √2) between $NA_1/1.22$ and $NA_1/2.44$ for the circle CN with numerical aperture $NA_1$.

The embodiments of the present invention and their operations were described above. In the arrangements in which the illumination beam ILB to the reticle has a specific polarization direction, means for photoelectrically detecting a part of beam passing through the projection optical system may be provided on the wafer stage WST in order to judge whether the polarization direction is appropriate or not, or to judge whether the imaging beam passing through the PCM has a good polarization state or not. Also, a part of the illumination system can be arranged to be exchangeable as to fit the SHRINC method by retracting the coherence reducing member CCM out of the projection optical system, if a reticle with line-and-space pattern is used. Further, if the irregular illumination system such as the light source of SHRINC method or annular illumination is used together with the CCM in projection exposure of contact hole pattern, the system may be arranged such that only the CCM can be removed upon exchange from one for reticle contact hole to another for line-and-space to be exposed.

Although in the embodiments of the present invention the CCM or PCM is located on the Fourier transform plane of projection optical system, it may be located slightly away from the Fourier transform plane, depending upon the structure or the combined state of optical elements in the projection optical system. For example, in case of a projection lens constructed as shown in FIG. 5, the CCM may be provided at a position in air gap near a second or third lens (on the reticle side) above the lowermost lens $GA_1$ in the front-group lens system GA. Namely, the CCM may be located wherever a beam distribution there is almost equal to a distribution of imaging beam in the pupil ep in projection of hole pattern. Accordingly, the plane near the pupil in the present invention means an arbitrary position within a region where the beam distribution on the Fourier transform plane is maintained to some extent as described.

Fifth Embodiment

The fifth embodiment of the present invention is next described.

The coherence reducing means CCM in the present embodiment has a light-shielding region around the optical axis, and first and second annular regions outside the light-shielding region.

As shown in previous FIG. 37, a range of angle of incidence of image beams $LFb_2$, $LFb_3$ into wafer W is from $\theta_1$ to $\theta_w$. Relations between angles $\theta_1$, $\theta_w$ and radii $r_1$, $r_2$, $r_3$ are given as follows from the sine condition using a constant $\alpha$.

$$\alpha \cdot \sin \theta_w = \alpha \cdot NA = r_2$$

$$\alpha \cdot \sin \theta_1 = r_1$$

$$\alpha \cdot \sin \theta_3 = r_3$$

Accordingly, the radius $r_2$ of pupil plane FTP is a quantity proportional to the numerical aperture NA of projection optical system.

Also, a range of angle of incidence of beam $LFb_2$ into wafer, passing through a first annular region ranging from the radius $r_1$ to the radius $r_3$ on the pupil plane FTP, is from $\theta_1$ to $\theta_3$, while a range of angle of incidence of beam $LFb_3$ into wafer, passing through a second annular region ranging from the radius $r_3$ to the radius $r_2$, is from $\theta_3$ to $\theta_w$.

In the conventional projection optical system without CCM, image formation was negatively affected by a sum of optical path length differences $\Delta Z_1$, $\Delta Z_2$, $\Delta Z_3$ in FIG. 37, which is an amount represented by the following formula (and corresponding to the wavefront aberration).

$$(\Delta F \cdot NA_w^2)/2 = (\Delta F \cdot r_2^2)/2\alpha^2$$

Meanwhile, if relations between the radii $r_1$ to $r_3$ are determined close to the following relations:

$$r_1 = 0.5 \cdot r_2$$

and $$r_3 = 0.8 \cdot r_2,$$

the path length differences $\Delta Z_2$ and $\Delta Z_3$ become as follows:

$$\Delta Z_2 = (\Delta F \cdot (r_3^2 - r_1^2))/2\alpha^2$$
$$= 0.39 \times (\Delta F \cdot r_2^2)/2\alpha^2$$

-continued $$\Delta Z_3 = (\Delta F \cdot (r_2^2 - r_3^2))/2\alpha^2$$
$$= 0.36 \times (\Delta F \cdot r_2^2)/2\alpha^2$$

Thus, substantial optical path length differences due to defocus become about 40 or less % of those in the conventional technology.

Figure 66:
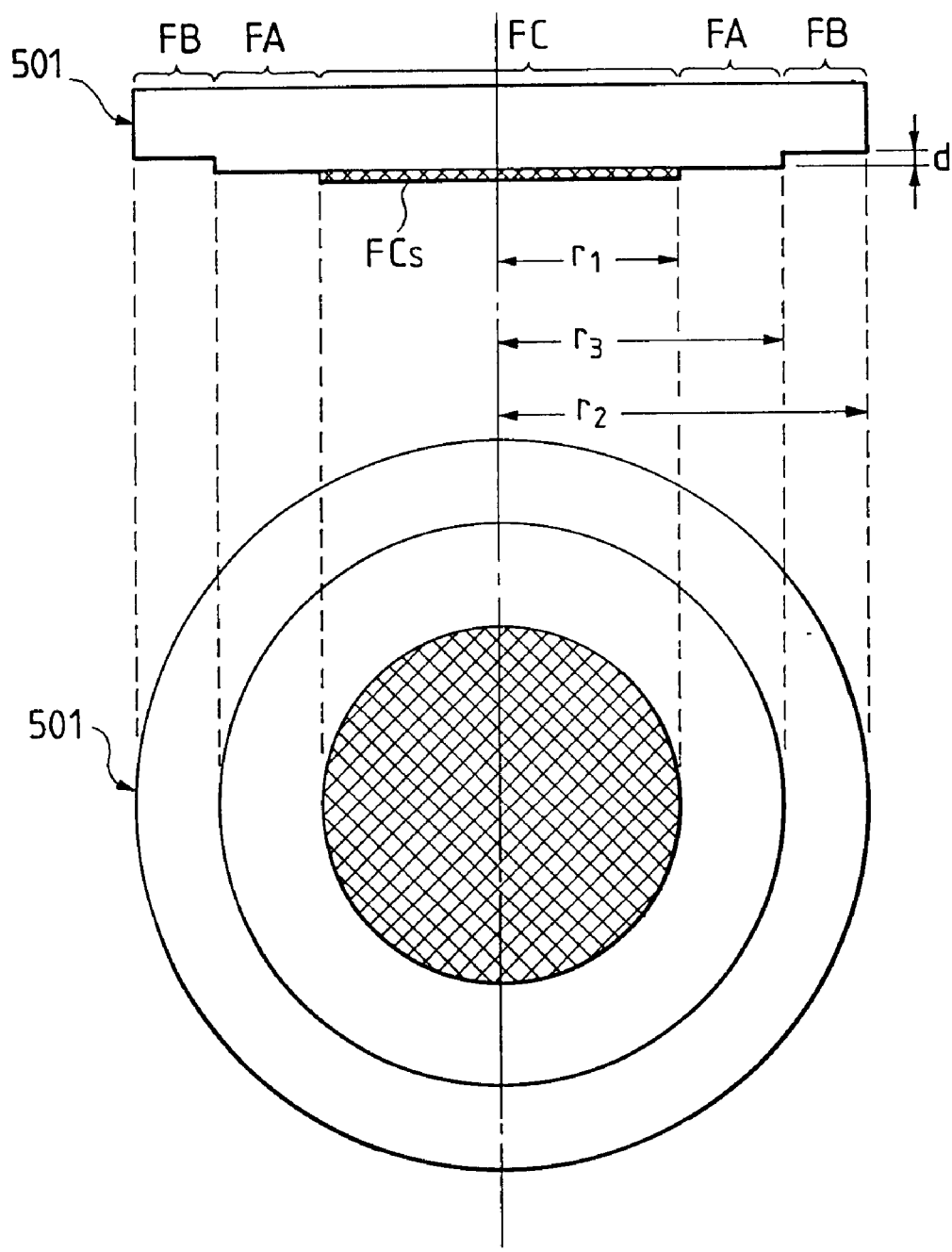
FIG. 66 is a cross section and a plan view to show a first specific example of CCM according to the fifth embodiment of the present invention.

FIG. 66 shows the construction of the CCM according to the present embodiment.

CCM 501 is constructed of a transparent plane-parallel plate having a step d, in which the radius $r_3$ of the step portion is determined by the following relation with the radius $r_2$ of the periphery (i.e., the radius of the pupil plane).

$$r_3 = 0.8 r_2$$

Further, a light-shielding member $FC_s$ is formed around the center by a method, for example, of the metal vapor deposition, the radius $r_1$ of which is determined as follows.

$$r_1 = 0.5 r_2$$

In the present embodiment the following description refers to the light-shielding region around the optical axis as a region FC, the first annular region in the radius range of $r_1$ to $r_3$ as a region FA, and the second annular region in the radius range of $r_3$ to $r_2$ as a region FB.

The light from the mercury lamp 1 in FIG. 4 is in a random polarization state and the coherent length $\Delta$Lc thereof is very short, about 26 μm as described previously. Accordingly, similarly as obtained in the second embodiment as described previously, the relation between transmitted light by the region FA and transmitted light by the region FB can be incoherent if the above step d is determined to satisfy the relation of $(n-1)$ d $\geq$ $\Delta$Lc. For example, for an index of refraction n being 1.5, a sufficient step d is not less than 52 μm.

Figure 67:
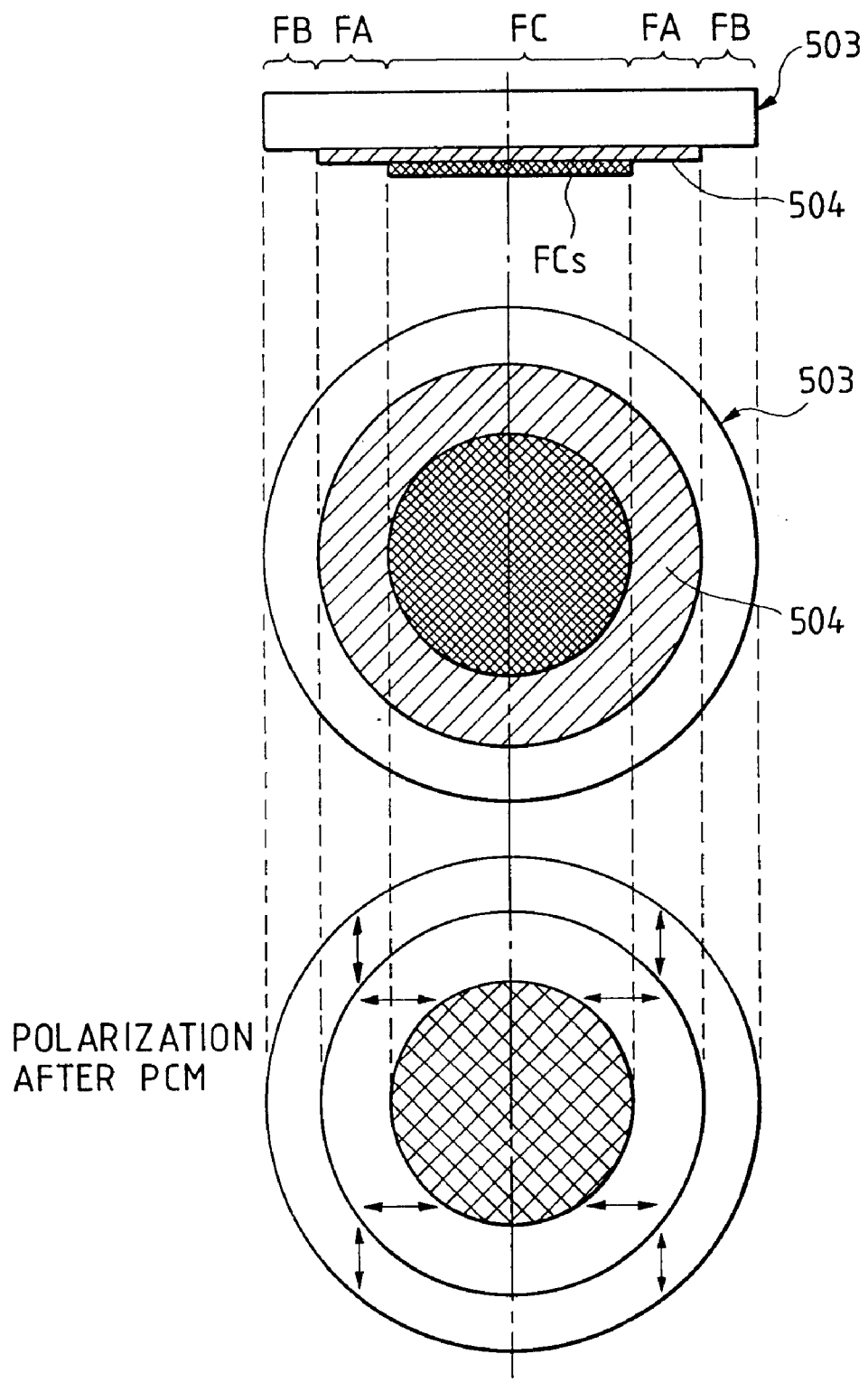
FIG. 67 is a cross section and a plan view to show a second specific example of CCM.

Here, various modifications are possible for CCM 501, according to the modifications listed in the second embodiment. Further, it can be constructed of PCM as shown as EMBODIMENT 1–11 in FIG. 7 in the first embodiment; or it is also possible, as shown in FIG. 67, that a half wave plate 504 for example of quartz is bonded to a transparent substrate to form the first annular region FA and a circular light-shielding portion $FC_s$ is provided in the central area to form the region FC. Or, a quarter wave plate may be set in each of the first and second annular regions FA, FB.

Next described are the functions and effects attained by the fifth embodiment, based on simulation results.

Figure 68A:
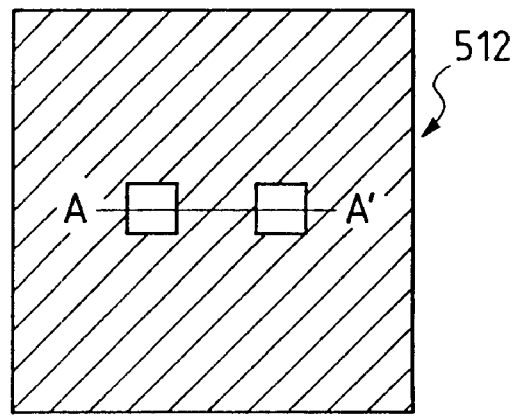
Figure 68B:
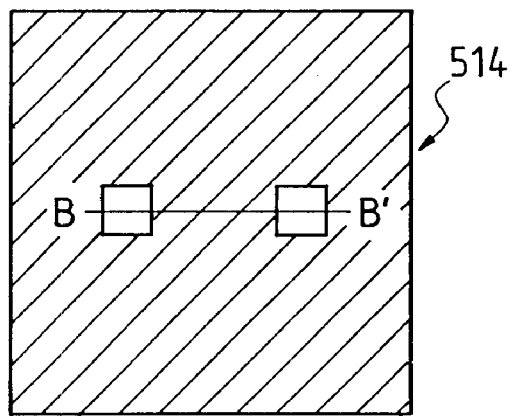

FIGS. 68A and 68B show two types of two proximate hole patterns, used in the below simulations. Each of the two hole patterns is formed as a square aperture, the dimensions of which are determined in such a manner that, when projected onto a wafer, one side thereof becomes 0.3 μm. The pattern 512 shown in FIG. 68A is so designed that the distance between the centers of apertures is 0.75 μm when projected onto a wafer. Further, the pattern 514 shown in FIG. 68B is so designed that the distance between the centers of apertures is 1.05 μm when projected onto a wafer. The wavelength of illumination light is 0.365 μm (the i-line), the wafer-side numerical aperture of projection optical system is 0.57, and the a value of illumination optical system is 0.6. Under the above conditions, the below simulations evaluate image intensity distributions on wafer in the direction of A–A' and B–B' cross sections.

First, the simulation results of the CCM according to the present embodiment are shown with respect to the pattern 512 and pattern 514. The CCM used herein has such a shape that the following conditions are satisfied by the radius $r_1$ of the light-shielding member $FC_s$ and the boundary radius $r_3$ between the first and second annular regions FA and FB relative to the radius $r_2$ of the pupil plane (the radius of the region defining the numerical aperture of projection optical system on the Fourier transform plane).

$$r_1 = 0.50 \cdot r_2$$
$$r_3 = 0.80 \cdot r_2$$

Figure 69A:
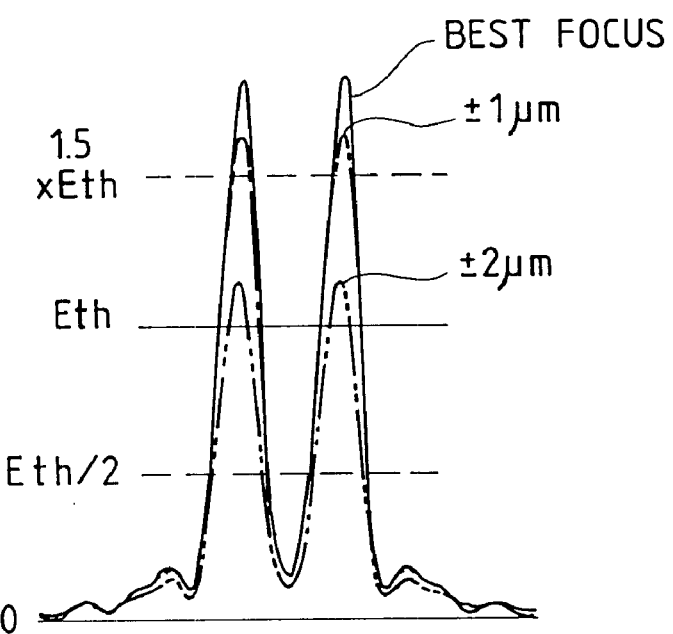
FIGS. 69A and 69B are graphs of light image intensity distributions to show simulation results of the effects of the fifth embodiment with the two types of hole patterns.
Figure 69B:
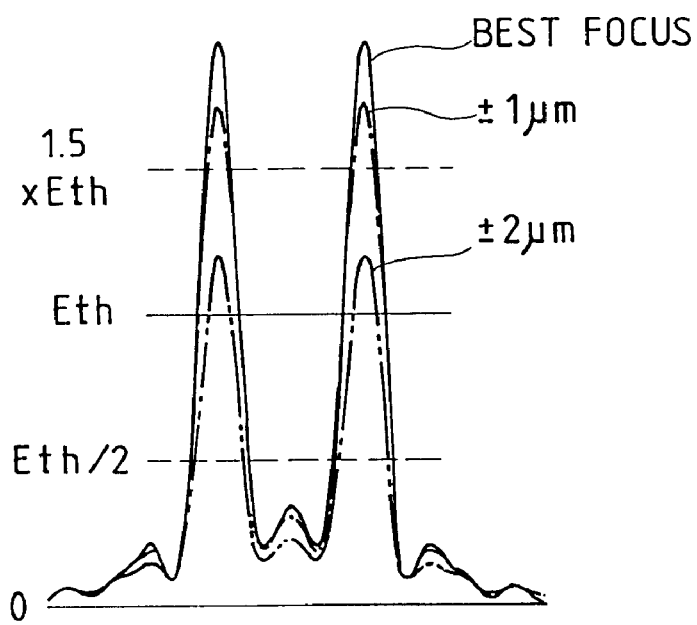

FIG. 69A shows the simulation results for pattern 512 and FIG. 69B the simulation results for pattern 514. In each figure, a solid line represents an image intensity distribution at the best focus position, a chain line an image intensity distribution at defocus positions of ±1 μm, and a chain double-dashed line an image intensity distribution at defocus positions of ±2 μm. Also, the energy value Eth in each figure represents exposure energy necessary for completely dissolving the positive photoresist. It is thus considered that the slice width of an optical image under the energy value Eth in figure is the diameter of a hole pattern formed on a wafer. In each figure the vertical magnification of image intensity distribution (corresponding to exposure time) was so set that the slice width of optical image under the energy value Eth became 0.3 μm for the image intensity distribution (solid line) at the best focus position.

Observing FIGS. 69A and 69B, it is understood that the image (chain line) of hole pattern at the ±1 μm defocus position is little changed as compared with the image (solid line) at the best focus. position. Namely, the above simulation results show that the contact hole patterns can be projection-exposed with a great depth of focus. As shown in FIG. 69A, it is seen that sufficient resolution is secured for two proximate hole patterns and that there is no light peak which could cause an unnecessary transfer pattern, between the two hole patterns.

Figure 70A:
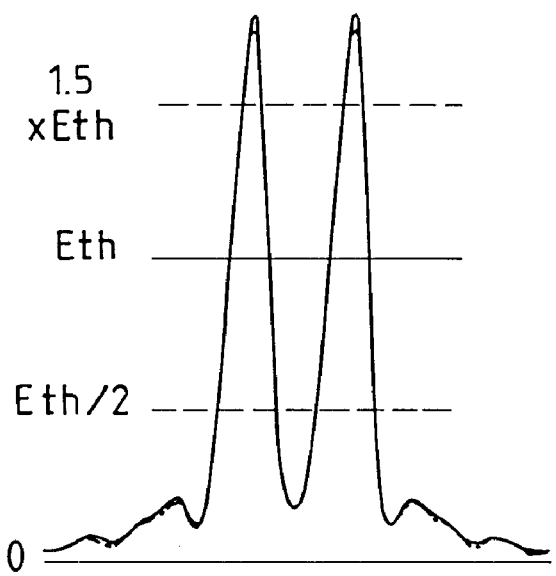
FIGS. 70A and 70B are graphs of light image intensity distributions to show simulation results in combination with the FLEX method, with the two types of the hole patterns.
Figure 70B:
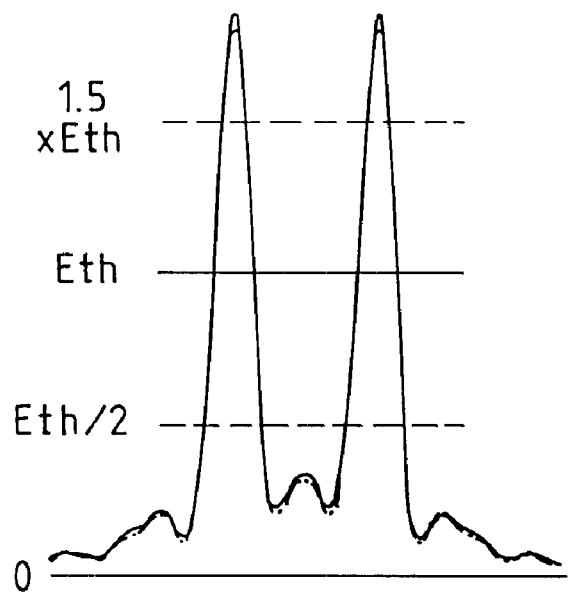

FIGS. 70A and 70B show simulation results where the FLEX method is further used under the above conditions. The exposure condition of the FLEX method is double divisional exposure in which two exposure processes are conducted at defocus positions ±2.25 μm away from the best focus position, i.e., at two positions 4.5 μm separate from each other. As shown, image intensity distributions at the best focus, ±1 μm defocus, and ±2 μm defocus are almost superimposed on each other, thus verifying that the depth of focus is extremely large. Further, the combined use of the FLEX method also shows a high capability of separation of two proximate holes and causes no unnecessary light peak between the proximate holes.

As a modification of the FLEX method, for example, the wafer in exposure may be continuously moved or vibrated in the direction of the optical axis, attaining the same effects. It is also possible to employ the method for stepwise controlling the speed in continuous movement of wafer as described in Japanese Laid-open Patent Application No. 5-13305 (corresponding to U.S. Pat. No. 5,343,270).

A most suitable distance between the two exposure positions in the FLEX method is approximately as follows:

$$4 \cdot \lambda / NA^2 = 4 \times 0.365 / 0.57^2$$
$$= 4.5 \, \mu m$$

as used in the embodiment. It was, however, found that sufficient effects were observed within the range of about ±20% deviation of this value from various simulations. If the FLEX method is carried out to continuously move the wafer at a nearly equal speed, the movement range is preferably set to 1.5 or more times the above distance.

Here, the above values:

$$r_1 = 0.5 \cdot r_2$$

$$r_3 = 0.8 \cdot r_2$$

are optimum values resulting from a number of simulations by the present inventors, but similarly good imaging performance can be achieved in the following ranges.

$$0.45 r_2 \leq r_1 \leq 0.55 r_2$$

$$0.75 r_2 \leq r_3 \leq 0.85 r_2$$

Figure 71A:
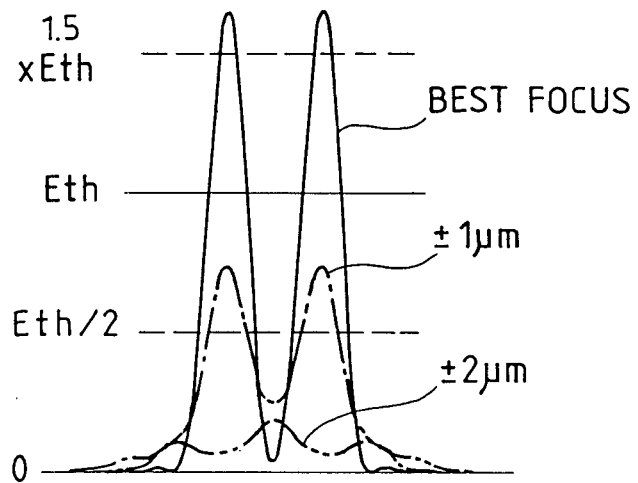
FIGS. 71A and 71B are graphs of image intensity distributions to show simulation results of the conventionally ordinary exposure method with the two types of hole patterns.
Figure 71B:
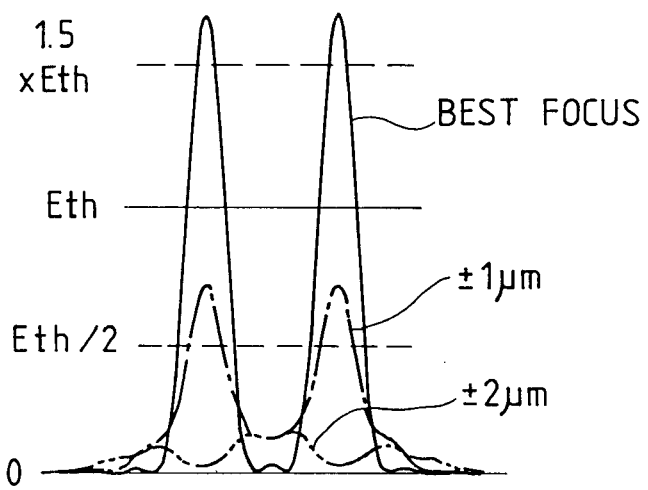

FIGS. 71A and 71B show simulation results of conventionally ordinary exposure without using CCM for comparison's sake, where FIG. 71A shows an optical image of pattern 512 and FIG. 71B an optical image of pattern 514. In either case, an image at the ±1 μm defocus positions is partly degraded as compared with an image at the best focus position.

Figure 72A:
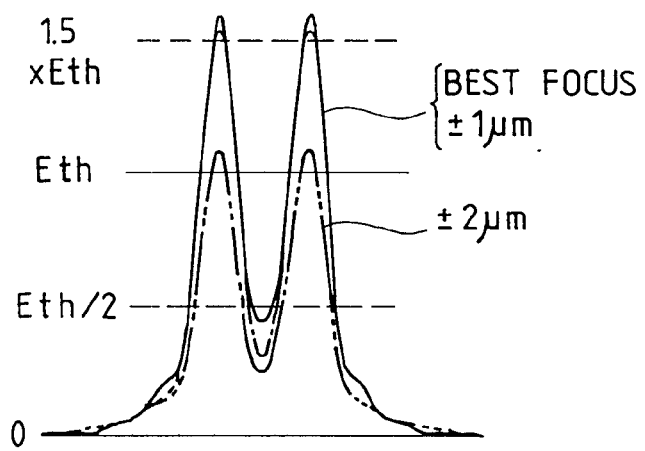
FIGS. 72A and 72B are graphs of image intensity distributions to show simulation results of the conventionally ordinary exposure method in combination with the FLEX method, with the two types of hole patterns.
Figure 72B:
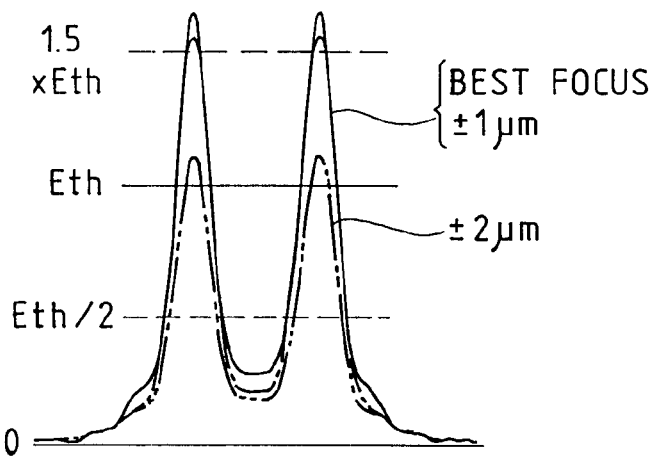

FIGS. 72A and 72B also show simulation results where the FLEX method is applied to the conventionally ordinary exposure for comparison's sake. The FLEX method here employed exposure at three discrete points 1.5 μm away from each other. The combination of the ordinary exposure with the FLEX method can make an image at the ±1 μm defocus positions close to an image at the best focus position (i.e., can increase the depth of focus). However, as seen from FIG. 72A, the image intensity between the two holes becomes close to the energy value Eth/2 in the image of pattern 512 with extremely proximate holes, resulting in insufficient separation of the two holes. Namely, because the energy value Eth/2 is coincident approximately to an exposure amount with which a film reduction starts in a positive photoresist, there is a possibility that the simple use of the FLEX method causes the film reduction of intermediate photoresist between the two holes so as to form the two-holes connected to each other.

In contrast, the images obtained by the respective embodiments of the present invention are formed with a sufficiently small amount of light in the intermediate portion between the two holes and thus without any possibility of film reduction.

FIGS. 73A and 73B and FIGS. 74A and 74B are simulation results in the conventional Super-FLEX methods for comparison's sake, using, in addition to the same simulation conditions, a bifocal filter giving a phase difference of π between the image-forming light distributed in the central portion of pupil (for example, in the circular region of radius $r_1$ around the optical axis AX) and the image-forming light distributed in the peripheral portion thereof (for example, in the annular region of the inner radius $r_1$ and the outer radius $r_2$). Further, the radii were set as $r_1 = 0.4 \times r_2$ in FIGS. 73A and 73B and as $r_1 = 0.3 \times r_2$ in FIGS. 74A and 74B. Here, $r_2$ is the radius of the pupil plane, which is the radius defining the numerical aperture NA of projection optical system.

Figure 73A:
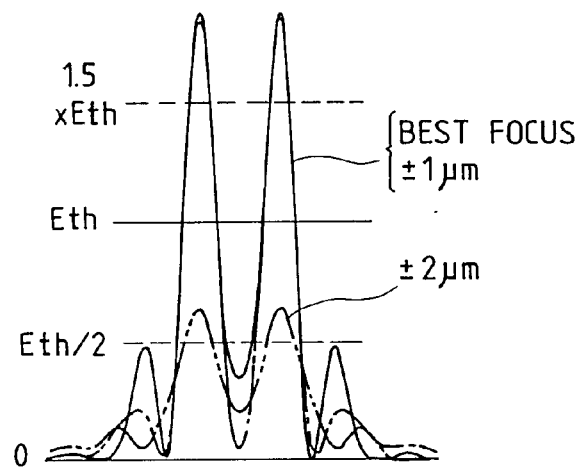
FIGS. 73A and 73B are graphs of image intensity distributions to show simulation results of the conventionally ordinary exposure method in combination with the Super-FLEX method (1), with the two types of hole patterns.
Figure 73B:
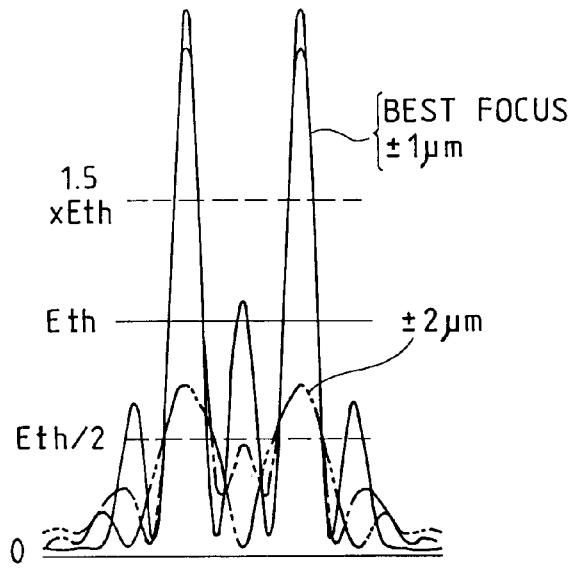

In either case of FIGS. 73A and 73B, a sufficiently large depth of focus was obtained. In more detail, an image at the best focus position is almost superimposed on an image at the ±1 μm defocus positions, but unnecessary subpeaks (ringings) are very large around the original patterns. As seen especially from FIG. 73B, the image of hole patterns considerably away from each other, such as the pattern 514, produces a very light ghost image because ringings of the two holes are added in the intermediate region. This would result in erroneous transfer of unnecessary hole patterns between the two holes, and, therefore, such a pupil filter cannot be actually used.

Figure 74A:
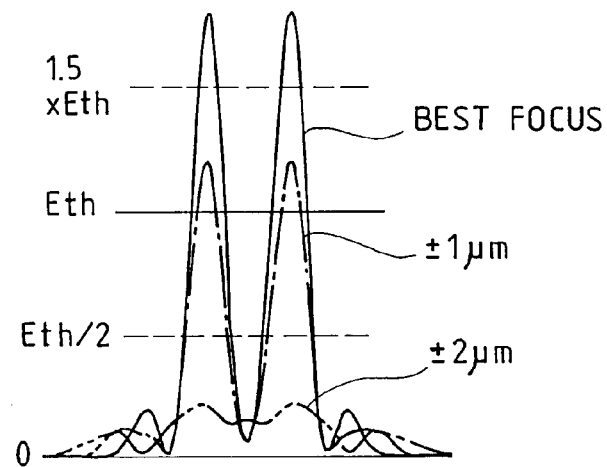
FIGS. 74A and 74B are graphs of image intensity distributions to show simulation results of the conventionally ordinary exposure method in combination with the Super-FLEX method (2), with the two types of hole patterns.
Figure 74B:
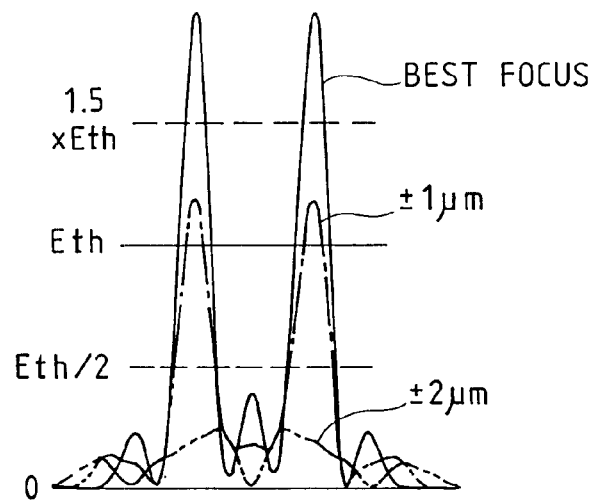

On the other hand, because the value of radius $r_1$ is set smaller in FIGS. 74A and 74B, ringings are somewhat smaller, but a difference becomes greater between an image at the best focus position and an image at the ±1 μm defocus positions, failing to obtain a practically sufficient depth of focus.

As described above, with the bifocal filter (phase difference filter) conventionally proposed, the depth of focus and ringings greatly vary depending upon the value of radius $r_1$, and it is, therefore, impossible to obtain an optimum radius $r_1$ which should be suitable for either case.

In contrast, the present embodiment shows sufficiently small ringings while maintaining a sufficiently large depth of focus, and has a high capability of separation of proximate hole patterns.

The light-shielding member $FC_s$ in the central portion of CCM may be arranged to absorb exposure light but transmit the alignment illumination light in the wavelength region different from the exposure light, or a liquid cooling mechanism or the like may be provided for preventing heating of metal plate due to absorption of exposure light.

Also, the above light-shielding member $FC_s$ may be formed of a multilayer film or the like reflecting the exposure light.

The two hole patterns used in the above simulations are patterns which have one side of 0.3 μm when projected onto the wafer. Namely, if the projection magnification of projection optical system is ⅕, it is normally obtained by projecting a pattern with one side of 1.5 μm on a reticle, onto a wafer. However, the size of the pattern on reticle does not always have to be a size according to the projection magnification. Since the size of the pattern formed on wafer is affected by a change in exposure amount, a pattern with one side of 0.3 μm on wafer can be formed, for example, by transferring a hole pattern in the size of 2.0 μm on reticle (which is 0.4 μm on wafer if the projection magnification is ⅕) while controlling the exposure amount.

Further, the projection exposure apparatus according to the present embodiment may employ exposure combined with a so-called halftone type phase shift reticle, as disclosed in U.S. Pat. No 4,890,309, or a phase shift reticle of another type.

What is claimed is:

1. A projection exposure apparatus comprising:

illuminating means for supplying illumination light to illuminate a mask having a fine pattern;

a projection optical system for receiving emergent light from the pattern of said mask to project a focused image of said pattern onto a sensitized base; and polarization state control means disposed on a Fourier transform plane or on a close plane thereto in an image-forming optical path between said mask and said sensitized base, for making a mutual difference in polarization state between an image-forming beam passing through a circular region around an optical axis of said projection optical system on said Fourier transform plane or on the close plane thereto and an image-forming beam passing through a region outside said circular region.

2. A projection exposure apparatus according to claim 1, wherein said illuminating means comprises a polarization control element for arranging polarization of said illumination light in a specific state.

3. A projection exposure apparatus comprising:

illuminating means for supplying illumination light to illuminate a mask having a fine pattern;

a projection optical system for receiving emergent light from the pattern of said mask to project a focused image of said pattern onto a sensitized base; and polarization state control means disposed on a Fourier transform plane or on a close plane thereto in an image-forming optical path between said mask and said sensitized base, for making a mutual difference in polarization state between an image-forming beam passing through a first annular region around an optical axis of said projection optical system on said Fourier transform plane or on the close plane thereto and an image-forming beam passing through a second annular region outside said first annular region.

4. A projection exposure apparatus according to claim 3, wherein said illuminating means comprises a polarization control element for arranging polarization of said illumination light in a specific state.

5. A projection exposure apparatus comprising:

illuminating means for supplying illumination light to illuminate a mask having a fine pattern;

a projection optical system for receiving emergent light from the pattern of said mask to project a focused image of said pattern onto a sensitized base;

first means disposed on a Fourier transform plane or on a close plane thereto in an image-forming optical path between said mask and said sensitized base, for making a mutual difference polarization state between a beam passing through a circular region around an optical axis of said projection optical system on said Fourier transform plane or on the close plane thereto and a beam passing through a region outside said circular region; and second means disposed in said illuminating means, for producing first illumination light and second illumination light having mutually different polarization properties and being temporally incoherent with each other.

6. A projection exposure apparatus comprising:

illuminating means for supplying illumination light to illuminate a mask having a fine pattern;

a projection optical system for receiving emergent light from the pattern of said mask to project a focused image of said pattern onto a sensitized base;

first means disposed on a Fourier transform plane or on a close plane thereto in an image-forming optical path between said mask and said sensitized base, for making a mutual difference in polarization state between an image-forming beam passing through a first annular region around an optical axis of said projection optical system on said Fourier transform plane or on the close plane thereto and an image-forming beam passing through a second annular region outside said first annular region; and second means disposed in said illuminating means, for producing first illumination light and second illumination light having mutually different polarization properties and being temporally incoherent with each other.

7. A projection exposure apparatus comprising:

illuminating means for supplying illumination light to illuminate a mask having a fine pattern;

a projection optical system for receiving emergent light from the pattern of said mask to project a focused image of said pattern onto a sensitized base; and polarization state control means disposed on a Fourier transform plane or on a close plane thereto in an image-forming optical path between said mask and said sensitized base, for making a mutual difference in polarization state between a plurality of image-forming beams respectively passing through a plurality of concentric, different regions around an optical axis of said projection optical system on said Fourier transform plane or on the close plane thereto.

8. A projection exposure apparatus according to claim 7, wherein said polarization state control means comprises a pair of polarizing plates for making polarization direction of beams passing through at least two regions out of said plurality of regions, perpendicular to each other.

9. A projection exposure apparatus according to claim 7, wherein said polarization state control means comprises a combined member of a pair of polarizing plate and a quarter-wave plate for making polarization states of beams passing through at least two regions out of said plurality of regions, converted into circularly polarized states rotating opposite to each other.

10. A projection exposure apparatus according to claim 7, wherein said polarization state control means comprises a quarter-wave plate.

11. A projection exposure apparatus according to claim 7, wherein said polarization state control means comprises a half-wave plate.

12. A projection exposure apparatus according to claim 7, wherein said polarization state control means comprises an optically rotatory material.

13. A projection exposure apparatus according to claim 7, wherein said polarization state control means comprises a circular or annular shield member around the optical axis of said projection optical system, which is disposed on the Fourier transform plane in said image-forming optical path or in the vicinity thereof.

14. A projection exposure apparatus, comprising:

a projection optical system which is disposed between a mask illuminated with an illumination light and a substrate exposed with said illumination light, and which emits light from a pattern of said mask onto said substrate; and a polarization member which is disposed between said mask and said substrate, and which transforms the light from said pattern into plural lights different from each other in polarization characteristics.

15. A projection exposure apparatus according to claim 14, wherein said polarization member has a first region and a second region through which the light from said pattern passes, and which differentiates light passing through said first region from light passing through said second region in polarization characteristics.

16. A projection exposure apparatus according to claim 15, wherein said polarization member is disposed on an optical Fourier transform plane opposed to a surface of said pattern of said mask or on a plane close to said Fourier transform plane, and said first region and said second region are disposed on said Fourier transform plane or on a plane close thereto.

17. A projection exposure apparatus according to claim 15, wherein said polarization member crosses polarization directions with one another between the light passing through said first region and the light passing through said second region.

18. A projection exposure apparatus according to claim 17, wherein said polarization member has a polarizing plate which makes polarization states of the light passing through said first region and the light passing through said second region, converted into circularly polarized states rotating opposite to each other.

19. A projection exposure apparatus according to claim 17, wherein said first region has a first polarizing plate which allows linearly polarized light in a predetermined direction to transmit through said first polarizing plate, and said second region has a second polarizing plate which allows linearly polarized light in a direction perpendicular to said predetermined direction to transmit through said second polarizing plate.

20. A projection exposure apparatus according to claim 15, wherein said polarization member has a quarter-wave plate on an exit surface side of said polarization member.

21. A projection exposure apparatus according to claim 20, wherein said polarization member comprises a quarter-wave plate or a half-wave plate.

22. A projection exposure apparatus according to claim 15, wherein said first region has a center on an optical axis of said projection optical system, and said second region is outside said first region.

23. A projection exposure apparatus according to claim 22, wherein said first region is a circular region with a center on the optical axis of said projection optical system, and said second region is outside said circular region.

24. A projection exposure apparatus according to claim 23, wherein an area of said circular region is approximately half of an effective aperture area of a Fourier transform plane in said projection optical system.

25. A projection exposure apparatus according to claim 15, wherein said first region is an annular region with a center on an optical axis of said projection optical system, and said second region is inside or outside said annular region.

26. A projection exposure apparatus according to claim 15, further comprising:
a light shielding member in a shape of a circle or annulus with a center on an optical axis of said projection optical system being disposed on a Fourier transform plane or on a plane close thereto.

27. A projection exposure apparatus according to claim 26, further comprising:
a driving mechanism to interchange at least one of said polarization member and said light shielding member.

28. A projection exposure apparatus according to claim 15, wherein said first region is a circular region with a center on an optical axis of said projection optical system, said second region has annular regions of a number n which surround at least double outside said circular region, and said plural lights pass through at least two regions of said circular region and said annular regions of the number n.

29. A projection exposure apparatus according to claim 28, wherein said annular regions of the number n are different from each other in polarization characteristics.

30. A projection exposure apparatus according to claim 29, wherein areas of said at least two regions are approximately equal to each other.

31. A projection exposure apparatus according to claim 15, further comprising:
a light source to provide said illumination light; an illumination optical system disposed between said light source and said mask to illuminate said mask based on light from said light source; and a polarization controller disposed in said light source or in an optical path between said light source and said polarization member to arrange a polarization of the light from said pattern in a predetermined state.

32. A projection exposure apparatus according to claim 31, wherein said first region has a polarizing plate to further polarize a polarized state of the light from said pattern; and said second region has an optical element to maintain the polarized state of the light from said pattern.

33. A projection exposure apparatus according to claim 31, wherein said first region has a first polarizing plate to polarize a polarized state of the light from said pattern into a first polarized state; and said second region has a second polarizing plate to polarize the polarized state of the light from said pattern into a second polarized state different from said first polarized state.

34. A projection exposure apparatus according to claim 15, further comprising:
a light source to provide said illumination light; an illumination optical system disposed between said light source and said mask to illuminate said mask based on light from said light source; and a polarization controller disposed in said light source or in an optical path of said illumination optical system to produce a first illumination light of which a polarization characteristic is arranged and a second illumination light which is different from said first illumination light in polarization characteristic and temporally incoherent with said first illumination light.

35. A projection exposure apparatus according to claim 34, wherein said first region has a polarizing plate to further polarize a polarized state of the light from said pattern; and said second region has an optical element to maintain the polarized state of the light from said pattern.

36. A projection exposure apparatus according to claim 34, wherein said first region has a first polarizing plate to polarize a polarized state of the light from said pattern into a first polarized state; and said second region has a second polarizing plate to polarize the polarized state of the light from said pattern into a second polarized state different from said first polarized state.

37. A projection exposure apparatus according to claim 14, further comprising:
a movement mechanism to move said substrate and said projection optical system relatively in a direction of an optical axis of said projection optical system.

38. A method for uniformly illuminating a mask on which a fine pattern is formed, with illumination light for exposure having a predetermined range of incident angle and projecting the light from said mask as an image-forming beam through a projection optical system onto a sensitized base, whereby said sensitized base is subjected to exposure by a projected image of said pattern, comprising the steps of:
separating the image-forming beam distributed, on a Fourier transform plane or on a close plane thereto in said projection optical system into a circular region around an optical axis of said projection optical system and an annular region surrounding said circular region; and
making a polarization state of an image-forming beam passing through said circular region and reaching said sensitized base, different from a polarization state of an image-forming beam passing through said annular region and reaching said sensitized base.

39. A method according to claim 38, wherein an area of said circular region is approximately a half of an effective aperture area of said Fourier transform plane in said projection optical system.

40. A method for uniformly illuminating a mask on which a fine pattern is formed, with illumination light for exposure having a predetermined range of incident angle and projecting the light from said mask as an image-forming beam through a projection optical system onto a sensitized base, whereby said sensitized base is subjected to exposure by a projected image of said pattern, comprising the steps of:

separating an image-forming beam distributed on a Fourier transform plane or on a close plane thereto in said projection optical system into a circular region around an optical axis of said projection optical system and a plurality of annular regions at least doubly surrounding said circular region; and making different from each other a polarization state of an image-forming beam passing through said circular region and reaching said sensitized base and polarization states of at least two image-forming beams out of a plurality of image-forming beams comprising image-forming beams respectively passing through said plurality of annular regions and reaching said sensitized base.

41. A method according to claim 40, wherein areas of said circular region and said at least two annular regions are approximately equal to each other.

42. An method for uniformly illuminating a mask on which a fine pattern is formed, with illumination, light for exposure having a predetermined range of incident angle and projecting the light, from said mask as an image-forming beam through a projection optical system onto a sensitized base, whereby said sensitized base is subjected to exposure by a projected image of said pattern, comprising the steps of:

separating an image-forming beam distributed on a Fourier transform plane or on a close plane thereto in said projection optical system into a plurality of different, concentric regions around an optical axis of said projection optical system;

making a mutual difference between polarization states of at least two image-forming beams out of a plurality of image-forming beams respectively passing through said plurality of regions and reaching said sensitized base; and moving said sensitized base along the optical axis of said projection optical system in a period between an exposure start and an exposure end in exposure of said sensitized base.

43. A projection exposure method of illuminating a mask formed with a pattern to project light from said pattern onto a substrate, comprising:

transforming the light from said pattern into plural lights different from each other in polarization characteristic by a polarization member disposed between said mask and said substrate; and projecting the transformed plural lights onto said substrate.

44. A projection exposure method according to claim 43, further comprising:

making at least two of said plural lights different from each other in polarization characteristic.

45. A projection exposure method according to claim 43, further comprising:

relatively moving said substrate and a projection optical system along an optical axis of said projection optical system when projecting two lights from said mask onto said substrate.

46. A method of making an exposure apparatus, comprising:

disposing a projection optical system between a mask and a substrate, said projection optical system projecting light from a pattern of said mask onto said substrate; and disposing a polarization member between said mask and said substrate, said polarization member transforming the light from said pattern into plural lights different from each other in polarization characteristic.

47. A method according to claim 46, further comprising:

disposing said polarization member on an optical Fourier transform plane opposed to a surface of said pattern of said mask or on a plane close to said Fourier transform plane.

48. A method according to claim 47, wherein a quarter-wave plate is disposed on an exit surface side of said polarization member.

49. A method according to claim 47, further comprising:

disposing a light shielding member in a shape of a circle or annulus with a center on an optical axis of said projection optical system on said Fourier transform plane or on a plane close thereto.

50. A method according to claim 49, further comprising:

disposing an illumination optical system between a light source and said mask, said illumination optical system illuminating said mask based on light from said light source; and disposing a polarization controller in said light source or in an optical path between said light source and said polarization member, said polarization controller arranging a polarization of the light from said pattern in a predetermined state.

51. A method according to claim 49, further comprising:

disposing an illumination optical system between a light source and said mask, said illumination optical system illuminating said mask based on light from said light source; and disposing a polarization controller in said light source or in an optical path of said illumination optical system, said polarization controller producing a first illumination light of which a polarization characteristic is arranged and a second illumination light which is different from said first illumination light in polarization characteristic and temporally incoherent with said first illumination light.

52. A method of producing a semiconductor integrated circuit by a projection exposure apparatus which illuminates a mask formed with a pattern to project light from said pattern onto a substrate, comprising:

transforming the light from said pattern into plural lights different from each other in polarization characteristic by a polarization member disposed between said mask and said substrate; and exposing said substrate with said plural lights different in polarization characteristic to produce a semiconductor device.

53. A method according to claim 52, wherein at least two of said plural lights are different from each other in polarization characteristic.

54. A method according to claim 52, further comprising:

arranging polarization of the light from said pattern in a predetermined state; and exposing said substrate with light which is obtained by further polarizing a polarized state of the light from said pattern passing through said polarization member and light which is obtained by maintaining the polarized state of the light from said pattern.

55. A method according to claim 52, further comprising:

illuminating said pattern with first illumination light of which a polarization characteristic is arranged and a second illumination light which is different from said first illumination light in polarization characteristic and temporally incoherent with said first illumination light.

56. A semiconductor integrated circuit which is produced using a method recited in claim 52.

\* \* \* \* \*